(12) United States Patent
Andermo

(10) Patent No.: US 7,259,695 B2
(45) Date of Patent: Aug. 21, 2007

(54) LOW-PROFILE MULTI-TURN ENCODER SYSTEMS AND METHODS

(75) Inventor: Nils Ingvar Andermo, Kirkland, WA (US)

(73) Assignee: AnderMotion Technologies LLC, Kirkland, WA (US)

( * ) Notice: Subject to any disclaimer, the term of this patent is extended or adjusted under 35 U.S.C. 154(b) by 155 days.

(21) Appl. No.: 11/228,635

(22) Filed: Sep. 16, 2005

(65) Prior Publication Data

US 2006/0092071 A1    May 4, 2006

Related U.S. Application Data

(60) Provisional application No. 60/610,820, filed on Sep. 17, 2004.

(51) Int. Cl.
*H03M 1/22* (2006.01)

(52) U.S. Cl. .......................................... 341/15; 324/662

(58) Field of Classification Search ................... 341/15, 341/13, 16; 324/662, 207.1, 207.12, 202; 250/231.18, 231.13
See application file for complete search history.

(56) References Cited

U.S. PATENT DOCUMENTS

| | | | |
|---|---|---|---|
| 3,517,282 A | 6/1970 | Miller | |
| 3,668,672 A | 6/1972 | Parnell | |
| 3,702,957 A | 11/1972 | Wolfendale | |
| 3,732,553 A | 5/1973 | Hardway, Jr. | |
| 3,784,897 A | 1/1974 | Norrie | |
| 4,092,579 A | 5/1978 | Weit | |
| 4,238,781 A | 12/1980 | Vercellotti et al. | |
| 4,449,179 A | 5/1984 | Meyer | |
| 4,463,299 A | 7/1984 | Langley et al. | |
| 4,788,546 A | 11/1988 | Sasaki | |
| 4,843,387 A | 6/1989 | Arai et al. | |
| 4,851,835 A | 7/1989 | Krumholz et al. | |
| 4,878,013 A | 10/1989 | Andermo | |
| 4,879,508 A | 11/1989 | Andermo | |
| 5,053,715 A | 10/1991 | Andermo | |
| 5,099,386 A | 3/1992 | Stokes et al. | |
| 5,537,109 A | 7/1996 | Dowd | |
| 5,640,007 A | 6/1997 | Talbott et al. | |
| 5,670,887 A | 9/1997 | Andermo et al. | |

(Continued)

*Primary Examiner*—Rexford Barnie
*Assistant Examiner*—Joseph Lauture
(74) *Attorney, Agent, or Firm*—Christensen O'Connor Johnson Kindness PLLC

(57) ABSTRACT

Various alternative embodiments of a multi-turn capacitive encoder device are disclosed. The device includes two members that are fixed relative to each other and that include respective capacitive electrodes that are capacitively coupled between the two members. The respective capacitive electrodes on one member act as transmitter electrodes and the respective capacitive electrodes on the other member act as receiver electrodes. One or more modulation members are relatively movable between the two fixed members to alter or modulate the capacitive coupling to correspond to the rotational or angular position of the modulation member (s). At least one of the modulation members is driven using a gear reduction system such that its angular or rotational position corresponds to a plurality of turns of the input shaft of the multi-turn encoder. A plurality of signals that depend on the capacitive coupling are used to determine the rotational or angular position of the modulation member(s) relative to the first two members. The present invention combines the elements outlined above to provide a multiturn encoder including few parts, simple assembly, a small axial dimension, and relatively high resolution and accuracy.

20 Claims, 55 Drawing Sheets

U.S. PATENT DOCUMENTS

| | | |
|---|---|---|
| 6,483,321 B2 | 11/2002 | Brasseur |
| 6,492,911 B1 | 12/2002 | Netzer |
| 6,542,088 B1 | 4/2003 | Bielski et al. |
| 6,577,985 B2 | 6/2003 | Scalf |
| 6,683,545 B2 * | 1/2004 | Strasser .................. 341/16 |
| 6,892,590 B1 | 5/2005 | Andermo |

* cited by examiner

TYPE A track

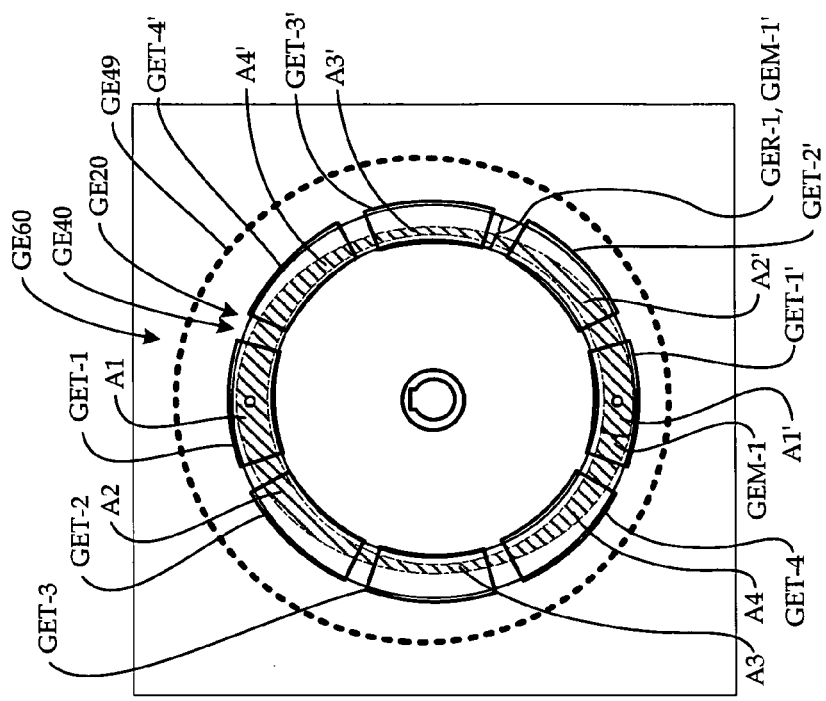
Fig. 25 TYPE E track
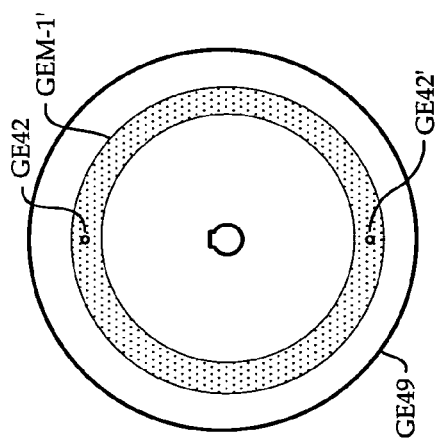
Fig. 22
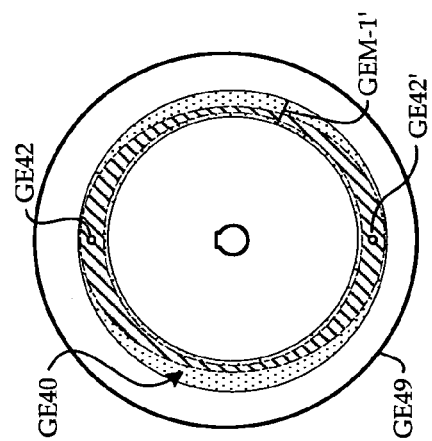
Fig. 23
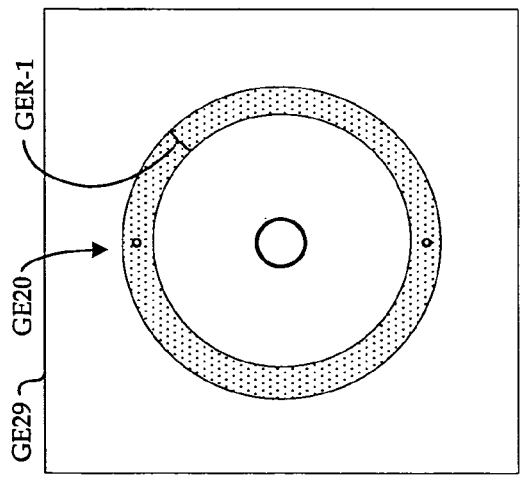
Fig. 24
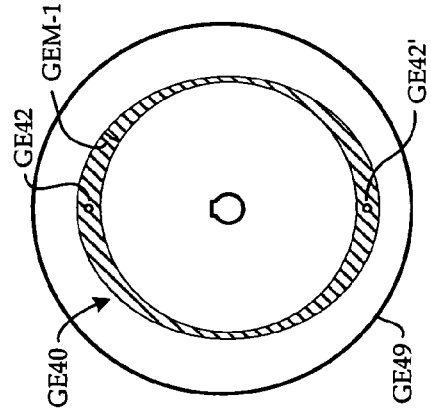
Fig. 21

LOW-PROFILE MULTI-TURN ENCODER SYSTEMS AND METHODS

CROSS-REFERENCE TO RELATED APPLICATION

This application claims the benefit of U.S. Provisional Application No. 60/610,820, filed Sep. 17, 2004, under the provisions of 35 U.S.C. §119.

FIELD OF THE INVENTION

This invention relates generally to displacement sensing encoders, and particularly to multi-turn displacement sensing encoders, and further to multi-turn encoders using capacitive sensing.

BACKGROUND OF THE INVENTION

Conventional multi-turn encoders typically comprise a plurality of shafts, gears, and associated code wheels, or the like, as exemplified by U.S. Pat. No. 5,640,007 to Talbott, U.S. Pat. No. 6,542,088 to Bielski, U.S. Pat. No. 6,577,985 to Scalf, and U.S. Pat. No. 6,683,545 to Strasser, each of which is incorporated herein by reference in its entirety. Such encoders tend to have a relatively high number of parts, relatively complicated assembly, a relatively large dimension along the axial direction, and a relatively high cost. An absolute encoder that uses a planetary gear shaft-speed reduction system to accept a high-speed shaft input and drive a low-speed shaft is described in U.S. Pat. No. 6,732,438 to Ito. The absolute encoder includes a high-speed shaft encoder and a low-speed shaft encoder. However, this absolute encoder also suffers the limitations and drawbacks outlined above.

A relatively simple and low cost multi-turn potentiometer using a planetary gear system is described in U.S. Pat. No. 6,732,438 to Enzinna. However, the angular measuring accuracy and reliability of such a potentiometer system are insufficient for many applications. Thus, a multi-turn encoder that can overcome the foregoing problems and disadvantages, individually or in combination, is desirable.

SUMMARY OF THE INVENTION

The present invention is directed to providing a multi-turn encoder that overcomes the foregoing problems and disadvantages. Various alternative embodiments of a multi-turn capacitive encoder device are disclosed. The device generally includes two members that are fixed relative to each other and that include respective capacitive electrodes that are capacitively coupled between the two members. The respective capacitive electrodes on one member act as transmitter electrodes and the respective capacitive electrodes on the other member act as receiver electrodes. One or more scale members, also referred to as scale modulation members, or simply as modulation members, are relatively movable between the two fixed members to alter or modulate the capacitive coupling to correspond to the rotational or angular position of the additional member(s) relative to the two fixed members. At least one of the scale/modulation members is driven using a gear reduction system such that its angular or rotational position corresponds to a number of turns of the input shaft of the multi-turn encoder. A plurality of signals that depend on the capacitive coupling are used to determine the rotational or angular position of the modulation member(s) relative to the first two members. The present invention combines the elements outlined above in a way that provides a number of desirable features, including relatively few parts, relatively simple assembly, a relatively small dimension along the axial direction, relatively reduced cost, increased reliability, and multi-turn displacement sensing with relatively high resolution and accuracy. Heretofore, a multi-turn encoder configuration that effectively incorporates capacitive sensing principles to provide such a combination of benefits has not been known.

Various applicable methods for altering or modulating the capacitive coupling in capacitance-type sensing devices are known. Also known are various applicable methods of signal processing that determine displacement based on the modulated capacitive coupling. Such methods are disclosed, for example, in U.S. Pat. No. 4,092,579, to Weit, U.S. Pat. No. 4,463,299 to Langley, U.S. Pat. No. 6,492,911 to Netzer, U.S. Pat. No. 5,099,386 to Stokes, U.S. Pat. No. 4,788,546 to Sasaki, U.S. Pat. No. 4,238,781 to Vercelloti, U.S. Pat. No. 4,851,835 to Krumholz, and U.S. Pat. Nos. 4,878,013, 5,053,715 and 5,670,887 to Andermo, each of which is incorporated herein by reference in its entirety. Additional methods that use "signal balanced" shield electrodes are described in U.S. patent application Ser. No. 10/701,772 filed Nov. 4, 2003 by inventor Nils Ingvar Andermo, which is incorporated herein by reference in its entirety.

One method for altering or modulating the capacitive coupling as a function of relative position in the device includes configuring the modulation member(s) with a conductive modulation pattern that provides a coupling-reducing shield. Another method includes configuring the modulation member(s) with at least one floating "bridge" electrode arrangement comprising a first conductive plate on a first side of the modulation member facing the transmitter electrodes and a second conductive plate on the other side of the modulation member facing the receiver electrodes, wherein at least one of the plates includes a modulation pattern. The first and second plates are connected by a conductor to comprise a bridge electrode arrangement that effectively reduces the gap between the transmitter and receiver electrodes to enhance the capacitive coupling. Another method includes forming the modulation member(s) of a dielectric material, and configuring the dielectric material with a modulation pattern of thickness variations. When the modulation pattern comprises a thickness that is generally less than that of the surrounding material, the pattern reduces the capacitive coupling. Conversely, a modulation pattern that is thicker than the surrounding material enhances the capacitive coupling.

Various applicable signal-processing methods are disclosed in the incorporated references. For example, in one method, the capacitive coupling, that is, the capacitance, is sensed by applying a plurality of temporally phase-shifted periodic signals to a plurality of capacitive transmitter electrodes on one of the relatively fixed members and measuring the relative phase shift of one or more "summed" signals present on one or more capacitive receiver electrodes on the other of the relatively fixed members. The relative phase shift of the one or more "summed" signals depends on the capacitive coupling effect determined by the position of the pattern included on the modulation member relative to the transmitter and receiver electrodes.

As previously outlined, in accordance with one aspect of the invention, one or more modulation members are relatively movable between the capacitively coupled transmitter and receiver electrodes of two fixed members to alter or modulate the capacitive coupling in a manner corresponding to the rotational or angular position of the modulation member(s) relative to the two fixed members, and at least one of the modulation members is positioned using a gear reduction system such that its angular or rotational position within one turn corresponds to a number of turns of the input shaft of the multi-turn encoder.

In accordance with a further aspect of the invention, the gear reduction system comprises a cycloid type gear reduction system.

In accordance with another aspect of the invention, the device includes a primary scale modulation member and a secondary scale modulation member, wherein the primary scale modulation member indicates the angular position within one turn and the secondary scale modulation member indicates a number of turns of the multi-turn encoder.

In accordance with a further aspect of the invention, the primary scale member drives the secondary scale member and the secondary scale member is positioned using the gear reduction system.

In accordance with a further aspect of the invention, the modulation pattern of the primary scale modulation member and the associated transmitter electrodes are configured to provide a plurality of associated signal cycles corresponding to a plurality of arc segments around one turn and a separate signal associated with the modulation pattern of an additional modulation member is used to determine which arc segment/signal cycle corresponds to the position of the primary scale modulation member.

In accordance with a separate aspect of the invention, the primary scale member drives the secondary scale member such that it "wobbles" to engage gear teeth of a cycloid type gear reduction system at one location on the periphery of the secondary scale member and provide a generally crescent-shaped clearance gap for gear teeth around the remainder of the periphery of the secondary scale member, wherein the clearance gap forms a modulation pattern that is used to provide an associated position signal.

In accordance with a separate aspect of the invention, the primary scale member drives the secondary scale member such that it "wobbles" to engage gear teeth of a cycloid type gear reduction system and a modulation pattern associated with the secondary scale member and the associated transmitter electrodes are configured to provide an even number of signal cycles around one turn, wherein the modulation pattern is nominally symmetrical about a line through the midpoint of the modulation pattern such that wobbling-related capacitive coupling variations on diametrically opposite sides of the modulation pattern tend cancel each other with respect to the overall capacitive coupling variation provided by the modulation pattern.

In accordance with a separate aspect of the invention, the device includes a tertiary scale modulation member in addition to a primary scale modulation member and a secondary scale modulation member.

In accordance with a further aspect of the invention, at least one of the secondary scale modulation member and the tertiary scale modulation member includes a non-modulating bridge electrode that increases a nominal capacitive coupling between transmitter electrodes and receiver electrodes.

In accordance with a further aspect of the invention the primary scale member drives both the secondary scale member and the tertiary scale member and the secondary scale member and the tertiary scale member are both positioned using a gear reduction system.

In accordance with a separate aspect of the invention, a primary scale member is coupled to the input shaft through a coupling that allows axial motion between the primary scale member and input shaft.

In accordance with another aspect of the invention, at least one of the scale members may include a modulation pattern provided by a shield electrode configuration.

In accordance with further aspect of the invention, the shield electrode configuration may comprise a signal-balanced shield electrode configuration.

In accordance with another aspect of the invention, at least one of the scale members may include a modulation pattern provided by a bridge electrode configuration.

In accordance with another aspect of the invention, at least one of the scale members may include a modulation pattern provided by a dielectric thickness variation.

In accordance with another aspect of the invention, at least one modulation pattern provides a capacitive coupling that nominally varies sinusoidally as a function of the rotational or angular position of the associated modulation member relative to the transmitter and receiver electrodes.

In accordance with a separate aspect of the invention, at least two respective signals arising from at least two receiver electrodes are provided for input to a differential signal processing circuit, the least two respective signals depending on the associated modulated capacitive coupling.

In accordance with a separate aspect of the invention, a thickness of the portion of the primary scale member that carries the associated modulation pattern defines a first span along the axial direction, a thickness of the portion of an additional scale member that carries an associated modulation pattern defines a second span along the axial direction, and one the first and second spans either coincides with, or is entirely included within, the other of the first and second spans along the axial direction.

In accordance with further aspect of the invention, the additional scale member is roughly coplanar with, and generally surrounds the periphery of, the portion of the primary scale member that carries the associated modulation pattern.

In accordance with a separate aspect of the invention the multi-turn encoder provides absolute multi-turn position encoder such that a specific turn and a specific angular position within that turn can be determined based on the positions of the various modulation patterns, without the need to provide continuous power or continuous memory for the device.

Hence, the invention provides a multi-turn capacitive encoder that overcomes the various disadvantages of prior art multi-turn encoders, and provides a number of desirable features, including relatively few parts, relatively simple assembly, a relatively small dimension along the axial direction, relatively reduced cost, increased reliability, and absolute multi-turn displacement sensing with relatively high resolution and accuracy.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIGS. 21 and 22 illustrate, respectively, a modulation pattern and a bridge electrode configuration included on opposite sides of a modulation member of a fifth generic capacitive position sensing configuration.

FIG. 23 illustrates the modulation pattern and the bridge electrode configuration of FIGS. 21 and 22 superimposed to show their nominal alignment.

FIG. 24 illustrates a receiver electrode pattern of the fifth generic capacitive position-sensing configuration.

FIG. 25 illustrates the modulation pattern of FIG. 21, the receiver electrode configuration of FIG. 24 and a transmitter electrode configuration of the fifth generic capacitive position sensing configuration, all superimposed to show their nominal assembled alignment.

DETAILED DESCRIPTION OF THE PREFERRED EMBODIMENT

The invention provides a configuration for multi-turn capacitive encoders. The configuration is particularly compact along the axial direction, and is versatile enough to be fabricated in a very economical "bearing-free" configuration for low wear applications, or with rolling bearings for more demanding applications. In various drawings and descriptions that follow, various operating circuits, components, electrical connectors and their associated through holes, mechanical assembly components and alignment features, and the like, are omitted in order to clearly illustrate and emphasize the more important aspects of the invention. One of ordinary skill in the art, having benefit of this disclosure, will recognize where such features are needed or useful. Such features may be fabricated according to conventional printed circuit board techniques, and conventional mechanical assembly methods. In addition, it will be appreciated that various elements or features that provide electrical shielding, reduce friction, increase wear life, control axial and/or play of various parts, and the like, may be added to the various configurations described herein, to meet the demands of particular applications. For example, in various embodiments, a thin layer of insulating material, or a thin insulating coating, or the like, may be applied on or between various surfaces to protect them from wear, reduce friction, and/or insulating various electrodes. Thus, the following embodiments are exemplary only, and not limiting.

In the following drawings and description, evidently corresponding elements, and/or elements having similar reference numbers, may generally be understood, designed and operated in an analogous manner, unless otherwise indicated by form, description or context. For example, the reference numbers 520, 620 and GA20, having the same suffix, "20" may all represent receiver electrode configurations, etc. Accordingly, the descriptions of various elements are omitted when their design, arrangement and operation are made evident elsewhere in the disclosure.

Figure 1:
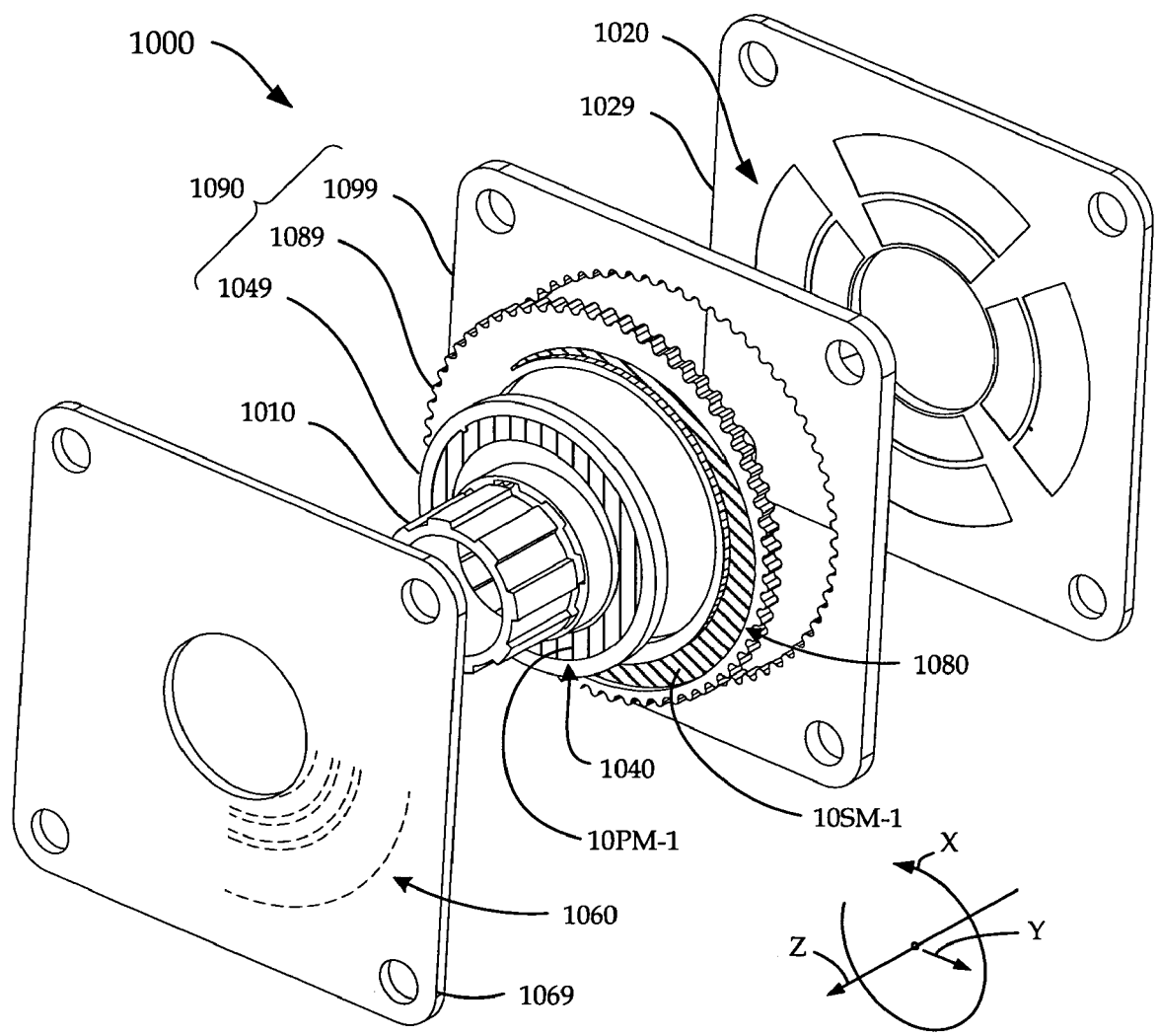
FIG. 1 is an exploded isometric view of a first exemplary embodiment of a multi-turn capacitive encoder according to this invention.

FIG. 1 is an exploded isometric view of a first exemplary embodiment of a multi-turn capacitive encoder 1000 according to this invention. As shown in FIG. 1, the multi-turn capacitive encoder 1000 includes a transmitter electrode configuration 1020 carried on the interior side of a transmitter electrode member 1029, a secondary scale modulation pattern 1080 having a single portion 10SM-1 carried on a secondary scale member 1089, a primary scale modulation pattern 1040 having a single portion 10PM-1 carried on a primary scale member 1049, and a receiver electrode configuration 1060, a portion of which is represented by dashed outlines in FIG. 1, carried on the interior side of a receiver electrode member 1069. FIG. 1 also shows an outer cycloid gear member 1099, also referred to as the outer gear member 1099, and a shaft coupling 1010. The primary scale member 1049, the secondary scale member 1089 and the outer cycloid gear member 1099, together, form a cycloid gear assembly 1090. The primary scale member 1049 of the cycloid gear assembly 1090 rotates at the same rate as the input shaft that drives the encoder, while the secondary scale member 1089 rotates at a much slower rate determined by the gear characteristics of the cycloid gear assembly 1090, as described further below.

FIG. 1 also defines a circular measuring axis 80. Positions or angles within a particular turn are measured along the measuring axis 80 based on the rotational position of the primary scale member 1049, and a number of turns of the multiturn capacitive encoder 1000 are indicated based on the rotational position of the secondary scale along the measuring axis 80. In various descriptions herein, the local tangent to the measuring axis 80 is defined as the x-axis, the local radial direction is defined as the y-axis. In the direction of the central axis of the multiturn capacitive encoder defines the z-axis.

The multi-turn capacitive encoder 1000 is only described here in sufficient detail to provide a basis for understanding the operation of the generic capacitive position sensing configurations shown in FIGS. 2-25. The multi-turn capacitive encoder 1000 is described below in greater detail, beginning at FIG. 26. The operation of the multiturn capacitive encoder 1000 is based on the rotating scale members modulating the capacitive coupling between the fixed transmitter electrodes and the receiver electrodes. For purposes of discussion, it is convenient to define two circular measuring tracks that correspond to various signal paths through the multiturn capacitive encoder 1000. For example, the inner ring of four transmitter electrodes of the transmitter electrode configuration 1020 is nominally aligned with the primary scale modulation pattern 1040 and an inner pair of circular differential receiver electrodes (shown in FIG. 31) to form and/or coincide with an inner modulation track, or primary scale track. Similarly, the outer ring of four transmitter electrodes of the transmitter electrode configuration 1020 is nominally aligned with the secondary scale modulation pattern 1040 and an outer circular receiver electrode of the receiver electrode configuration 1060 (shown in FIG. 31) to form and/or coincide with an outer modulation track, or secondary scale track.

Along either track, in the absence of the modulation pattern, the equal areas of the four transmitter electrodes of that track form four equal capacitors with the receiver electrode(s) of that track, to form four respective signal paths. However, when the modulation pattern is present and is rotated to intervene between the four transmitter electrodes and the receiver electrode(s), the "unbalanced" shape of the modulation pattern affects the capacitive coupling along each of the four signal paths differently. As previously outlined, each modulation pattern may be implemented in various ways. If the modulation pattern comprises a conductive shield electrode, or a reduced dielectric thickness, then it will decrease each respective capacitance in proportion to the area of the modulation pattern that intervenes or overlaps between each respective transmitter electrode and the receiver electrode. If the modulation pattern comprises a bridge electrode arrangement, or an increased dielectric thickness, then it will increase each respective capacitance in proportion to the intervening area. In either case, when four appropriate input signals are applied to the four transmitter electrodes, the net signal on the receiver electrode(s) will reflect the respective proportions of the four capacitances and the associated intervening areas. Thus, each receiver electrode signal corresponds to the position of the associated modulation pattern and scale member.

FIGS. 2-25 illustrate five generic capacitive position-sensing configurations usable in various combinations to generate operable position signals along a scale track in various exemplary multiturn capacitive encoders according to this invention.

FIGS. 2-7 illustrate a generic capacitive position-sensing configuration that is hereafter designated a TYPE A scale track.

Figure 2:
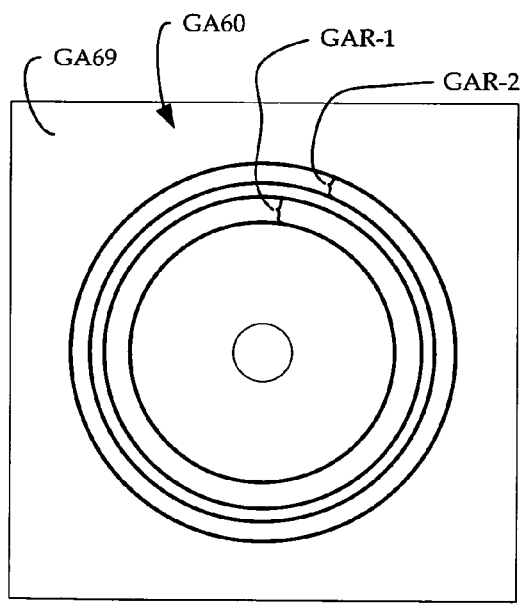

FIG. 2 illustrates a receiver electrode pattern GA60 including a pair of circular sub-electrodes GAR-1 and GAR-2 (Generic TYPE A Receiver-1, etc.), which provide differential output signals as described below. In various embodiments, the inner and outer diameters of the inner sub-electrode GAR-1 and the outer sub-electrode GAR-2 are dimensioned such that the sub-electrodes have equal areas. However, more generally, an operable device will still result if the areas are not equal. The receiver electrode pattern GA60 is shown on a generic receiver electrode member GA69, which has a central hole to admit an input shaft and/or shaft coupling.

Figure 3:
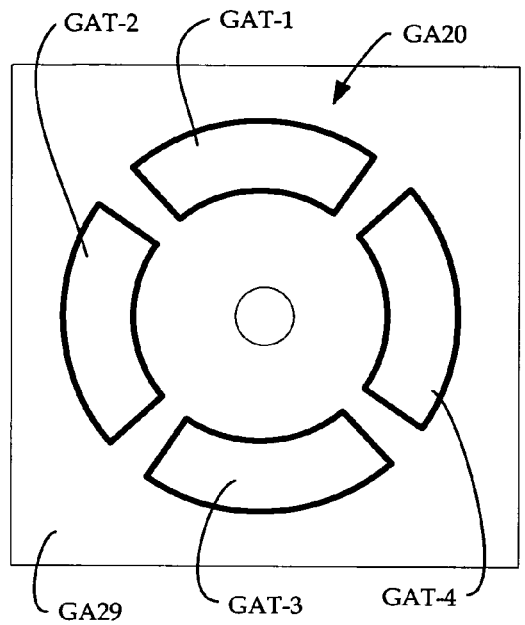
FIGS. 2 and 3 illustrate, respectively, a receiver electrode pattern and a transmitter electrode pattern of a first generic capacitive position-sensing configuration.

FIG. 3 illustrates a transmitter electrode pattern GA20 including four transmitter electrodes GAT-1 through GAT-4 (Generic TYPE A Transmitter-1, etc.), which provide four phase-shifted input signals as described below, in various embodiments. In various embodiments, the four electrodes are placed at equal intervals around their circular track and have equal dimensions. In various embodiments, the proportion between the angle subtended by an electrode and the angle subtended by an adjacent angular gap between electrodes may vary from the example shown in FIG. 3. In various embodiments this proportion is selected to suppress spatial harmonics in the position measurement signal provided by the TYPE A track, according to known spatial filtering techniques. In various other embodiments, the angular gaps are made as small as is practical. The transmitter electrode pattern GA20 is shown on a generic transmitter electrode member GA29, which has a central hole to admit an input shaft and/or shaft coupling.

Figure 4:
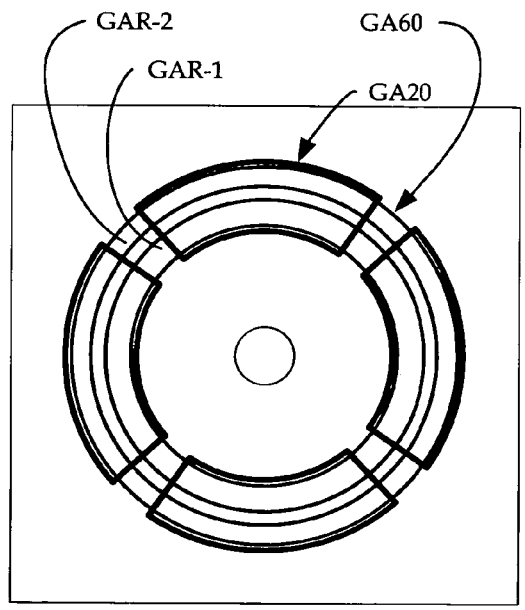
FIG. 4 illustrates the receiver electrode pattern and the transmitter electrode pattern of FIGS. 2 and 3 superimposed to show their nominal assembled alignment.

FIG. 4 illustrates the receiver electrode pattern GA60 and the transmitter electrode pattern GA20 of FIGS. 2 and 3 superimposed to show their nominal assembled alignment. In general, the inner and outer diameters bounding the transmitter electrodes are chosen to complement the diameters bounding the receiver electrodes. For example, in the embodiment shown in FIG. 4, the inner and outer diameters of the receiver electrode pattern GA60 are bounded by the inner and outer diameters of the transmitter electrode pattern GA20, with some radial clearance on each side. The radial clearance is chosen depending on expected assembly tolerances, such that the nominally equal capacitive coupling areas between each transmitter electrode GAT-1 through GAT-4 and the receiver electrodes GAR-1 and GAR-2, are unaffected by expected assembly tolerances variations.

Figure 5:
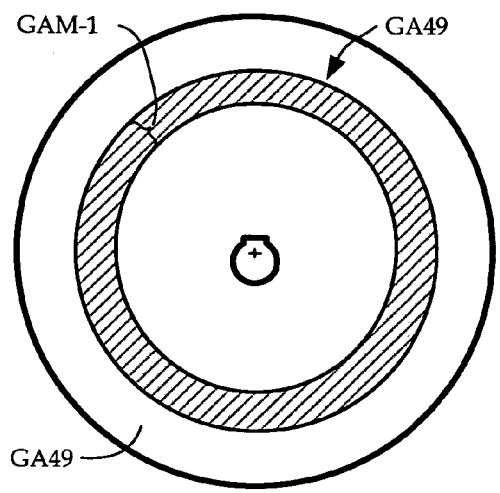
FIG. 5 illustrates a modulation pattern of the first generic capacitive position-sensing configuration.

FIG. 5 illustrates a modulation pattern GA40 that comprises a single modulator region GAM-1 in this embodiment. The modulation pattern GA40 is shown on a generic scale member GA49, which has a central hole to admit an input shaft and/or shaft coupling. The central hole is nominally concentric with the center of rotation of the input shaft, as is the center of rotation of the scale member GA49— hereafter collectively referred to as the center of rotation. The outer diameter of the scale member GA49 is not concentric with the center of rotation, but is offset by a small amount, represented by the offset of the small crosshair in FIG. 5, in order to drive a secondary scale member if required, as described in greater detail below. Although the modulation pattern GA40 appears approximately as an eccentric circle, it is actually configured to provide a modulation that is a sinusoidal function of angular position, as best shown and described with reference to FIG. 6.

Figure 6:
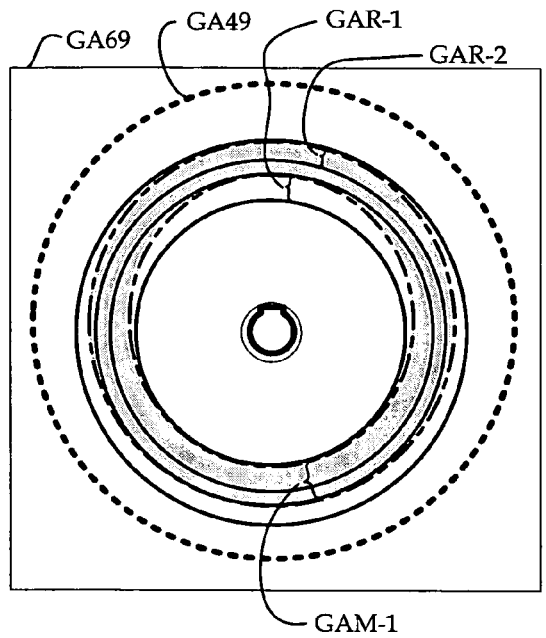
FIG. 6 illustrates the receiver electrode pattern and the modulation pattern of FIGS. 2 and 5 superimposed to show their nominal assembled alignment.

FIG. 6 illustrates the receiver electrode pattern GA60 and the modulation pattern GA40 of FIGS. 2 and 5 superimposed to show their nominal assembled alignment. The receiver electrode pattern GA60 is nominally concentric with the center of rotation. In general, the inner and outer boundaries of a modulation pattern are chosen to complement the diameters bounding the receiver electrodes. In general, the goal is to provide a high level of modulation yet provide a predictable position signal that is relatively insensitive to radial assembly tolerance variations. For example, for the modulation pattern GA40 shown in FIG. 6, the portion of the outer boundary that is located farthest from the center of rotation nominally coincides with the outer diameter of the receiver electrode GAR-2 and the portion of the outer boundary that is located closest to the center of rotation nominally coincides with the inner diameter of the receiver electrode GAR-2. Similarly, the portion of the inner boundary that is located farthest from the center of rotation nominally coincides with the outer diameter of the receiver electrode GAR-1 and the portion of the inner boundary that is located closest to the center of rotation nominally coincides with the inner diameter of the receiver electrode GAR-1. Such an arrangement provides a level of self-compensation that tends to keep the resulting differential receiver signals balanced, despite reasonable levels of radial alignment variation. However, more generally, any arrangement of boundaries that contributes to achieving the goals outlined above is desirable. The incorporated '772 Application to Andermo provides additional description of such "overlap variation" considerations and boundary arrangement variations.

Ideally, for each of the boundaries of the modulation pattern GA40, the radial distance from the boundary to the center of rotation is a sinusoidal function of angle, such that the intervening area of the modulation pattern GA40 between each respective transmitter electrode and each respective receiver electrode varies approximately sinusoidally, and in phase with each other, with an angular spatial period of $2\pi$ radians. In addition, when the modulation pattern comprises a signal balanced shield electrode according to the teachings of the incorporated '772 Application to Andermo, the area of the modulation pattern GA40 that overlaps the various transmitter electrodes must be the same for each transmitter electrode, in order that the voltage amplitude on the signal balanced shield electrode includes no AC component. In such a case, it is necessary to slightly adjust the shield electrode boundaries based on their nominal radial location, such that at each angular location around the modulation pattern GA40, small and equal increments of angle include equal increments of area. Various ways of generating such modulation pattern boundaries are described the incorporated '772 Application. In particular, the boundaries of the modulation pattern GA40 may be designed according to the same considerations as the shield electrode configuration 440 shown and described with reference to FIG. 12 in the incorporated '772 Application.

Figure 7:
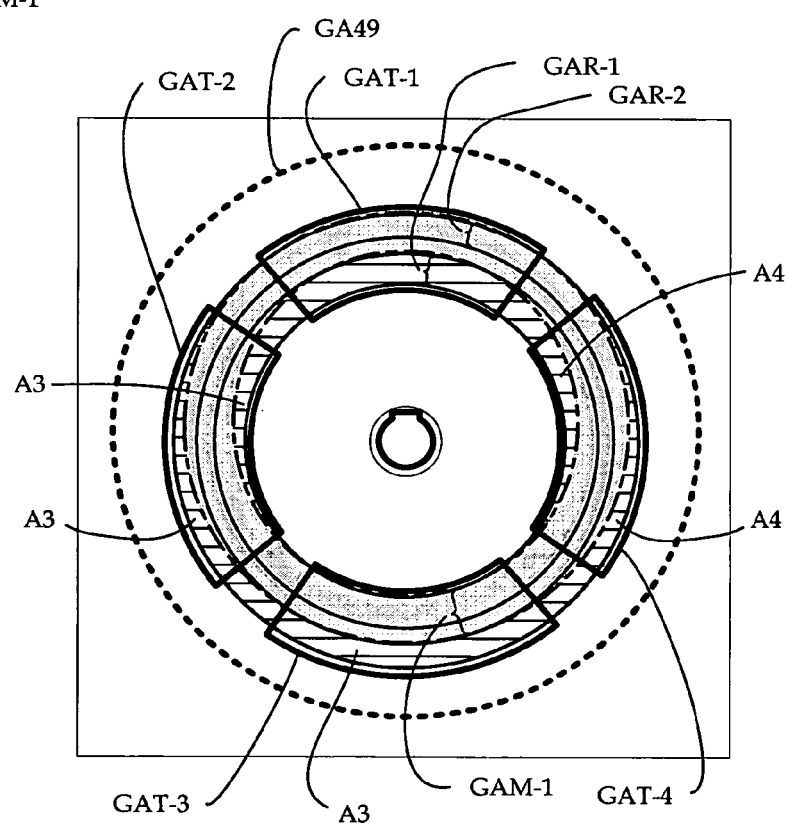
FIG. 7 illustrates the receiver electrode pattern, the modulation pattern and the transmitter electrode pattern of FIGS. 2, 3, and 5 all superimposed to show their nominal assembled alignment.

FIG. 7 illustrates the receiver electrode pattern GA60, the modulation pattern GA40 and the transmitter electrode pattern GA20 of FIGS. 2, 3, and 5, all superimposed to show their nominal assembled alignment. As shown in FIG. 7, the modulation pattern GA40 will always fully overlap each of the transmitter electrodes GAT-1 through GAT-4, regardless of its angular position, which maintains the required signal balance in the case that modulation pattern GA40 comprises a signal balanced shield electrode. For the angular position shown in FIG. 7 the modulation pattern GA40 intervenes in the overlapping coupling area between each respective transmitter electrode and each respective receiver electrode such that the capacitive coupling in the crosshatched areas A1-A4 is nominally undisturbed. Assume, for the moment, that the modulation pattern GA40 intervenes to reduce capacitive coupling, and that AC signals having equal amplitudes and relative phases of 0, 90, 180 and 270 degrees are applied to the transmitter electrodes GAT-1 through GAT-4, respectively. Accordingly, for the receiver electrode GAR-1, the 0°-phase signal will be strongly coupled through the area A1, the 90°-phase signal and the 270°-phase signal will be moderately and equally coupled through the respective areas A2 and A4, such that they nominally cancel each other and due to their opposite phases, and the 180°-phase signal will be fully reduced since the modulation pattern GA40 fully intervenes in the overlapping coupling area between the transmitter electrode GAT-3 and the receiver electrode GAR-1. Thus, for the position shown in FIG. 7, the signal on the receiver electrode GAR-1 will have a nominal phase of 0°. By similar analysis, the signal on the receiver electrode GAR-2 will have a nominal phase of 180°. It will be apparent to one skilled in the art, that as the modulation pattern GA40 is rotated along the scale track, the various areas A1-A4 will vary sinusoidally over each of the receiver electrodes GAR-1 and GAR-2, which will cause the phase of the net signal on the receiver electrodes GAR-1 and GAR-2 to vary linearly as a function of the rotation angle. Thus, the phase of the net signal on each receiver electrode is indicative of the angular position of the modulation pattern GA40. The incorporated '772 Application to Andermo provides additional teachings related to various operating principles, circuits and signal processing techniques that are usable in conjunction with this invention and that are consistent with the principles outlined above.

FIGS. 8-12 illustrate a generic capacitive position-sensing configuration that is hereafter designated a TYPE B scale track.

Figure 8:
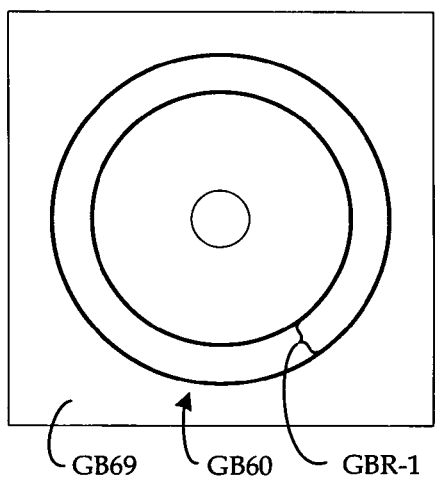

FIG. 8 illustrates a receiver electrode pattern GB60 including a single circular electrode GBR-1 (Generic TYPE B Receiver-1, etc.). The receiver electrode pattern GB60 is shown on a generic receiver electrode member GB69.

Figure 9:
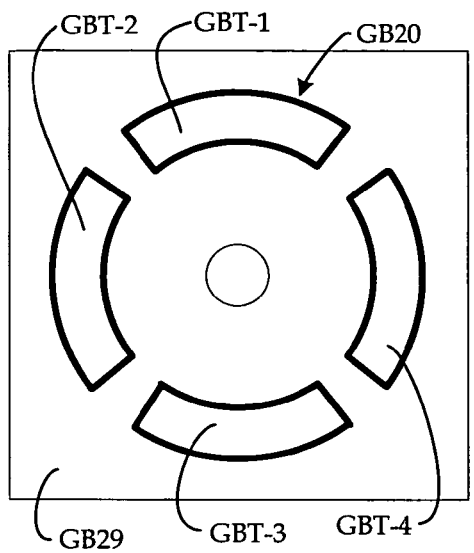
FIGS. 8 and 9 illustrate, respectively, a receiver electrode pattern and a transmitter electrode pattern of a second generic capacitive position-sensing configuration.

FIG. 9 illustrates a transmitter electrode pattern GB20 including four transmitter electrodes GBT-1 through GBT-4 (Generic TYPE B Transmitter-1, etc.), which is designed and operated as previously described for the transmitter electrode pattern GA20. The transmitter electrode pattern GB20 is shown on a generic transmitter electrode member GB29.

Figure 10:
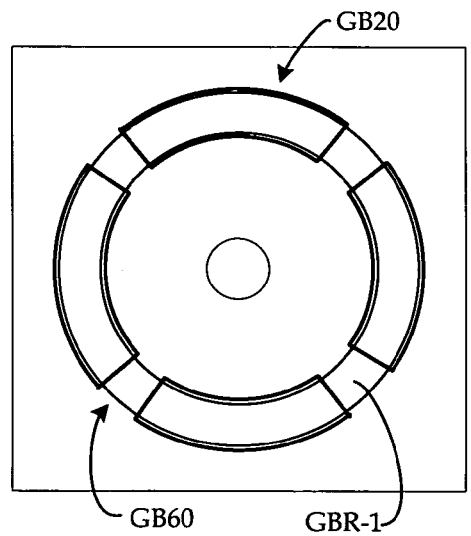
FIG. 10 illustrates the receiver electrode pattern and the transmitter electrode pattern of FIGS. 8 and 9 superimposed all superimposed to show their nominal assembled alignment.

FIG. 10 illustrates the receiver electrode pattern GB60 and the transmitter electrode pattern GB20 of FIGS. 2 and 3 superimposed to show their nominal assembled alignment. In general, the inner and outer diameters bounding the transmitter electrodes are chosen to complement the diameters bounding the receiver electrode according to the considerations previously described for the TYPE A track configuration.

Figure 11:
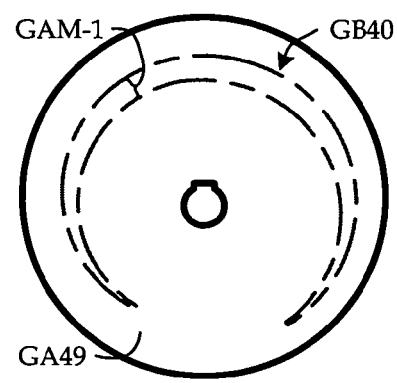
FIG. 11 illustrates a modulation pattern of the second generic capacitive position-sensing configuration.

FIG. 11 illustrates a modulation pattern GB40 that comprises a single modulator region GBM-1 in this embodiment. The modulation pattern GB40 is shown on a generic scale member GB49. The central hole is nominally concentric with the center of rotation and the outer diameter of the scale member GB49 is offset from the center of rotation, according to the considerations previously described for the TYPE A track configuration. The crescent shaped modulation pattern GB40 is configured to provide a modulation that is a sinusoidal function of angular position, as best shown and described with reference to FIG. 12.

Figure 12:
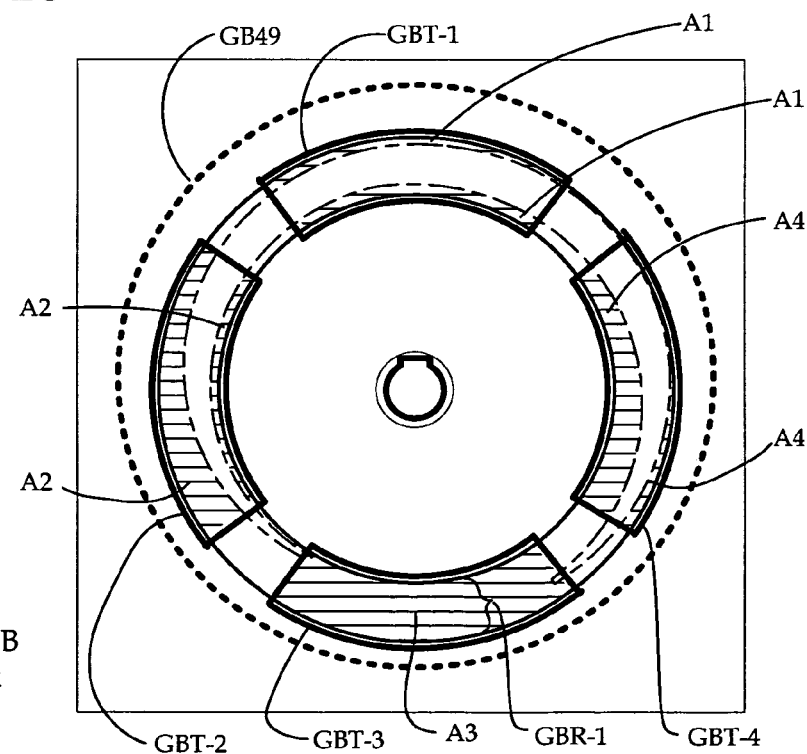
FIG. 12 illustrates the receiver electrode pattern, the modulation pattern and the transmitter electrode pattern of FIGS. 8, 9, and 11 all superimposed to show their nominal assembled alignment.

FIG. 12 illustrates the receiver electrode pattern GB60, the modulation pattern GB40 and the transmitter electrode pattern GB20 of FIGS. 8, 9, and 11, all superimposed to show their nominal assembled alignment. In contrast to the TYPE A track configuration, wherein the modulation pattern intervened in a variable manner with respect to the receiver electrodes, in this TYPE B track configuration the modulation pattern GB-40 intervenes in a variable manner with respect to the transmitter electrodes GBT-1 through GBT-4. As shown in FIG. 12, the modulation pattern GB40 will always fully overlap the transmitter electrode GBR-1 regardless of its angular position.

In this embodiment, the modulation pattern GB40 cannot comprise a signal balanced shield electrode because it is not equally coupled to each of the transmitter electrodes. Thus, all that is necessary is that the intervening area of the modulation pattern GB40 between each respective transmitter electrode GBT-1 through GBT-4 and the receiver electrode GBR-1 varies approximately sinusoidally as a function of angle, with an angular spatial period of $2\pi$ radians. As indicated in FIG. 12, for the intervening area corresponding to a transmitter electrode to fall to zero, the angular span between the tips of the modulation pattern GB-40 should be the same as the angular span of a transmitter electrode. Thus, designating the angular span of a transmitter electrode as spanT, the spatial period of the sinusoidal area function that defines the modulation pattern GB40 will be approximately ($2\pi$-spanT) radians. Further designating the radial dimension from the outer boundary at an angular position a to the center of rotation as $d_O(\alpha)$ and the radial dimension from the inner boundary at an angular position $\alpha$ to the center of rotation as $d_I(\alpha)$, all that is required is that, ideally, the boundaries remaining completely within the receiver electrode GBR-1 and satisfy the condition that $$\frac{[d_o^2(\alpha) - d_I^2(\alpha)]}{2} = K \sin\frac{2\pi\alpha}{(2\pi - spanT)} \qquad (EQ.\ 1)$$

as $\alpha$ varies over an angular range from zero to ($2\pi$-spanT) radians. K is a desired maximum radial dimension across the receiver electrode GBR-1. There are a number of boundary patterns that are able to meet this condition, and a suitable pattern may be determined analytically or by trial and error, or by any other convenient means. However, in order to provide the maximum capacitance modulation, in the vicinity of $\alpha=\frac{1}{2}*(2\pi$-spanT), $d_O(\alpha)$ should be just slightly less than the outer radius of the receiver electrode GBR-1 and $d_I(\alpha)$ should be just slightly greater than the inner radius (which effectively defines the constant K). The modulation pattern GB40 is just one example of a pattern that meets all of the design guidelines outlined above.

For the angular position shown in FIG. 7 the modulation pattern GB40 intervenes in the overlapping coupling area between each respective transmitter electrode GBT-1 through GBT-4 and the receiver electrode GBR-1 such that the capacitive coupling in the crosshatched areas A1-A4 is nominally undisturbed. In the following discussion, we assume that the modulation pattern GB40 comprises a reduced thickness region of an otherwise uniformly thick dielectric member. In such a case, it intervenes to reduce capacitive coupling. When the transmitter electrodes GBT-1 through GBT-4 carry phase shifted input signals as previously described for the electrodes GAT-1 through GAT-4, the 0°-phase signal will be weakly coupled through the area A1, the 90°-phase signal and the 270°-phase signal will be moderately and equally coupled through the respective areas A2 and A4, such that they nominally cancel each other and due to their opposite phases, and the 180°-phase signal will be fully coupled since the modulation pattern GB40 is absent in the overlapping coupling area between the transmitter electrode GBT-3 and the receiver electrode GBR-1. Thus, for the position shown in FIG. 7, the signal on the receiver electrode GBR-1 will have a nominal phase of 180°. According to the previous description, as the modulation pattern GB40 is rotated along the scale track, the various areas A1-A4 will vary sinusoidally over each of the transmitter electrodes GBT-1 through GBT-4, which will cause the phase of the net signal on the receiver electrode GBR-1 to vary linearly as a function of the rotation angle. Thus, the phase of the net signal on the receiver electrode GBR-1 is indicative of the angular position of the modulation pattern GB40.

Figure 13:
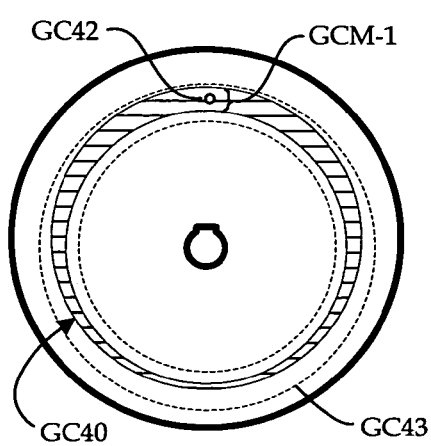
FIG. 13 illustrates an emphasized modulation pattern of a third generic capacitive position sensing configuration, along with the dashed outline of a receiver electrode pattern of the third generic capacitive position sensing configuration, superimposed in their nominal assembled alignment.
Figure 14:
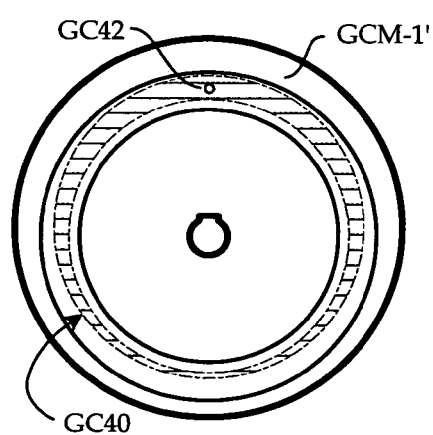
FIG. 14 is similar to FIG. 13, except the modulation pattern is shown in dashed outline and the receiver electrode pattern is emphasized.
Figure 15:
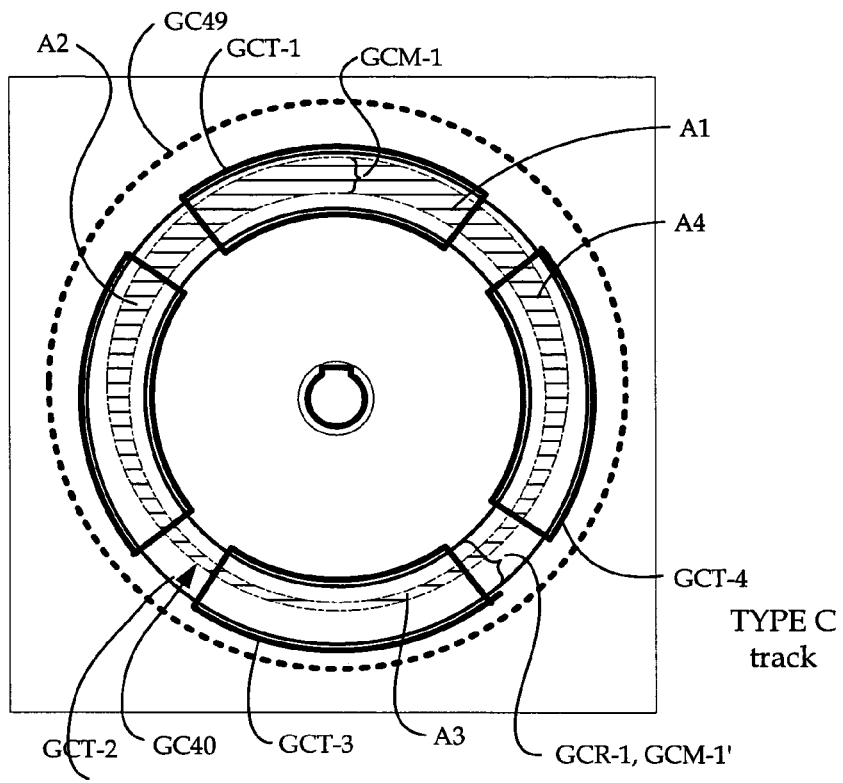
FIG. 15 illustrates the receiver electrode pattern and modulation pattern of FIGS. 13 and 14, along with a transmitter electrode pattern of the third generic capacitive position sensing configuration, all superimposed to show their nominal assembled alignment.

FIGS. 13-15 illustrate a generic capacitive position-sensing configuration that is hereafter designated a TYPE C scale track. The TYPE C track includes a receiver electrode pattern GC60 and a transmitter electrode pattern GC20 that are similar or identical to their counterparts in the TYPE B track.

FIG. 13 illustrates the transmitter-facing side of a generic scale member GC49 that carries a bridge electrode arrangement comprising a modulation pattern GC40 that has a single modulator region GCM-1 formed by a conductive plate. The modulator region GCM-1 is connected by a plated hole or wire GC42 to a circular bridge electrode GCM-1', shown in dashed outline in FIG. 13, on the receiver-facing side of the scale member GC49. The generic scale member GC49 that is similar to the generic scale member GB49. FIG. 14 illustrates the receiver-facing side of the generic scale member GB49, and thus shows the modulation pattern GC40 in dashed outline.

The modulation pattern GC40 is designed, and operates, in a manner very similar to the modulation pattern GB40. In particular, the modulation pattern GC40 may be thought of as an outer portion designed according to the principles described for the modulation pattern GB40, merged with an inner portion formed by a thin circular ring having a width equal to the width of the thin section of the modulation pattern GC40 that is nearest to the bottom of FIG. 13. Thus, with the exception that it does not provide "zero modulation" at any location along the scale track, it otherwise modulates similarly to the modulation pattern GB40.

FIG. 15 illustrates the receiver electrode pattern GC60, the modulation pattern GC40 and the transmitter electrode pattern GC20, all superimposed to show their nominal assembled alignment. It should be appreciated that the boundaries of the bridge electrode GCM-1' approximately coincide with those of the receiver electrode pattern GC60 in order to maximize their capacitive coupling. In order to provide a more stable signal, the boundaries of the bridge electrode GCM-1' may be located entirely within the receiver electrode pattern GC60, according to previously outlined principles. It should be appreciated that the bridge electrode GCM-1' only enhances the overall capacitive coupling along each respective signal path between each respective electrode of the transmitter electrode pattern GC20 and the receiver electrode GCR-1 and it does not contribute any capacitance modulation.

The modulation pattern GC40 intervenes in the overlapping coupling area between each respective transmitter electrode GCT-1 through GCT-4 and the receiver electrode GCR-1 such that, because a coupling-enhancing bridge electrode arrangement is used, the capacitive coupling in the "intervening" areas A1-A4 is enhanced. Thus, for the angular position shown in FIG. 15, when the transmitter electrodes GCT-1 through GCT-4 carry phase shifted input signals as previously described for the electrodes GBT-1 through GBT-4, the 0°-phase signal will be strongly enhanced through the area A1, the 90°-phase signal and the 270°-phase signal will be moderately and equally enhanced through the respective areas A2 and A4, such that they nominally cancel each other due to their opposite phases, and the 180°-phase signal will be weakly enhanced. Thus, for the position shown in FIG. 15, the signal on the receiver electrode GCR-1 will have a nominal phase of 0°. Although the bridge electrode arrangement enhances various signals rather than reducing them, rotation of the modulation pattern GC40 will still cause the phase of the net signal on the receiver electrode GCR-1 to vary linearly as a function of the rotation angle. Thus, the phase of the net signal on the receiver electrode GCR-1 is indicative of the angular position of the modulation pattern GC40.

FIGS. 16-20 illustrate a generic capacitive position-sensing configuration that is hereafter designated a TYPE D scale track. The TYPE D track uses a receiver electrode pattern GD60 and a transmitter electrode pattern GD20 that are analogous to their counterparts in the TYPE A track.

Figure 16:
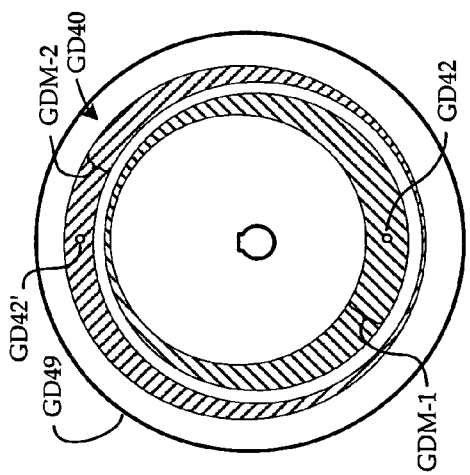
FIGS. 16 and 17 illustrate, respectively, a modulation pattern and a bridge electrode configuration included on opposite sides of a modulation member of a fourth generic capacitive position sensing configuration.
Figure 17:
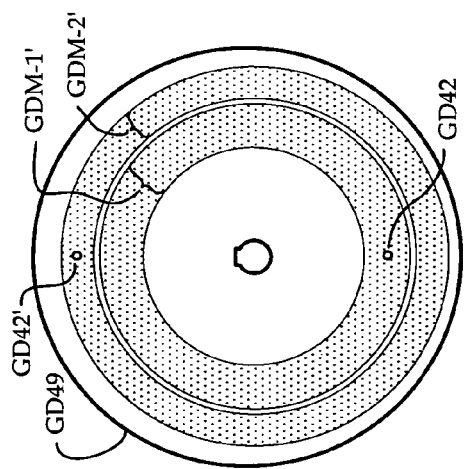

FIG. 16 illustrates the transmitter-facing side of a generic scale member GD49 that carries a bridge electrode arrangement comprising a modulation pattern GD40 that has two modulator regions GDM-1 and GDM-2 formed by respective conductive plates. The modulator region GDM-1 is connected by a plated hole or wire GD42 to a circular bridge electrode GDM-1', shown in FIG. 17. The modulator region GDM-2 is connected by a plated hole or wire GD42' to a circular bridge electrode GDM-2', shown in FIG. 17. The two modulator regions GDM-1 and GDM-2 have very similar shapes, but are arranged with a 180-degree spatial phase difference around the scale track. Each of the individual modulator regions of GDM-1 and GDM-2 and their associated bridge electrodes GDM-1' and GDM-2' are designed and operate in the same manner as the modulator region GCM-1 and its associated bridge electrode GCM-1' of the modulation pattern GC40. Because the two modulator regions GDM-1 and GDM-2 participate in two differential signal paths, it is advantageous for them to have equal areas, as shown in FIG. 16. Similarly, it is advantageous for the bridge electrodes GDM-1' and GDM-2' to have equal areas, as shown in FIG. 16.

Figure 18:
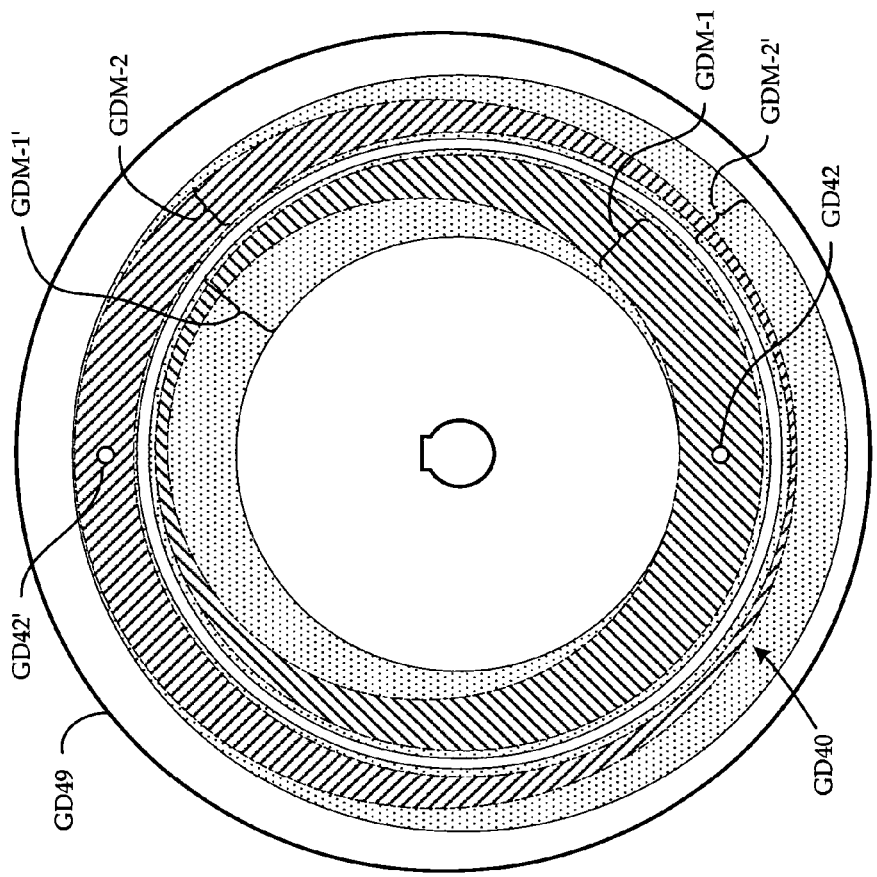
FIG. 18 illustrates the modulation pattern and the bridge electrode configuration of FIGS. 16 and 17 superimposed to show their nominal alignment.

FIG. 18 illustrates the modulator regions of GDM-1 and GDM-2 and the bridge electrodes GDM-1' and GDM-2' superimposed to show their nominal alignment on the scale member GD49.

Figure 19:
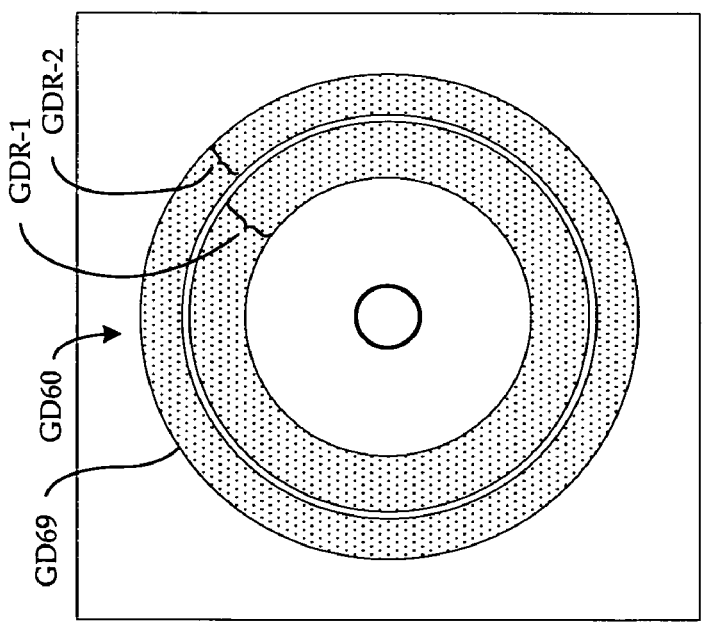
FIG. 19 illustrates a receiver electrode pattern of the fourth generic capacitive position-sensing configuration.

FIG. 19 illustrates a generic receiver electrode member GD69 carrying a receiver electrode pattern GD60 including a pair of circular sub-electrodes GDR-1 and GDR-2, which provide differential output signals. In various embodiments, the inner and outer diameters of the inner sub-electrode GDR-1 and the outer sub-electrode GDR-2 are dimensioned such that the sub-electrodes have equal areas. Furthermore, the boundaries of the receiver sub-electrodes GDR-1 and GDR-2 approximately coincide with those of the bridge electrodes GDM-1' and GDM-2' in order to maximize their capacitive coupling. In order to provide a more stable signal, the boundaries of the bridge electrodes GDM-1' and GDM-2' may be located entirely within the boundaries of the corresponding receiver sub-electrodes, according to previously outlined principles.

Figure 20:
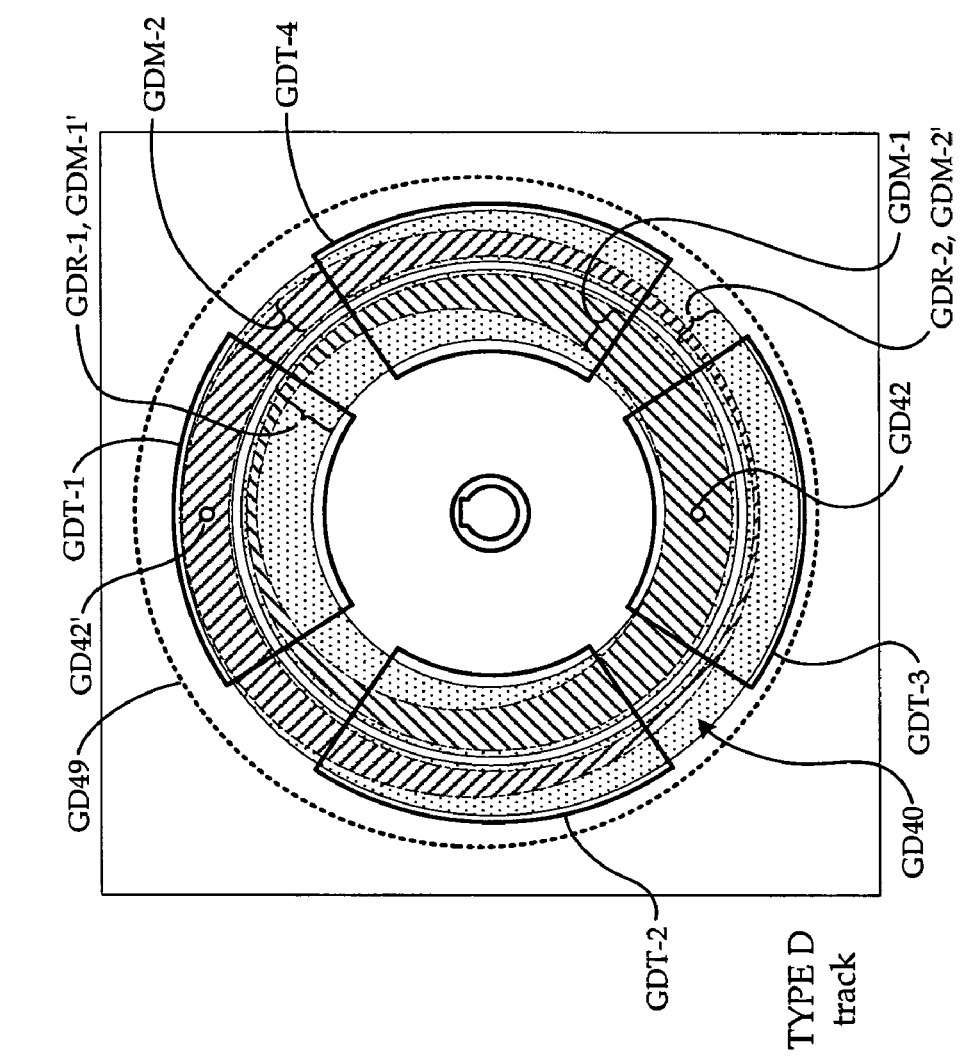
FIG. 20 illustrates the modulation pattern of FIG. 16 and a transmitter electrode configuration of the fourth generic capacitive position-sensing configuration superimposed to show their nominal assembled alignment.

FIG. 20 illustrates the receiver electrode pattern GD60, the modulation pattern GD40 and a transmitter electrode pattern GD20 analogous to the previously described transmitter electrode patterns GA20-GC20, all superimposed to show their nominal assembled alignment. The individual concentric sub-tracks of this TYPE D track configuration are each designed and operated in the same manner as the TYPE C track, thus the details of their individual operation to provide two individual differential signals requires no further explanation. Because the two modulator regions GDM-1 and GDM-2 are arranged to have a 180 degree phase difference, the differential signals will have a 180 degree phase difference, which provides certain accuracy advantages as described in the incorporated '772 Application. The phase of the overall differential signal will change linearly as a function of the rotation angle. Thus, the phase of the net differential signal across the receiver electrodes GDR-1 and GDR-2 is indicative of the angular position of the modulation pattern GD40.

FIGS. 21-25 illustrate a generic capacitive position-sensing configuration that is hereafter designated a TYPE E scale track. The TYPE E track uses a receiver electrode pattern GE60 similar to its counterpart in the TYPE C track. The modulator pattern and the transmitter electrode pattern of the TYPE E track operate together in a manner analogous to the modulator pattern and the transmitter electrode pattern of the TYPE C track, except that they provide two signal cycles for a single rotation of the modulator pattern, as described in greater detail below.

FIG. 21 illustrates the transmitter-facing side of a generic scale member GE49 that carries a bridge electrode arrangement comprising a modulation pattern GE40 that includes a single modulator region GEM-1, formed by conductive plate that includes a pattern that repeats itself every 180° around the scale track. The modulator region GEM-1 is connected by a plated hole or wire GE42 (and an optional redundant connection GE42') to a circular bridge electrode GEM-1', shown in FIG. 22. The modulator region GEM-1 and its associated bridge electrode GEM-1' are designed and operate in a manner analogous to that of the modulator region GCM-1 and its associated bridge electrode GCM-1' of the modulation pattern GC40, except that the repeating pattern of the modulator region GEM-1, in cooperation with the transmitter electrode pattern GE60 described below, produces two output signal cycles for each rotation.

In particular, similar to the modulation pattern GC40, the modulation pattern GE40 may be thought of as two merged portions. An outer portion having a pattern that repeats each 180°, merged with an inner portion formed by a thin circular ring having a width approximately equal to the width of either of the two thin sections of the modulation pattern GE40 that that are located diametrically across from each other along the horizontal direction in FIG. 21. The pattern of the outer portion can be determined by adapting the principles described for the modulation pattern GB40 to provide one modulation cycle for π radians of rotation. For example, by adapting with the teachings related to EQUATION 1 to the transmitter electrode pattern GE60 shown in FIG. 25, and referring only to the configuration of the varying outer portion of the modulation pattern GE40, for the outer portion intervening area corresponding to a single transmitter electrode to fall to zero, the angular span between the tips of the outer portion modulation pattern should be the same as π radians plus the angular span of a transmitter electrode. Thus, designating the angular span of a transmitter electrode as spanT, the spatial period of the sinusoidal area function that defines the outer portion of the modulation pattern GB40 will be approximately (π-spanT) radians. Further designating the radial dimension from the outer boundary at an angular position α to the center of rotation as $d_O(\alpha)$ and the constant radius dimension from the inner boundary of the outer portion to the center of rotation as $d_I$, all that is required is that, ideally, the boundaries satisfy the condition that $$\frac{[d_o^2(\alpha) - d_1^2]}{2} = K \sin\frac{2\pi\alpha}{(\pi - spanT)} \quad \text{(EQ. 2)}$$

as α varies over an angular range from zero to (π-spanT) radians. K is a desired maximum radial dimension across the outer portion of the receiver electrode GER-1. To provide two modulation cycles over to π radians around the scale track, the outer portion boundaries should be determined in a similar manner as α varies over an angular range from π to (2π-spanT) radians. There are a number of boundary patterns that are able to meet this condition, and a suitable pattern may be determined analytically or by trial and error, or by any other convenient means. However, in order to provide the maximum capacitance modulation, in the vicinity of $\alpha=\frac{1}{2}*(\pi\text{-spanT})$ and $\alpha=\pi+\frac{1}{2}*(\pi\text{-spanT})$, $d_O(\alpha)$ should be just slightly less than the outer radius of the receiver electrode GER-1 and $(d_I-w_{ip})$ should be just slightly greater than the inner radius, where $w_{ip}$ is the constant radial width of the inner portion of the receiver electrode GER-1. The modulation pattern GB40 is just one example of a pattern that meets all of the design guidelines outlined above. Thus, with the exception that it is designed to provide two modulation cycles per rotation, the modulation pattern GE40 otherwise modulates similarly to the modulation pattern GC40.

FIG. 23 illustrates the modulator region GEM-1 and the bridge electrode GEM-1' superimposed to show their nominal alignment on the scale member GE49.

FIG. 24 illustrates a generic receiver electrode member GE69 carrying a receiver electrode pattern GE60 including a circular electrode GER-1. In various embodiments, the inner and outer diameters of the receiver electrode GER-1 approximately coincide with those of the bridge electrode GEM-1' in order to maximize their capacitive coupling. In order to provide a more stable signal, the boundaries of the bridge electrode GEM-1' may be located entirely within the boundaries of the receiver electrode GER-1.

FIG. 25 illustrates the receiver electrode pattern GE60, the modulation pattern GE40 and the transmitter electrode pattern GE20, all superimposed to show their nominal assembled alignment. The transmitter electrode pattern GE20 includes individual transmitter electrodes GET-1 through GET-4 and GET-1' through GET-4', distributed in an axisymmetric layout as shown. According the previous descriptions of the receiver electrode pattern GE60, the transmitter electrode pattern GE20, and the bridge electrode arrangement that includes the modulation pattern GE40 positioned as shown, when the respective pairs of opposing transmitter electrodes GET-1 and GET-1', GET-2 and GET-2', GET-3 and GET-3', and GET-4 and GET-4', carry phase shifted input signals of 0°, 90°, 180°, and 270°, respectively, the signals will be coupled to the receiver electrode GER-1 as follows: the 0°-phase signal will be strongly coupled through the intervening areas A1 and A1'; the 90°-phase signal will be moderately coupled through the areas A2 and A2' and the 270°-phase signal will be coupled equally to the 90°-phase signal, through the areas A4 and A4', such that the 90°-phase signal and the 270°-phase signal nominally cancel each other due to their opposite phases; and the 180°-phase signal will be weakly coupled through the minimal areas A3 and A3'. Thus, for the position shown in FIG. 7, the signal on the receiver electrode GER-1 will have a nominal phase of 0°. According to features outlined above, as the modulation pattern GE40 is rotated along the scale track, the various areas A1-A4 and A1'-A4' will vary sinusoidally over each of the transmitter electrodes GET-1 through GET-4 and GET-1' through GET-4' to produce one complete sinusoidal cycle over 180° of rotation. This will cause the phase of the net signal on the receiver electrode GER-1 to vary linearly as a function of the rotation angle, and to repeat after each 180° of rotation. Thus, the phase of the net signal on the receiver electrode GER-1 is indicative of the angular position of the modulation pattern GE40. Stated another way, any respective signal on the receiver electrode GER-1 is indicative of two respective angular positions of the modulation pattern GE40 that are located 180° from each other, since the modulation pattern GE40 includes a pattern that repeats itself each 180° around the scale track. This position ambiguity is resolved by the use of an additional position signal provided by an additional scale track in various multi-turn capacitive encoder embodiments according to this invention, as described further below.

Figure 26:
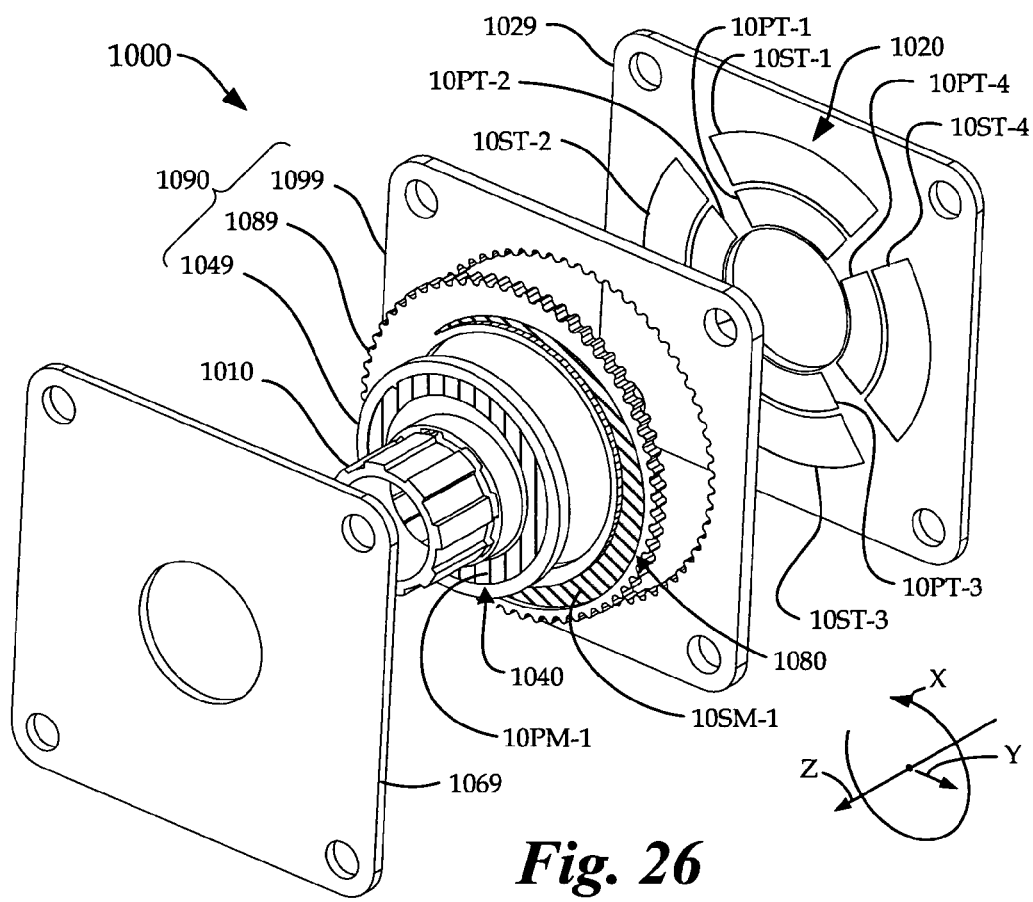
FIG. 26 repeats the exploded isometric view of the first exemplary embodiment of the multi-turn capacitive encoder shown in FIG. 1.

FIG. 26 repeats the exploded isometric view of the multi-turn capacitive encoder 1000 and its various elements as shown in FIG. 1. FIG. 26 is included here for continuity with the following detailed description of the multiturn encoder 1000 with reference to FIGS. 27-38, and additionally identifies the individual primary scale transmitter electrodes 10PT-1 through 10PT-4 (where "PT" identifies them as Primary scale Transmitter electrodes), arranged around the primary scale track. Similarly, the individual secondary scale transmitter electrodes 10ST-1 through 10ST-4 (where "ST" identifies them as Secondary scale Transmitter electrodes) are arranged around the secondary scale track.

Figure 27:
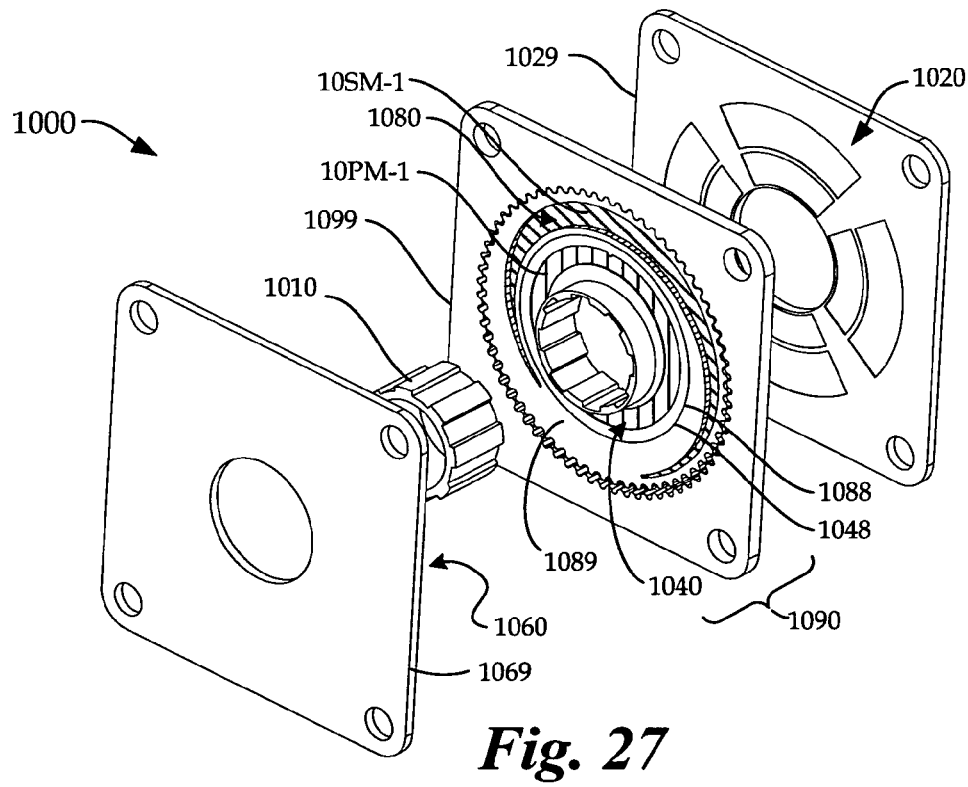
FIG. 27 is a partially assembled, partially exploded isometric view of the first exemplary embodiment of a multi-turn capacitive encoder shown in FIG. 26.
Figure 35:
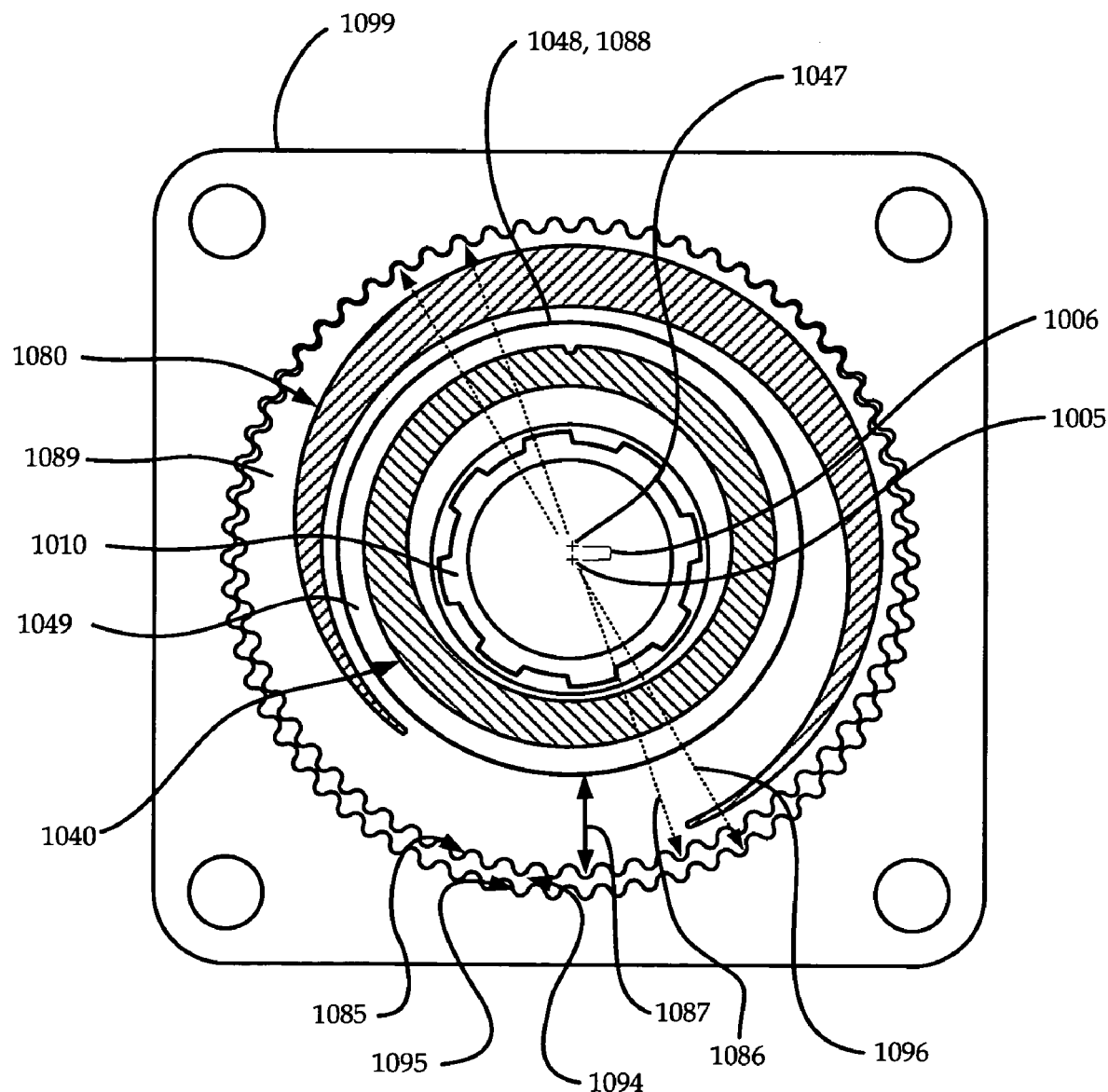
FIG. 35 is a plan view illustrating the shaft coupling, primary scale modulation member, secondary scale modulation member, and outer cycloidal gear member usable in the first exemplary embodiment of a multi-turn capacitive encoder and collectively shown in FIGS. 26-34, in their assembled positions.

FIG. 27 is a partially exploded view of the multi-turn capacitive encoder 1000 that shows the cycloid gear assembly 1090 with its components in an assembled position. As described in greater detail with reference to FIG. 35, the outer cycloid gear member 1099 has 66 internal cogs or gear teeth, and the secondary scale member 1089 has 64 external cogs or gear teeth. The internal and external cogs are aligned in the same plane and mesh with each other in a conventional cycloidal gear reduction fashion when the secondary scale member 1089 is driven by the primary scale member 1049, as best shown in FIG. 35. The primary scale member 1049 is aligned in the same plane with the secondary scale member 1089, and has an outer diameter 1048 that is eccentric with respect to a nominal center of rotation of the primary scale member 1049. The eccentric outer diameter 1048 closely fits an inner diameter 1088 of the secondary scale member 1089. The overall operation of the cycloid gear assembly 1090 is described in greater detail below, with reference to FIG. 35. The embodiment shown in FIG. 22 also shows the shaft coupling 1010 as having external teeth, which mesh with corresponding internal teeth of the primary scale member 1049, such that when the shaft coupling 1010 is coupled to a drive shaft inserted through the center of the multi-turn capacitive encoder 1000, the rotation of the drive shaft will be coupled from the shaft coupling 1010 to the primary scale member 1049, and thus drive the entire cycloid gear assembly 1090. Alternatively, the shaft coupling 1010 can be coupled to the primary scale member 1049 with matching single key and key way features, or the like. Regardless of the coupling method, in various embodiments according to this invention, the meshing internal and external teeth, or the internal and external key and key way, is designed to allow axial play or sliding between the shaft coupling 1010 and primary scale member 1049, such that the drive shaft does not induce high levels of stress to and friction between the various members of the multi-turn capacitive encoder 1000 along the axial direction, even when there is axial play or misalignment of the drive shaft during operation.

Figure 28:
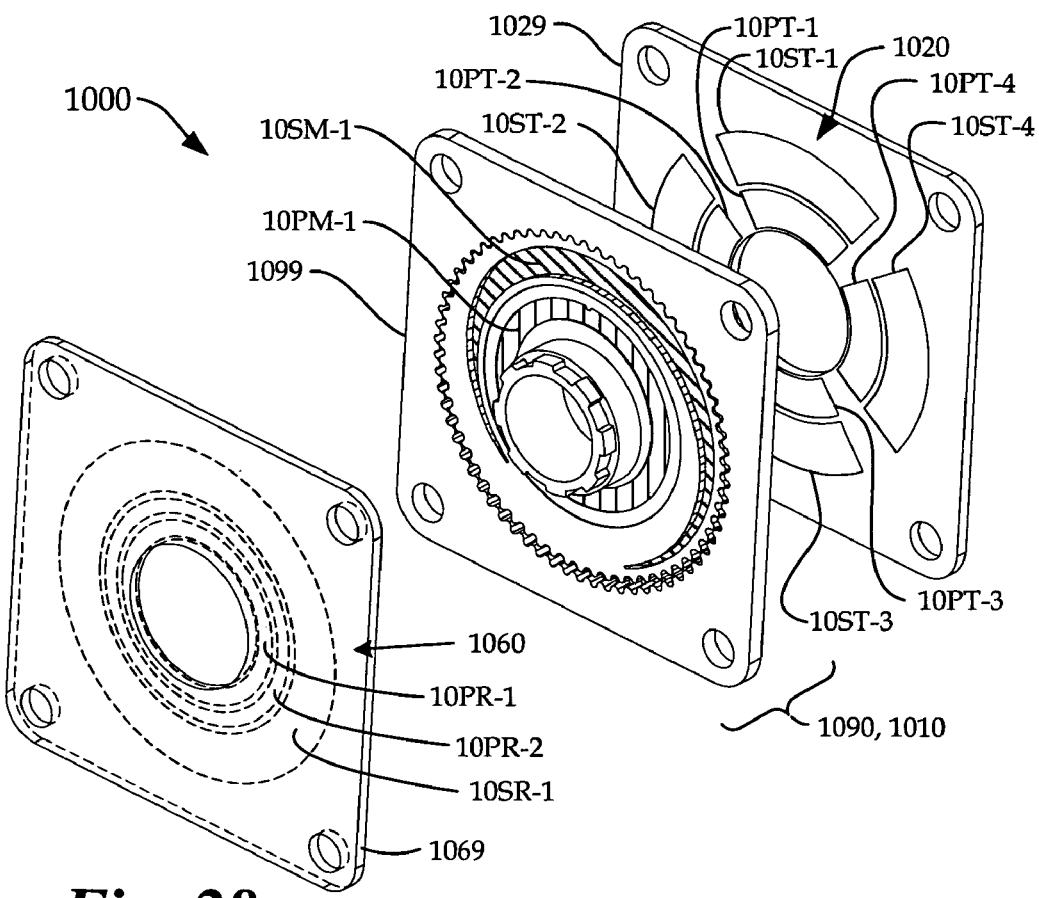
FIG. 28 is a partially assembled, partially exploded isometric view of the first exemplary embodiment of a multi-turn capacitive encoder shown in FIG. 26, illustrating the receiver member and receiver electrodes in transparent outline.
Figure 36:
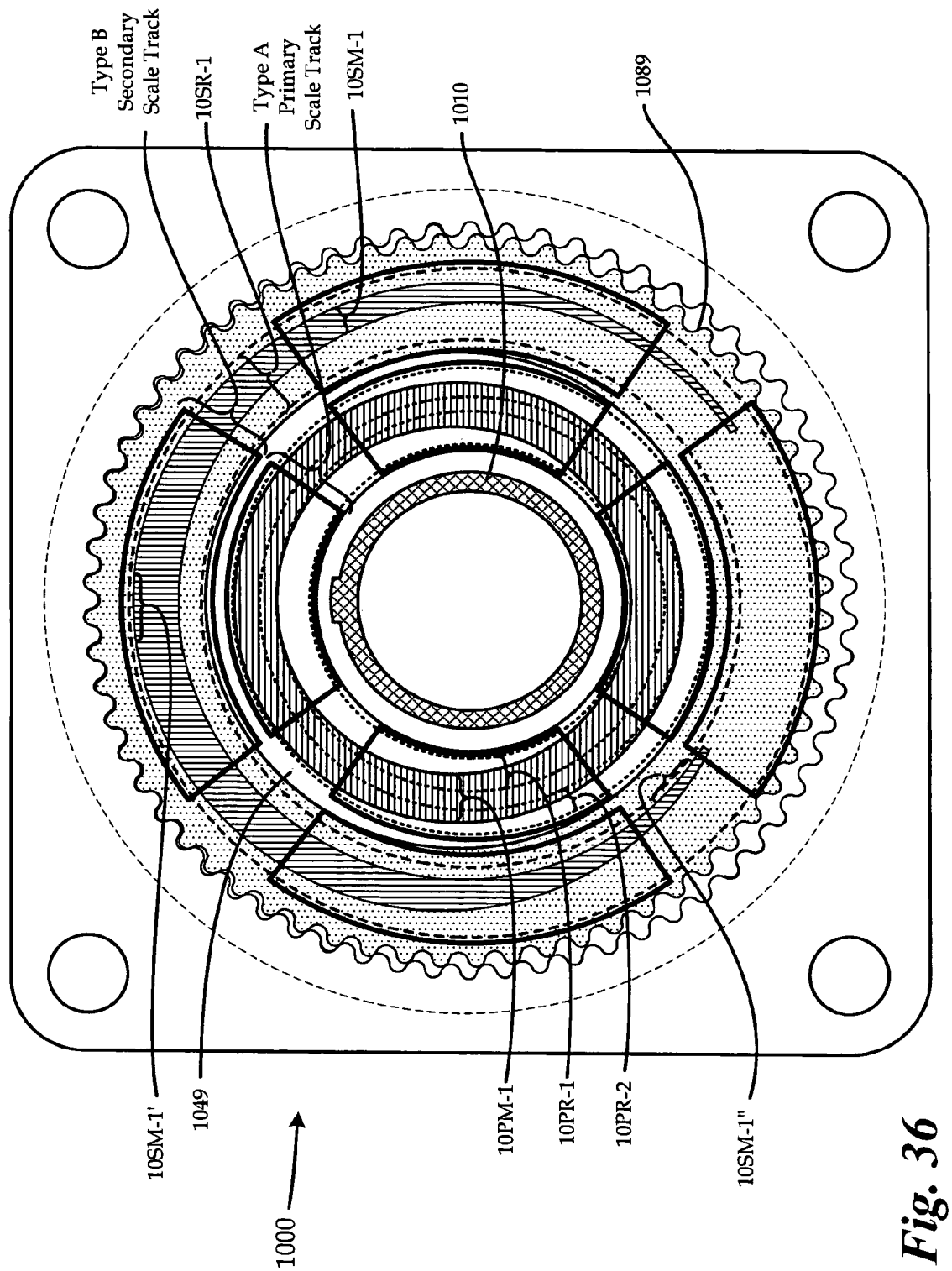
FIG. 36 is a plan view illustrating the various exemplary transmitter electrodes, receiver electrodes, and modulation patterns usable in the first exemplary embodiment of a multi-turn capacitive encoder and collectively shown in FIGS. 26-35, all superimposed to show their nominal assembled alignment.

FIG. 28 is a partially exploded view of the multi-turn capacitive encoder 1000 that shows shaft coupling 1010 assembled in the cycloid gear assembly 1090. In addition, FIG. 28 shows the receiver electrode member 1069 in transparent outline, revealing the outlines of a differential pair of primary scale receiver electrodes, 10PR-1 and 10PR-2, and a secondary scale receiver electrode 10SR-1. The various receiver electrodes are shown in greater detail in FIG. 31. As seen in FIG. 28, and as best shown in FIG. 36, the receiver electrodes 10PR-1 and 10PR-2, the modulator region 10PM-1 and the set of transmitter electrodes 10PT-1 through 10PT-4 form a primary scale track that is one embodiment of a TYPE A track, and are designed and operated as such. The receiver electrode 10SR-1, the modulator region 10SM-1 and the set of transmitter electrodes 10ST-1 through 10ST-4 form a secondary scale track that is one embodiment of a TYPE B track, and are designed and operated as such.

Figure 29:
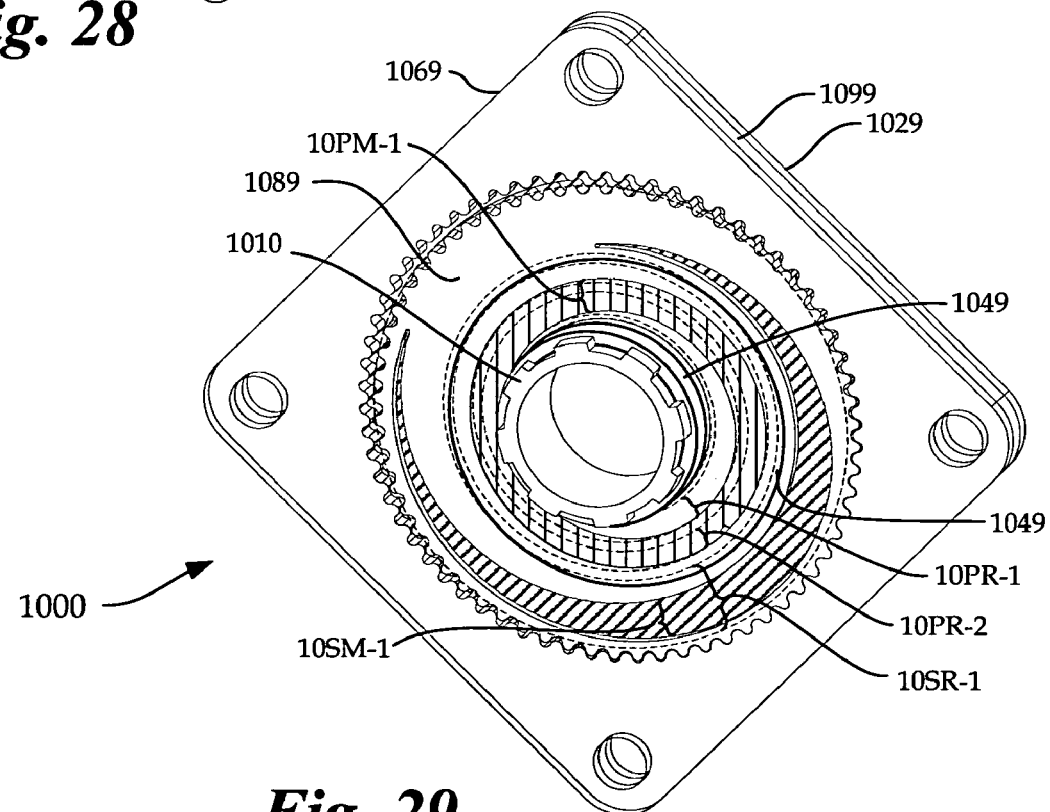
FIGS. 29 and 30 are two different isometric views of the multi-turn capacitive encoder shown in FIGS. 26-28 as a complete assembly, including the receiver member and receiver electrodes in transparent outline.
Figure 30:
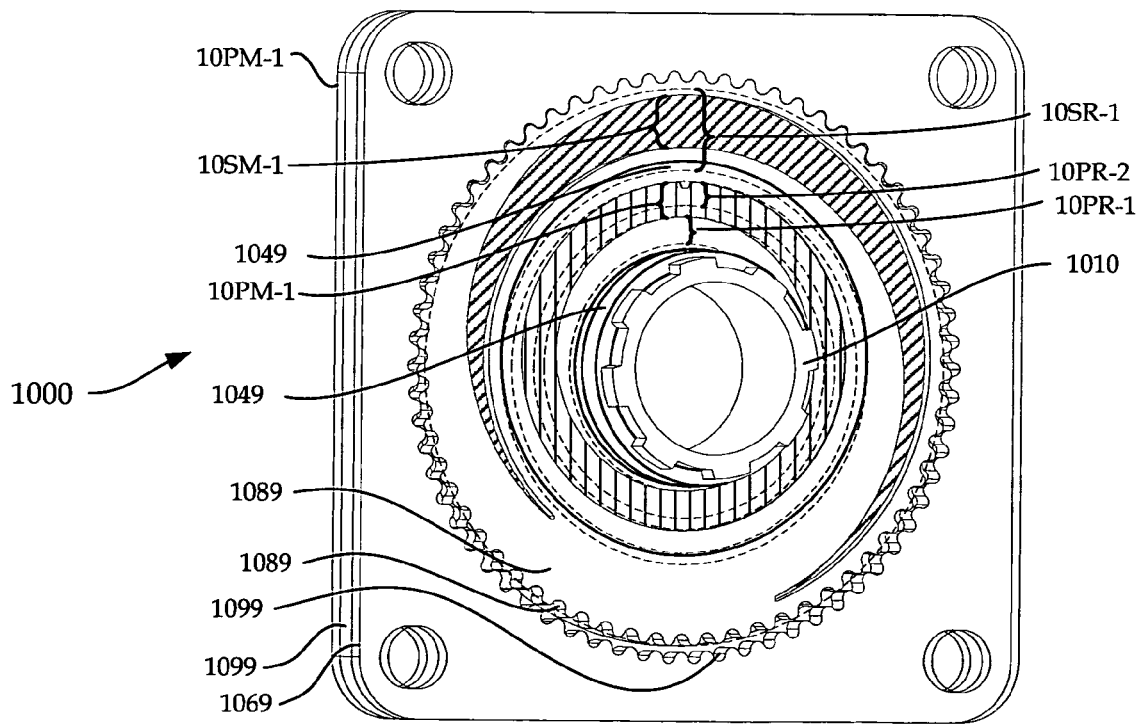

FIGS. 29 and 30 are two different isometric views of the multi-turn capacitive encoder 1000 shown as a complete assembly, including the receiver electrode member 1099 and receiver electrodes in transparent outline.

Figure 31:
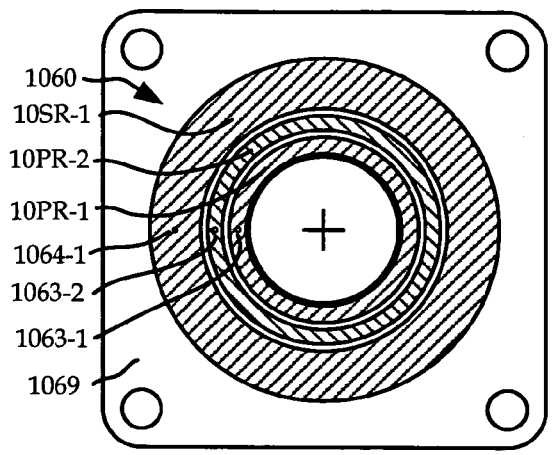
FIG. 31 is a plan view of a first exemplary receiver electrode configuration usable in the multi-turn capacitive encoder shown in FIGS. 26-30, along with a schematic illustration of one exemplary set of receiver signal connections.

FIG. 31 is a plan view of the receiver electrode member 1069 carrying the receiver electrode pattern 1060. In various exemplary embodiments, the receiver electrode member 1069 comprises a printed circuit board, and the various receiver electrodes comprise plated areas on the print circuit board. The receiver electrode pattern 1060 includes the TYPE A differential pair of receiver electrodes 10PR-1 and 10PR-2, which are connected to the inputs of a differential amplifier circuit mounted on the exterior surface of the receiver electrode member 1069 via plated through-hole connections 1063-1 and 1063-2 in various embodiments. The receiver electrode pattern 1060 also includes the TYPE B receiver electrode 10SR-1, which is connected to the one input of a "single-ended" amplifier circuit mounted on the exterior surface of the receiver electrode member 1069 via plated through-hole connection 1064-1, in various embodiments.

Figure 32:
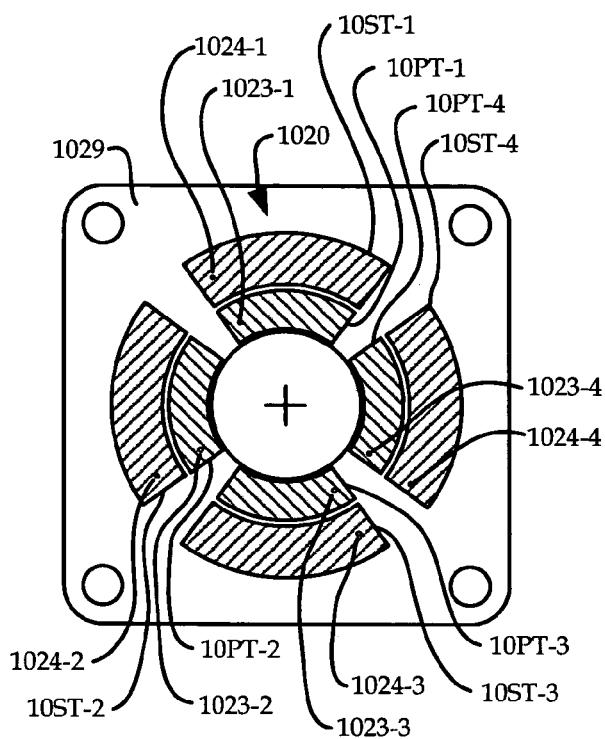
FIG. 32 is a plan view of a first exemplary transmitter electrode configuration usable in conjunction with the receiver electrode configuration shown in FIG. 31, along with a schematic illustration of one exemplary set of transmitter signal connections.

FIG. 32 is a plan view of the transmitter electrode member 1029 carrying the transmitter electrode pattern 1020. In various exemplary embodiments, the transmitter electrode member 1029 comprises a printed circuit board, and the various transmitter electrodes comprise plated areas on the print circuit board. The transmitter electrode pattern 1020 includes the TYPE A set of transmitter electrodes 10PT-1 through 10PT-4, which are connected to input 4 sinusoidal AC signals, having nominally identical amplitudes and relative phases of 0°, and 80°, 180°, and 270°, from a driver circuit mounted on the exterior surface of the transmitter electrode member 1029, via plated through-hole connections 1023-1 and 1023-4, in various embodiments. The transmitter electrode pattern 1020 also includes the TYPE B transmitter electrodes 10ST-1 through 10ST-4, which are connected to input 4 sinusoidal AC signals, having nominally identical amplitudes and relative phases of 0°, and 80°, 180°, and 270°, from a driver circuit mounted on the exterior surface of the transmitter electrode member 1029, via plated through-hole connections 1024-1 and 1024-4, in various embodiments. To obtain the highest measurment accuracy and best reliability, it is generally advantageous if the set of primary scale transmitter electrodes and the set of secondary scale transmitter electrodes are energized at different times in order to acquire position measurements at different times from the primary and secondary scale tracks. This minimizes error inducing cross talk between the independent measurement signal channels in a multi-turn capacitive encoder according to this invention. However, for less demanding applications, simultaneous activation may be possible.

Figure 33:
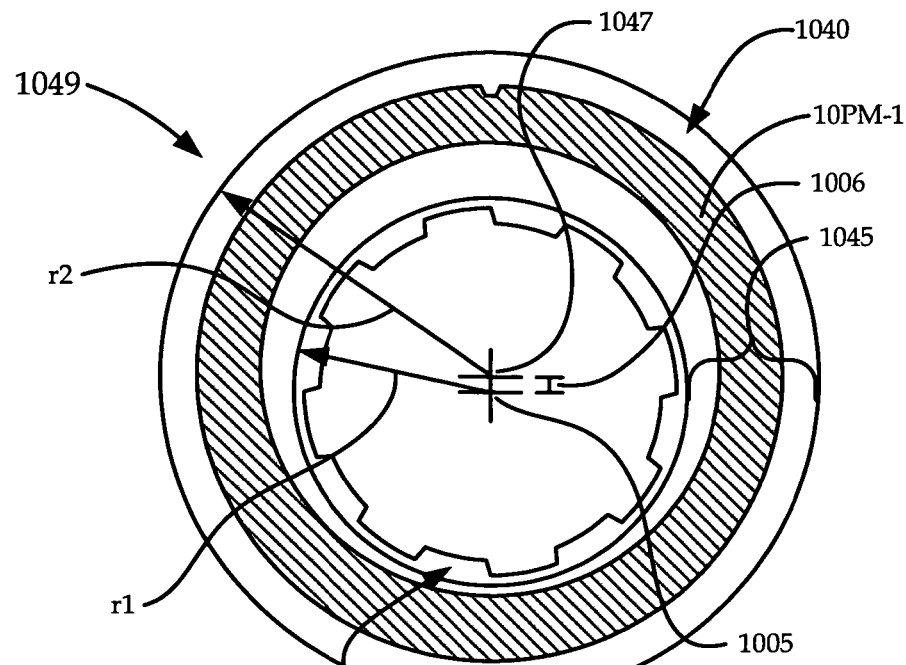
FIG. 33 is a plan view of the first exemplary primary scale member shown in FIGS. 26-30, including a plan view of a first exemplary primary scale modulation pattern usable in conjunction with the receiver and transmitter electrode configurations shown in FIGS. 31 and 32.

FIG. 33 is a plan view of the primary scale member 1049 carrying the TYPE A primary scale modulation pattern 1040, which includes a single modulator region 10PM-1. In various exemplary embodiments, the primary scale member 1049 comprises a molded dielectric member and the single modulator region 10PM-1 comprises a signal-balanced shield electrode comprising a conductive plate formed on, bonded to, or molded into the primary scale member 1049. The incorporated '772 Application describes signal-balanced shield electrode design and operation in detail. Alternatively, the single modulator region 10PM-1 may comprise a region of a molded or machined dielectric member having a thickness along the z-axis direction that is increased or decreased relative to a surrounding area of uniform thickness. In general, there are certain advantages to using a decreased thickness for the region.

Figure 37:
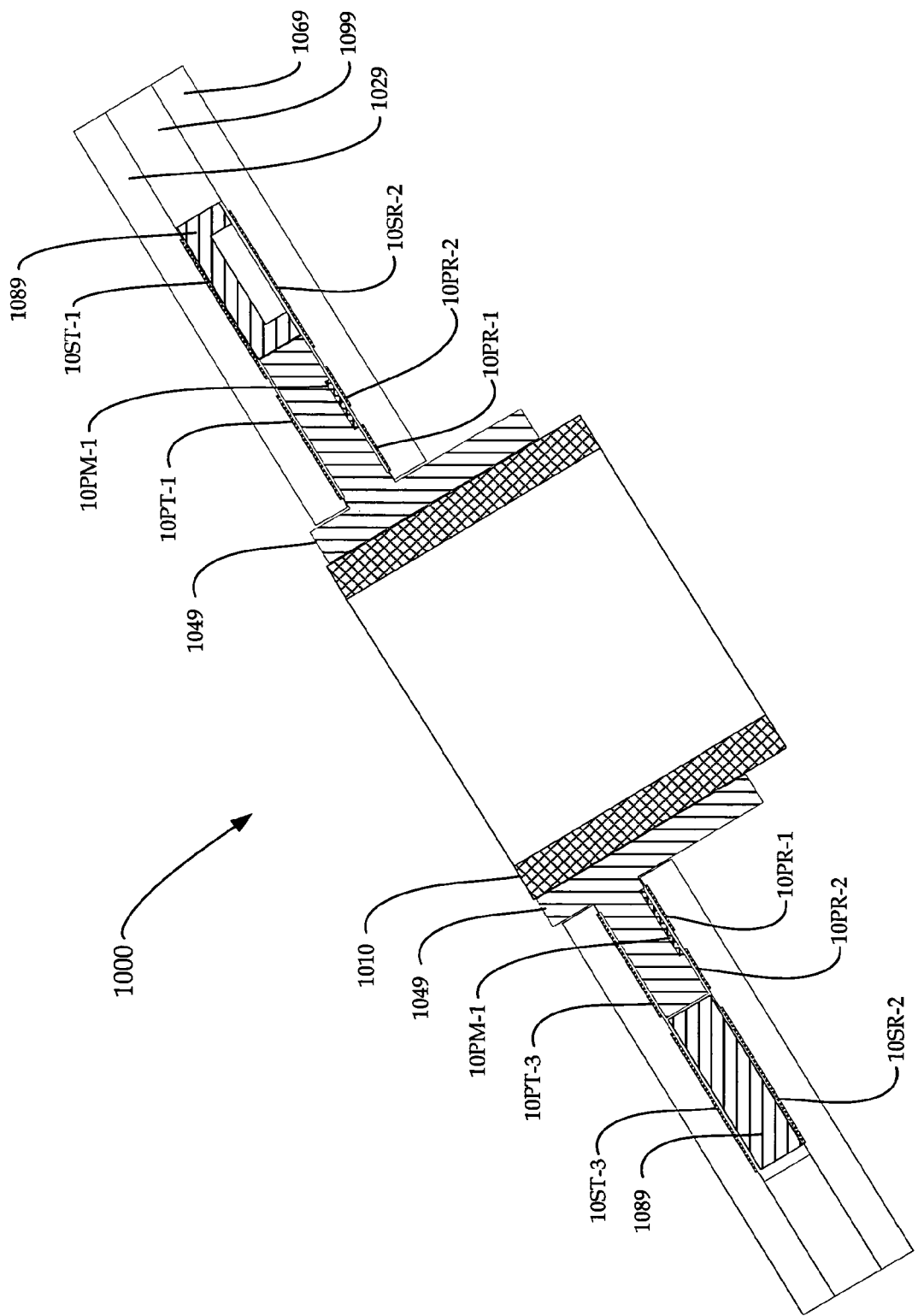
FIG. 37 is a cross-section view illustrating the first exemplary embodiment of a multi-turn capacitive encoder.

In the embodiment shown in FIG. 33, the primary scale 1049 includes a central spline portion 1046 that has an outer radius $r_1$ relative to the center of rotation 1005. The radius $r_1$ is selected to provide a slight clearance through the central through holes in the receiver and transmitter electrode members, as it extends through them along the direction of the z-axis in a collar-like fashion, as best seen in FIG. 37. The central spline portion 1046 mates with a corresponding internal spline or keyway of the shaft coupling 1010, as previously described. The primary scale member 1049 also includes an outer flange portion 1045 that carries the modulator region 10PM-1. The outer diameter 1048 of the outer flange portion 1045 has a center 1047 which is offset from the center of rotation 1005 by an offset 1006 that is sufficient for providing a proper clearance and "wobble" for the proper operation of the cycloid gear system 1090, as further clarified below with reference to FIG. 35. The outer diameter 1048 is just slightly less than the inner diameter of the secondary scale member 1089, such that one may turn freely within the other, yet with a sufficiently close fit that the cycloid gear system of the multiturn capacitive encoder 1000 operates with a desired precision. The radius $r_2$ is chosen such the outer flange is wide enough to accommodate the desired layout and spacing for the various operational electrodes and modulator of the TYPE A primary scale track.

Figure 34:
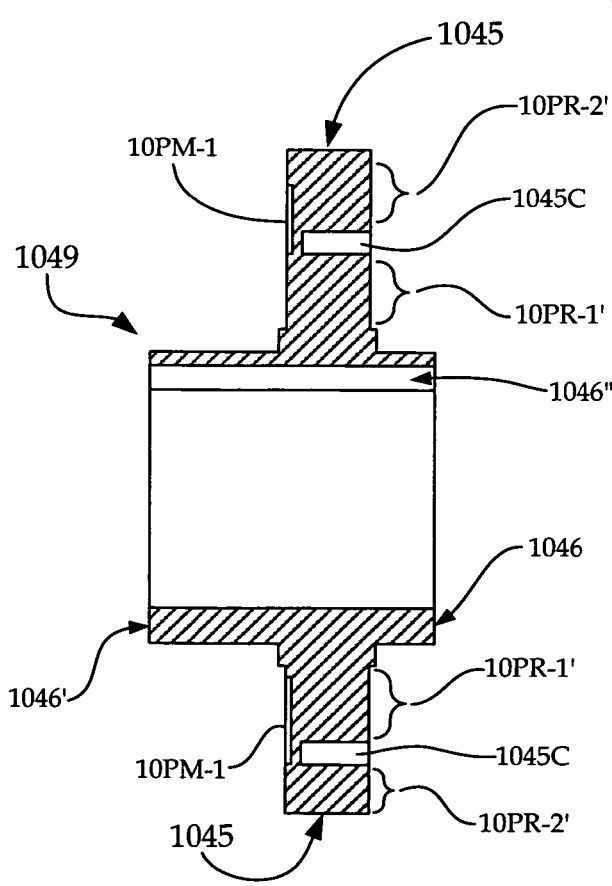
FIG. 34 is a side cross-sectional view through a second exemplary primary scale member that is similar to that shown in FIG. 33, except for an alternative mechanical coupling configuration.

FIG. 34 is a side cross-sectional view through primary scale member 1049, except than an alternative central coupling portion 1046' which includes only a single keyway or a single spline groove 1046", as an alternative to the multiple spline elements included in the central spline portion 1046. It will be understood that in such a case the shaft coupling 1010 is modified to match the coupling portion 1046'. In the embodiment shown in FIG. 34, an optional circular slot 1045C is included in the outer flange 1045 between the zones 10PR-1' and 10PR-2', which indicate the approximate assembled locations of the similarly numbered primary scale differential receiver electrodes, in order to reduce unwanted capacitive coupling between the their respective signal paths. The other elements shown in FIG. 34 may be understood based on the previous descriptions.

FIG. 35 is a plan view illustrating the shaft coupling 1010, the primary scale member 1049, the secondary scale member 1089, and the outer cycloidal gear member 1099, in their operational positions. In operation, the TYPE A primary scale track, including the primary scale modulation pattern 1040 and approximately coinciding with the extents of the outer flange 1045 provides for angular position measurement within a single turn, and the TYPE B secondary scale track, including the secondary scale modulation pattern 1080 and approximately coinciding with the extents of the secondary scale member 1089 provides for an angular position measurement that is used to indicate or count multiple turns of the multi-turn capacitive encoder 1000. Regarding the mechanical operation of the cycloidal gear system 1090, the desired rotary actuation of the secondary scale member 1089 is provided as follows.

As previously described, outer diameter 1048 of the primary scale member 1049 has a center 1047 which is offset from the center of rotation 1005 by an offset 1006 that is sufficient for providing a "wobble" of the secondary scale member 1089 that insures a desired cycloidal clearance gap 1094, for the proper operation of the cycloid gear system 1090. The secondary scale member 1089 has a nominal outer diameter 1086, and a constant nominal radial width 1087. In operation, the offset 1006 of the outer diameter 1048 causes the gear teeth 1085 of the secondary scale 1089 to engage the gear teeth 1095 of the outer cycloid gear member 1099, on the same side of the center of rotation 1005 as the direction of the offset direction 1006, and also provides the cycloidal clearance gap 1094. When the primary scale member 1049 is rotated, the region of gear tooth engagement proceeds around the periphery of the secondary scale member in alignment with the offset direction, once for each turn of the primary scale member 1049. The center of the secondary scale 1089 follows a "wobble" circle having a radius that is equivalent to the offset 1006 relative to the center of rotation 1005, in a manner characteristic of cycloid gear systems.

In a manner typical of cycloid gear systems, the net rotation of the secondary scale 1089 for one turn of the primary scale member 1049 depends on the difference between the number of gear teeth on the secondary scale 1089 and the number of gear teeth on the outer cycloid gear member 1099. Since the difference between the numbers of gear teeth is usually a small fraction of the total number of teeth, one turn of the primary scale member 1049 produces an increment of rotation of the secondary scale 1089 that is only a small fraction of a turn. Thus, in accordance with one aspect of the invention, several turns of the primary scale member 1049 may be measured or counted within one turn of the secondary scale 1089, which produces one cycle of the position measurement signal from the secondary scale track, as previously described with reference to the TYPE B track, for example.

In one exemplary embodiment, the outer diameter 1048 has a diameter of approximately 31.75 mm, which is made slightly less than the inner diameter 1088 of the secondary scale 1089, which has a dimension that may be, for example, approximately 31.85 mm, such that one may turn freely within the other, yet with a sufficiently close fit that the cycloid gear system of the multiturn capacitive encoder 1000 operates without excessive play or backlash. The center 1047 of the outer diameter 1048 is offset from the center of rotation 1005 by approximately 0.75 mm. With this amount of offset, as the primary scale member 1049 rotates it causes the center of the secondary scale member 1089 to follow a circle having a 0.75 mm radius. In this exemplary embodiment, this is the amount of "side to side" radial wobble that provides the required cycloidal gear engagement and the cycloidal clearance gap 1094 on opposite sides of the secondary scale 1089 during operation of the cycloid gear assembly 1090. In one embodiment, the gear teeth of the outer cycloid gear member 1099 are arranged along a nominal diameter 1096 of approximately 47 mm and the gear teeth of the secondary scale 1089 may be arranged along a nominal diameter 1086 of approximately 45.5 mm, providing a difference between the diameters of approximately 1.5 mm. Accordingly, in this exemplary embodiment the gear teeth of the cycloid gear assembly 1090 may have a peak to valley height of approximately 0.75 mm, which leaves a maximum clearance of approximately 0.75 mm between the peaks of the gear teeth 1085 and 1095 in the cycloidal clearance gap 1094.

In one embodiment, the outer cycloid gear member 1099 has 66 internal gear teeth, and the secondary scale 1089 has 64 external gear teeth. Thus, for one rotation of the primary scale member 1049, the secondary scale 1089 rotates by two teeth out of 64, that is, ⅟₃₂nd of a revolution. Accordingly, in this exemplary embodiment, the position of the secondary scale 1089 can unambiguously indicate any one of at least 31 individual, sequential, turns of the primary scale member 1049. Thirty-two individual turns can be unambiguously indicated provided that the $32^{nd}$ turn is stopped by a margin greater than the expected error margin and/or resolution of the multi-turn capacitive encoder 1000, before reaching the start of a 33rd turn.

FIG. 36 is a plan view illustrating the various transmitter electrodes, receiver electrodes, and modulation patterns included in the multi-turn capacitive encoder 1000 superimposed, to show their nominal assembled alignment. The alignment of the various features will be understood based on previous descriptions, with the exception of adjustments made in the TYPE B secondary scale track to account for the wobble of the secondary scale member 1089 during operation. The required adjustment is relatively simple. It can be seen that the most extreme maximum radius of the modulation region 10SM-1 is at the location 10SM-1', for the angular positions shown in FIG. 36. This maximum radius is equal to the radius of the location 10SM-1' from the center of the secondary scale member 1089 plus the offset 1006. Thus, it is desirable for the outer radius of the receiver electrode 10SR-1 to be slightly greater than this radius, to provide the most accurate measuring signal. Similarly, it can be seen that the extreme minimum radius of the modulation region 10SM-1 is approximately at the location 10SM-1", for the angular positions shown in FIG. 36. This minimum radius is approximately equal to the radius of the location 10SM-1" from the center of the secondary scale member 1089 minus the offset 1006. Thus, it is desirable for the inner radius of the receiver electrode 10SR-1 to be slightly less than this radius, to provide the most accurate measuring signal.

FIG. 37 illustrates a cross-section of the multi-turn capacitive encoder 1000, which further clarifies its assembly and implicitly shows the approximate aspect ratios of various parts and capacitive signal gaps. The design and function of the various parts will be understood by reference to their previous descriptions.

Figure 38:
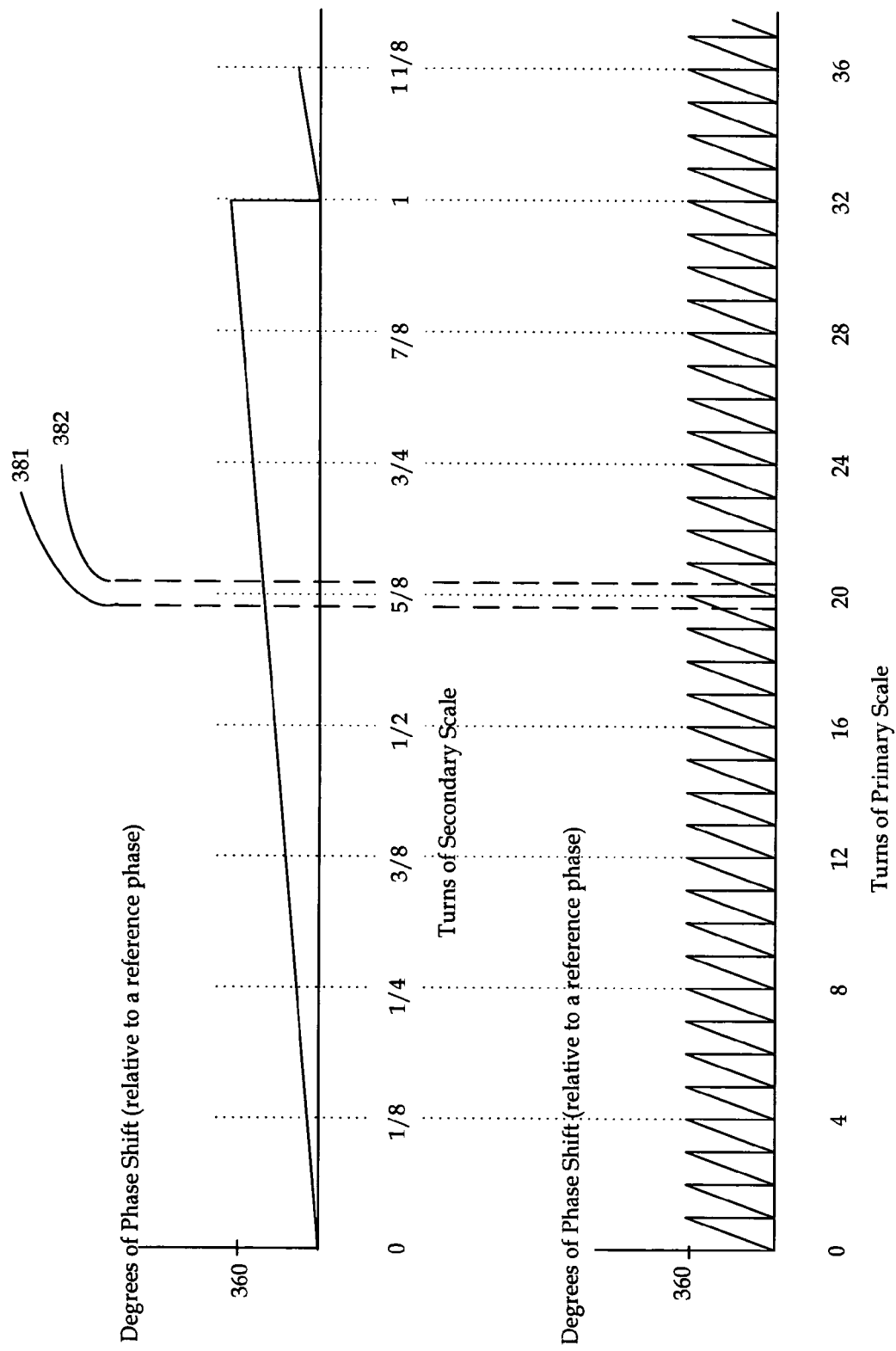
FIG. 38 illustrates various relationships between two signal phases associated with the operation of exemplary primary and secondary scale modulation patterns usable in various multi-turn capacitive encoder embodiments.

FIG. 38 illustrates two charts showing the relationship between the respective phase signals associated with the operation of the primary scale track and the secondary scale track of the multi-turn capacitive encoder 1000. The lower chart shows the degrees of phase shift of the measuring signal output from the primary scale track in relation to the number of turns, that is, the rotation, of the primary scale member. According to previous descriptions, the phase will shift linearly as a function of rotation, and the apparent phase shift will repeat every 360° of rotation, as shown. As indicated by the vertical axis label in FIG. 38, the phase shift of the measuring signal is measured relative to a reference phase, which is conveniently the phase of one of the input signals to the transmitter electrodes. Using known circuit techniques, for the multi-turn capacitive encoder 1000 the phase shift can be measured with an accuracy that permits angular measurement with an accuracy of at least one-half degree, or better.

The upper chart shows the degrees of phase shift of the measuring signal output from the secondary scale track in relation to the turns, that is, the rotation, of the secondary scale member. Furthermore, and the upper and lower charts are aligned to show the relationship between the turns of the primary and secondary scales, in accordance with the previous description in relation to FIG. 35. Again, according to previous descriptions, the phase of the output measuring signal from the secondary scale track will shift linearly as a function of rotation, and the apparent phase shift will repeat every 360° of rotation, or every turn, as shown. Within a range of up to 32 turns of the primary scale, the phase of the signal from the secondary scale track is thus indicative of a specific number of turns of the primary scale.

The dashed lines 381 and 382 are located at +/–⅜ of a primary scale turn relative to a turn (in this case, the $20^{th}$ turn) of the primary scale, to generically illustrate the required secondary scale track measuring accuracy. If the phase shift of the secondary scale track measuring signal can be determined with an uncertainty (error) that is less than or equal to this range, it will reliably identify the correct turn of the primary scale, with a conservative margin. As previously indicated, in the absence of significant mechanical errors, a phase shifted signal of the multi-turn capacitive encoder 1000 can generally be determined with an accuracy corresponding to ½ of a degree, or better. However, to account for additional errors associated with the wobble of the secondary scale member, and the potential for a small amount of rotational slippage between the primary scale member and the secondary scale member, the multi-turn capacitive encoder 1000 is designed such that the measurement accuracy associated with the secondary scale track need only be as good as $+/-[(^{360}/_{32})*^{3}/_{8}]$, or approximately +/–4 degrees to reliably identify the correct turn of the primary scale.

Figure 39:
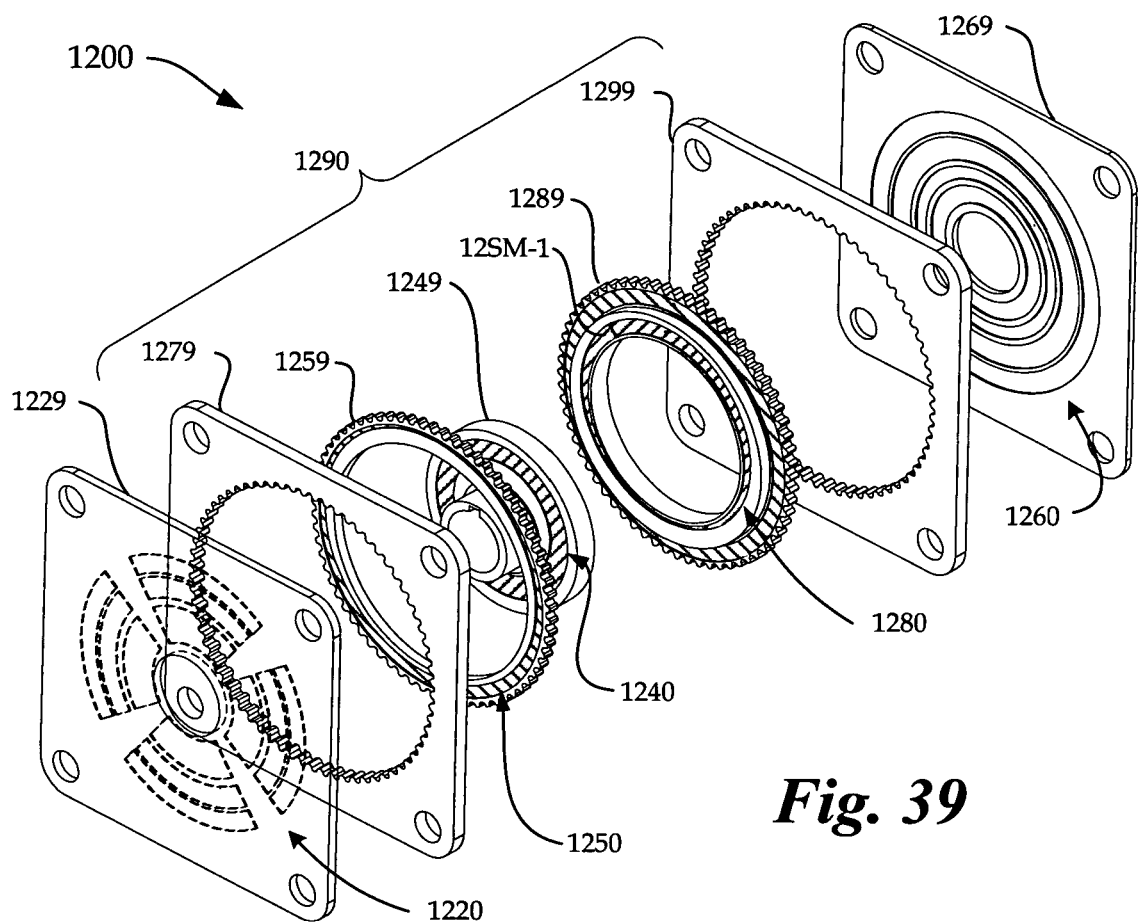
FIG. 39 is an exploded isometric view illustrating a second exemplary embodiment of a multi-turn capacitive encoder, including a receiver member and receiver electrodes in transparent outline.
Figure 40:
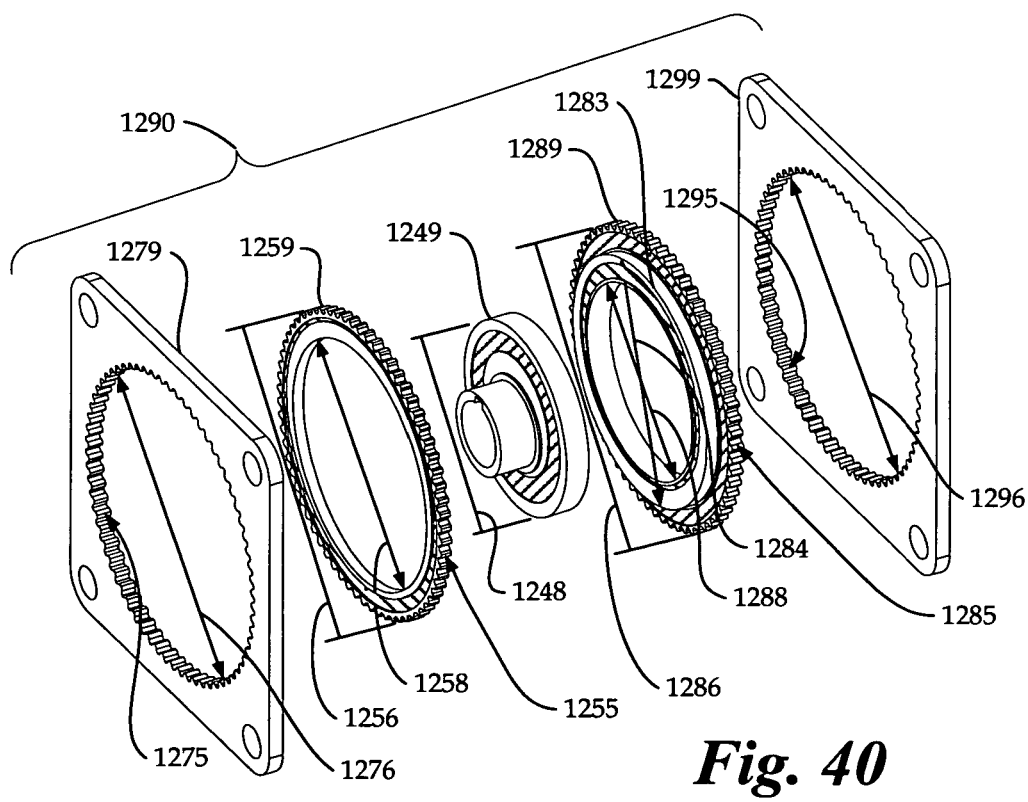
FIG. 40 is an exploded isometric view of the cycloid gear system elements of the second exemplary embodiment of a multi-turn capacitive encoder shown in FIG. 39.

FIG. 39 is an exploded isometric view of a second exemplary embodiment of a multi-turn capacitive encoder 1200 according to this invention. As shown in FIG. 39, the multi-turn capacitive encoder 1200 includes a transmitter electrode configuration 1220 carried on the interior side of a transmitter electrode member 1229, a tertiary scale modulation pattern 1250 having a single portion 12TM-1 carried on a tertiary scale member 1259, a primary scale modulation pattern 1240 having a single portion 12PM-1 (shown in FIG. 48) carried on a primary scale member 1249, a secondary scale modulation pattern 1280 having a single portion 12SM-1 carried on a secondary scale member 1289, and a receiver electrode configuration 1260 carried on the interior side of a receiver electrode member 1269. FIG. 39 also shows a tertiary outer cycloid gear member 1279, also referred to as the tertiary outer gear member 1279, and a secondary outer cycloid gear member 1299, also referred to as the secondary outer gear member 1299. The primary scale member 1249, the secondary scale member 1289, the tertiary scale member 1259 and the secondary and tertiary outer cycloid gear members 1299 and 1279, all together, form a cycloid gear assembly 1290. The primary scale member 1249 of the cycloid gear assembly 1290 rotates at the same rate as the input shaft that drives the encoder, while the secondary scale member 1289 and the tertiary scale member 1259 rotate at a much slower rate determined by the gear characteristics of the cycloid gear assembly 1290, as described further below.

Figure 42:
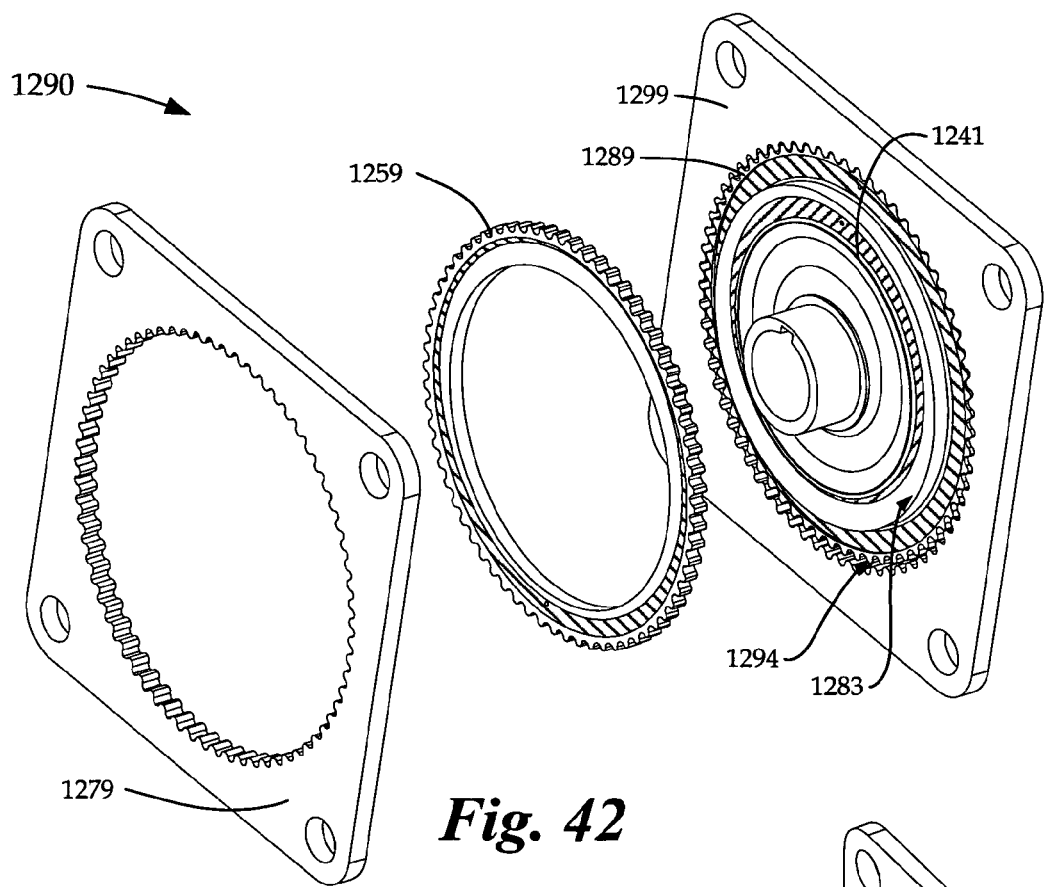
FIGS. 41-43 are partially assembled, partially exploded isometric views of the cycloid gear system elements shown in FIG. 40.
Figure 41:
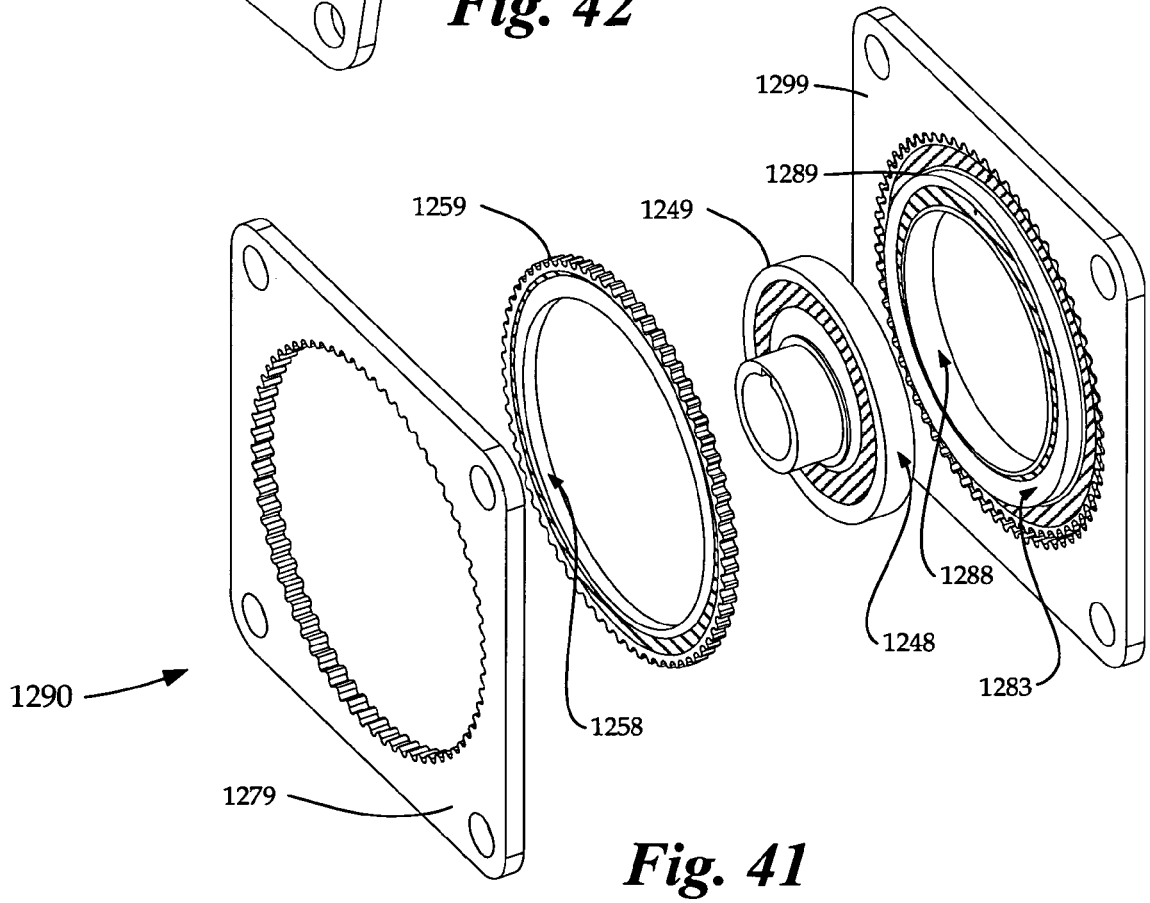
Figure 44:
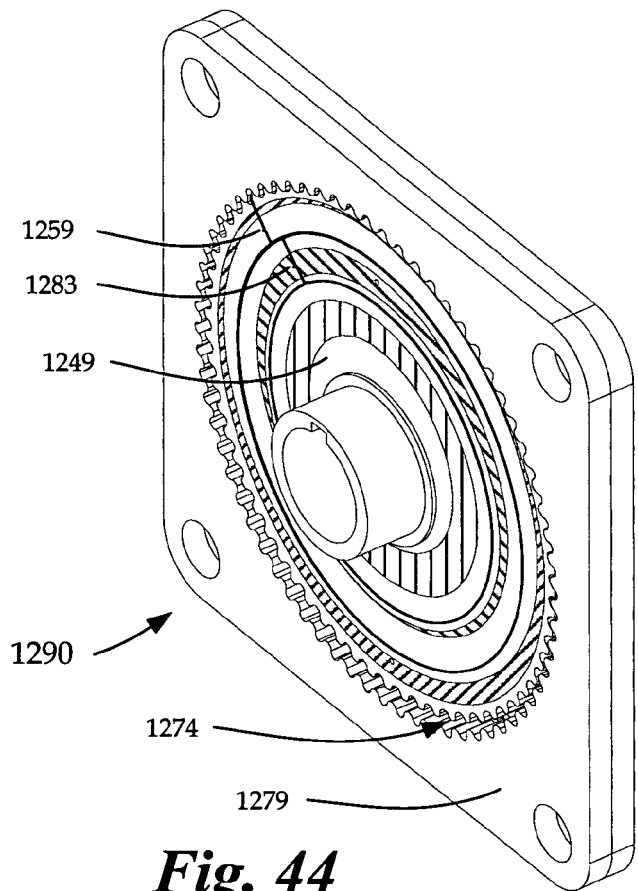
FIG. 44 is an isometric view illustrating a complete subassembly of the cycloid gear system elements shown in FIG. 40.
Figure 43:
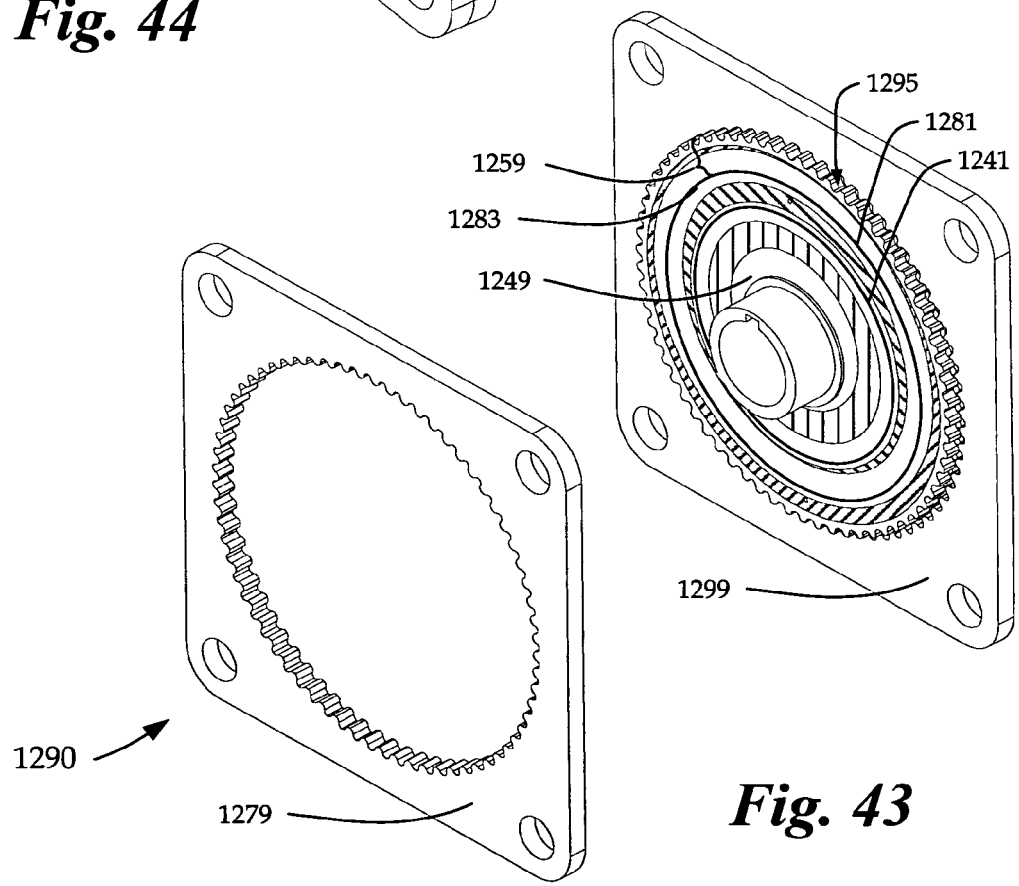

The arrangement of coordinate axes, including the circular measuring axis 80, described with reference to FIG. 1, will be understood to apply, in a similar orientation, to the multiturn capacitive encoder 1200. The inner ring of four transmitter electrodes of the transmitter electrode configuration 1220 is nominally aligned with the primary scale modulation pattern 1240 and an inner pair of circular differential receiver electrodes 12PR-1 and 12PR-2 (shown in FIG. 46) to form and/or coincide with an inner modulation track, or primary scale track. The primary scale track is TYPE A track. Similarly, the middle ring of four transmitter electrodes of the transmitter electrode configuration 1220 is nominally aligned with the secondary scale modulation pattern 1240 and a middle circular receiver electrode 12SR-1 of the receiver electrode configuration 1260 (shown in FIG. 46) to form and/or coincide with a middle or secondary scale track. The secondary scale track is TYPE C track. Similarly, the outer ring of four transmitter electrodes of the transmitter electrode configuration 1220 is nominally aligned with the tertiary scale modulation pattern 1250 and an outer circular receiver electrode 12TR-1 of the receiver electrode configuration 1260 (shown in FIG. 46) to form and/or coincide with an outer or tertiary scale track. The tertiary scale track is TYPE C track, which also includes a non-modulating bridge electrode carried on the secondary scale member 1289, as described further below FIGS. 40-44 show the cycloid gear system 1290 in various stages of assembly, to clarify its operation. The secondary outer cycloid gear member 1299 has 66 internal cogs or gear teeth, and the secondary scale member 1289 has 64 external cogs or gear teeth. As shown in FIG. 41, the internal and external cogs are aligned in the same plane and mesh with each other in a conventional cycloidal gear reduction fashion when the secondary scale member 1289 is driven by the primary scale member 1249. The tertiary outer cycloid gear member 1279 has 68 internal cogs or gear teeth, and the tertiary scale member 1259 has 66 external cogs or gear teeth. As shown in FIG. 44, The internal and external cogs are aligned in the same plane and mesh with each other in a conventional cycloidal gear reduction fashion when the tertiary scale member 1289 is driven by the shoulder 1283 of the secondary scale member 1289. As shown in FIGS. 42-44, the primary scale member 1249 is aligned in the same plane with the secondary and tertiary scale members 1289 and 1259, and has an outer diameter 1248 that is eccentric with respect to a nominal center of rotation of the primary scale member 1249. The eccentric outer diameter 1248 closely fits an inner diameter 1288 of the secondary scale member 1289. Similarly, the outer diameter 1284 of the shoulder 1283, which is concentric with the center of the secondary scale member 1289, closely fits an inner diameter 1258 of the tertiary scale member 1259, such that the tertiary scale member 1259 is carried along with the secondary scale member 1289, but is free to rotate about the shoulder 1283. Thus, when the rotation of a drive shaft is coupled by a shaft coupling (not shown) to the primary scale member 1249, it thus drives the entire cycloid gear assembly 1290.

Figure 45:
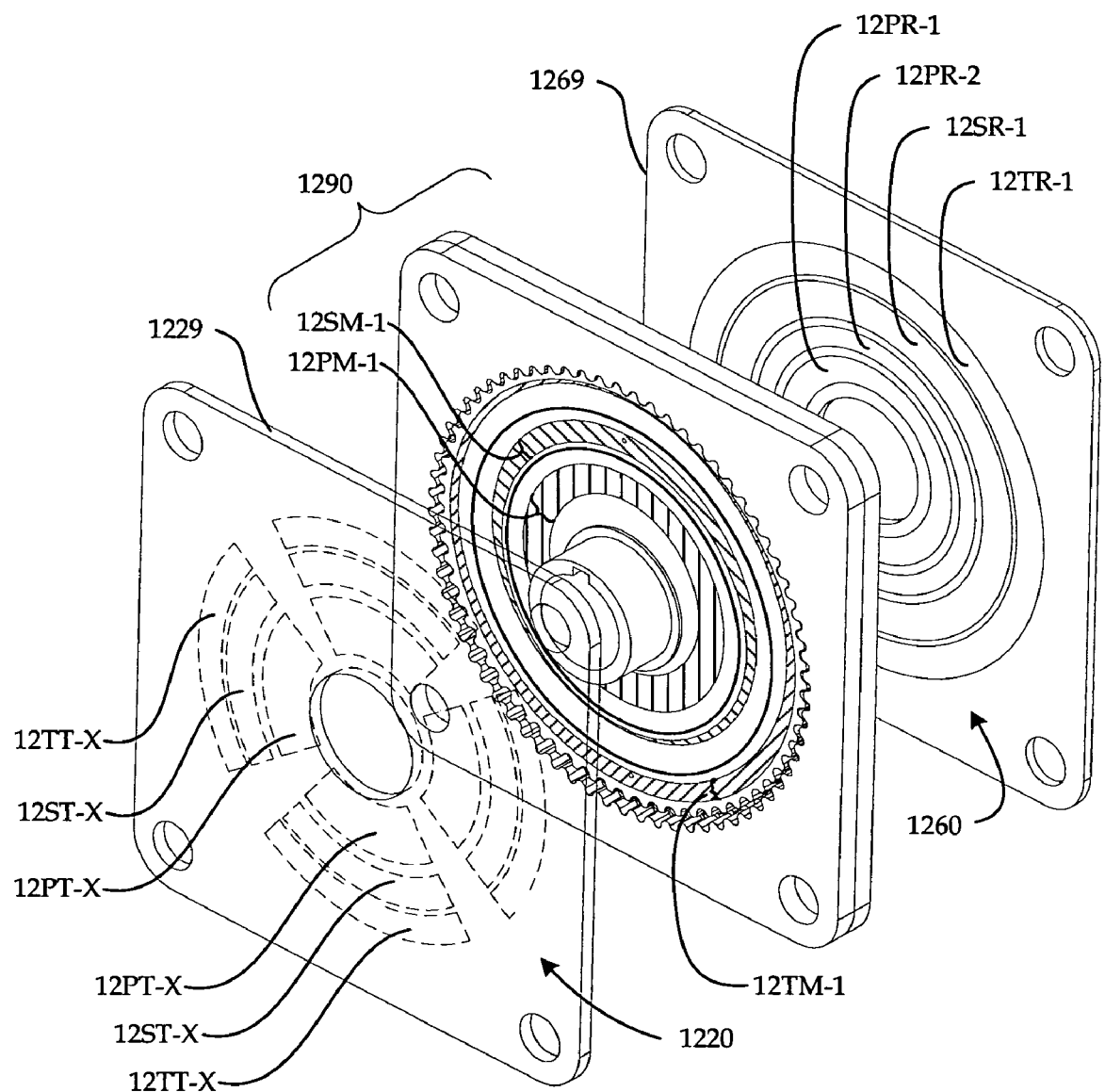
FIG. 45 is an exploded isometric view illustrating the complete subassembly shown in FIG. 44, and including a transmitter electrode member, as well as a receiver electrode member and receiver electrodes in transparent outline.

FIG. 45 is a partially exploded view of the multi-turn capacitive encoder 1200 that shows the assembled cycloid gear assembly 1290. In addition, FIG. 45 shows the receiver electrode member 1269, carrying the receiver electrode pattern 1260 including eight differential pair of primary scale receiver electrodes, 12PR-1 and 12PR-2, a secondary scale receiver electrode 12SR-1, and a tertiary scale receiver electrode 12TR-1. The various receiver electrodes are shown in greater detail in FIG. 46. In addition, FIG. 45 shows the transmitter electrode member 1229 in transparent outline, revealing the outlines of a transmitter electrode pattern 1220 including an inner ring of four primary scale transmitter electrodes 12PT-X, a middle ring out of four secondary scale transmitter electrodes 12ST-X, and an outer ring out of four tertiary scale transmitter electrodes 12TT-X. The various transmitter electrodes are shown in greater detail in FIG. 47. As previously outlined, the receiver electrodes 12PR-1 and 12PR-2, the modulator region 12PM-1 and the set of transmitter electrodes 12PT-1 through 12PT-4 form a primary scale track that is one embodiment of a TYPE A track, and are designed and operated as such. The receiver electrode 12SR-1, the modulator region 12SM-1 and the set of transmitter electrodes 12ST-1 through 12ST-4 form a secondary scale track that is one embodiment of a TYPE C track, and are designed and operated as such. The receiver electrode 12TR-1, the modulator region 12TM-1 and the set of transmitter electrodes 12TT-1 through 12TT-4 form a tertiary scale track that is one embodiment of a TYPE C track, and are designed and operated as such. Of course, the various electrode dimensions of the multiturn capacitive encoder 1200 should be designed with wobble taken into considerations, as previously discussed with reference to FIG. 36.

Figure 46:
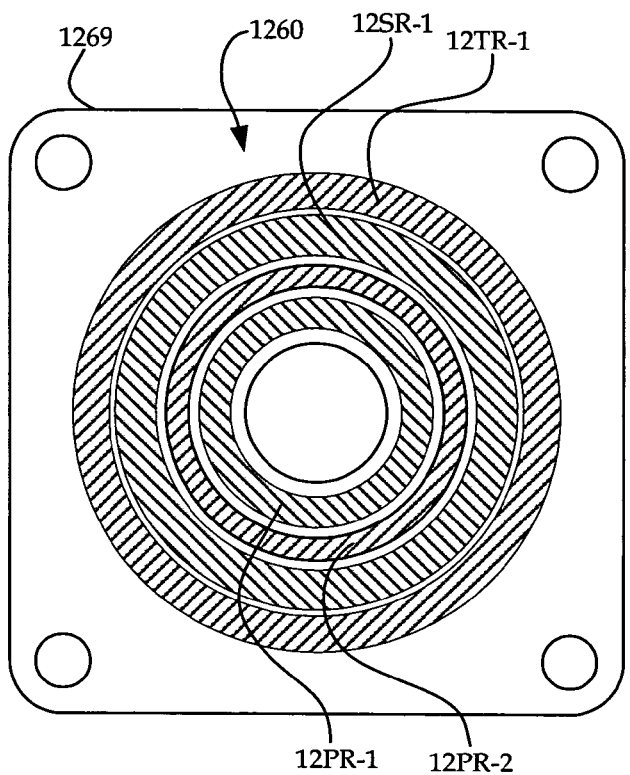
FIG. 46 is a plan view of an exemplary receiver electrode configuration usable in the multi-turn capacitive encoder shown in FIGS. 39-45.

FIG. 46 is a plan view of the receiver electrode member 1269 carrying the receiver electrode pattern 1260. In various exemplary embodiments, the receiver electrode member 1269 comprises a printed circuit board, and the various receiver electrodes comprise plated areas on the print circuit board. The receiver electrode pattern 1260 includes the TYPE A differential pair of receiver electrodes 12PR-1 and 12PR-2. The receiver electrode pattern 1260 also includes the TYPE C receiver electrode 12SR-1, and the TYPE C receiver electrode 12TR-1.

Figure 47:
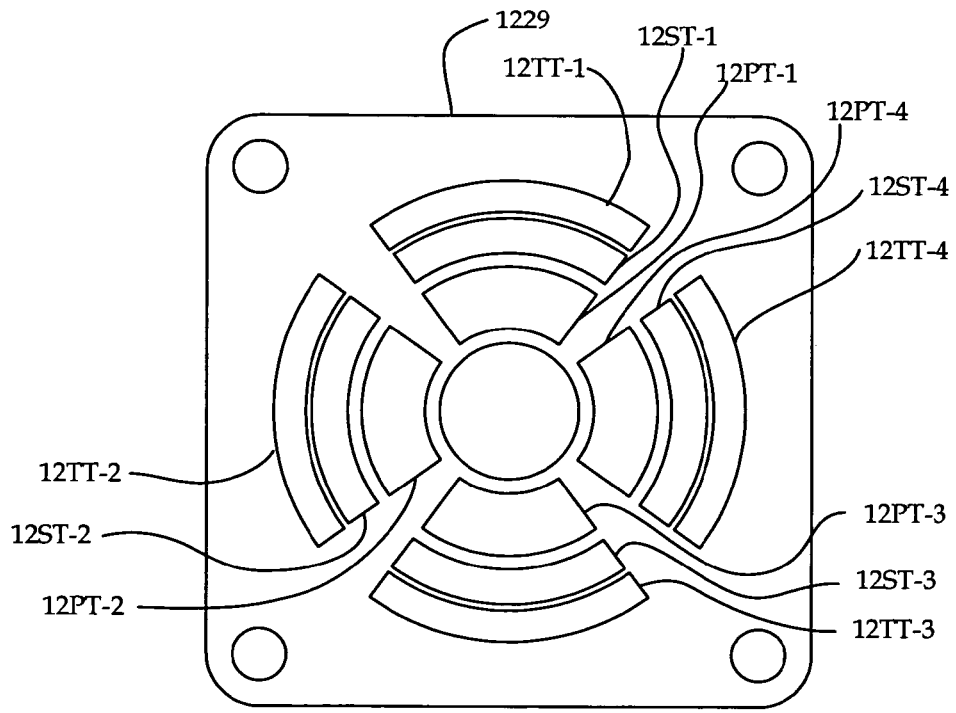
FIG. 47 is a plan view of an exemplary transmitter electrode configuration usable in conjunction with the receiver electrode configuration shown in FIG. 46.

FIG. 47 is a plan view of the transmitter electrode member 1229 carrying the transmitter electrode pattern 1220. In various exemplary embodiments, the transmitter electrode member 1229 comprises a printed circuit board, and the various transmitter electrodes comprise plated areas on the print circuit board. The transmitter electrode pattern 1220 includes the TYPE A set of transmitter electrodes 12PT-1 through 12PT-4, which are connected to input 4 sinusoidal AC signals, having nominally identical amplitudes and relative phases of 0°, and 80°, 180°, and 270°. The transmitter electrode pattern 1220 also includes the TYPE C transmitter electrodes 12ST-1 through 12SPT-4, which are also connected to input 4 sinusoidal AC signals, having nominally identical amplitudes and relative phases of 0°, and 80°, 180°, and 270°, and the TYPE C transmitter electrodes 12TT-1 through 12TT-4, which are similarly connected. To obtain the highest measurment accuracy and best reliability, it is generally advantageous if the set of primary scale transmitter electrodes, the set of secondary scale transmitter electrodes, and the set of tertiary scale transmitter electrodes are energized at different times in order to acquire position measurements at different times from the primary, secondary, and tertiary scale tracks. This minimizes error inducing cross talk between the independent measurement signal channels in a multi-turn capacitive encoder according to this invention. However, for less demanding applications, simultaneous activation may be possible.

Figure 48:
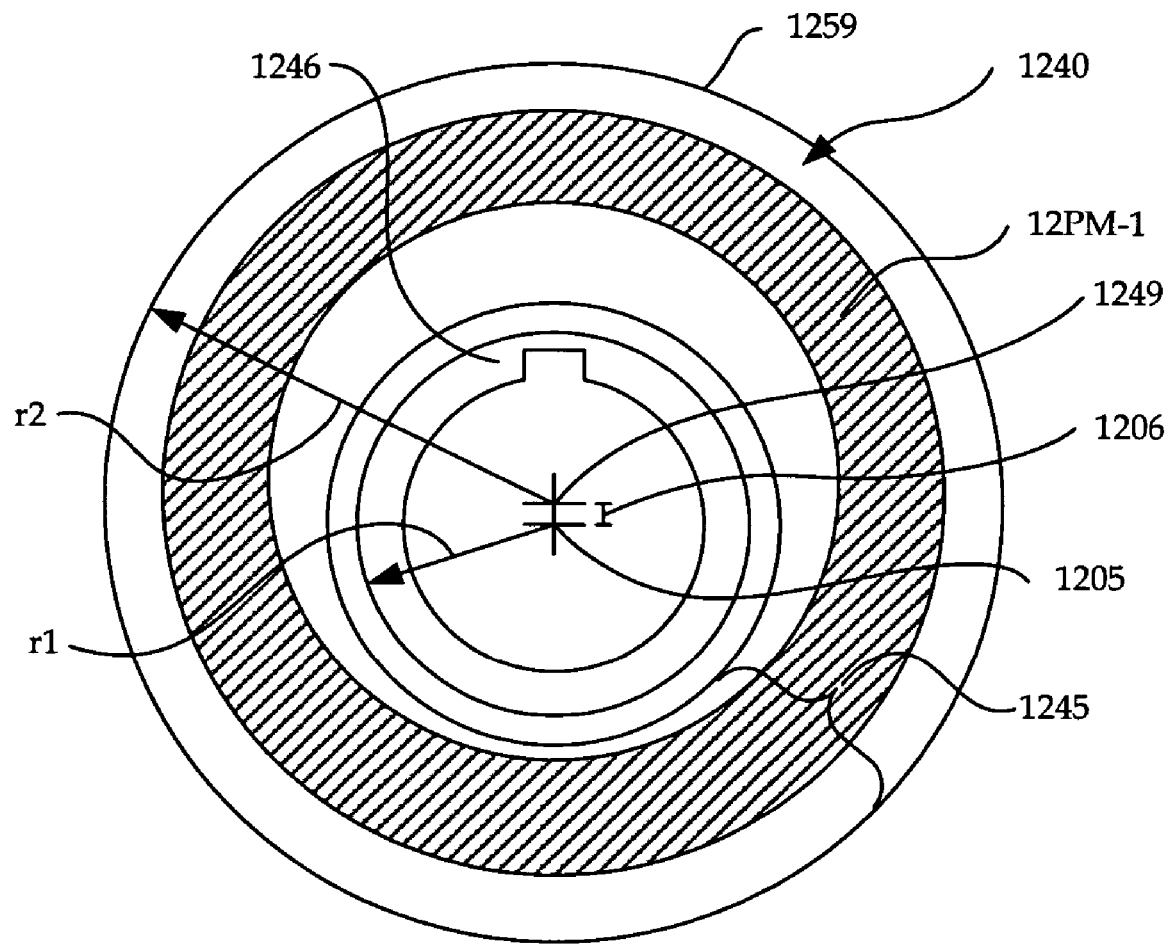
FIG. 48 is a plan view of the exemplary primary scale member shown in FIGS. 39-45, including an exemplary primary scale modulation pattern usable in conjunction with the receiver and transmitter electrode configurations shown in FIGS. 46 and 47.

FIG. 48 is a plan view of the primary scale member 1249 carrying the TYPE A primary scale modulation pattern 1240, which includes a single modulator region 12PM-1 In various exemplary embodiments, the primary scale member 1249 comprises a molded dielectric member and the single modulator region 12PM-1 comprises a signal-balanced shield electrode comprising a conductive plate formed on, bonded to, or molded into the primary scale member 1249. The incorporated '772 Application describes signal-balanced shield electrode design and operation in detail.

In the embodiment shown in FIG. 48, the primary scale 1249 includes a central keyway portion 1246 that has an outer radius $r_1$ relative to the center of rotation 1205. The radius $r_1$ is selected to provide a slight clearance through the central through holes in the receiver and transmitter electrode members, as it extends through them along the direction of the z-axis in a collar-like fashion. The central keyway portion 1246 mates with a corresponding keyway of shaft coupling, as previously described for the multiturn capacitive encoder 1000. The primary scale member 1249 also includes an outer flange portion 1245 that carries the modulator region 12PM-1. The outer diameter 1248 of the outer flange portion 1245 has a center 1247 which is offset from the center of rotation 1205 by an offset 1206 that is sufficient for providing a proper clearance and "wobble" for the proper operation of the cycloid gear system 1290, as previously described for the cycloid gear system 1090 of the multiturn capacitive encoder 1000. The outer diameter 1248 is just slightly less than the inner diameter of the secondary scale member 1289, such that one may turn freely within the other, yet with a sufficiently close fit that the cycloid gear system of the multiturn capacitive encoder 1200 operates with a desired precision. The radius $r_2$ is chosen such the outer flange is wide enough to accommodate the desired layout and spacing for the various operational electrodes and modulator of the TYPE A primary scale track.

Figure 49:
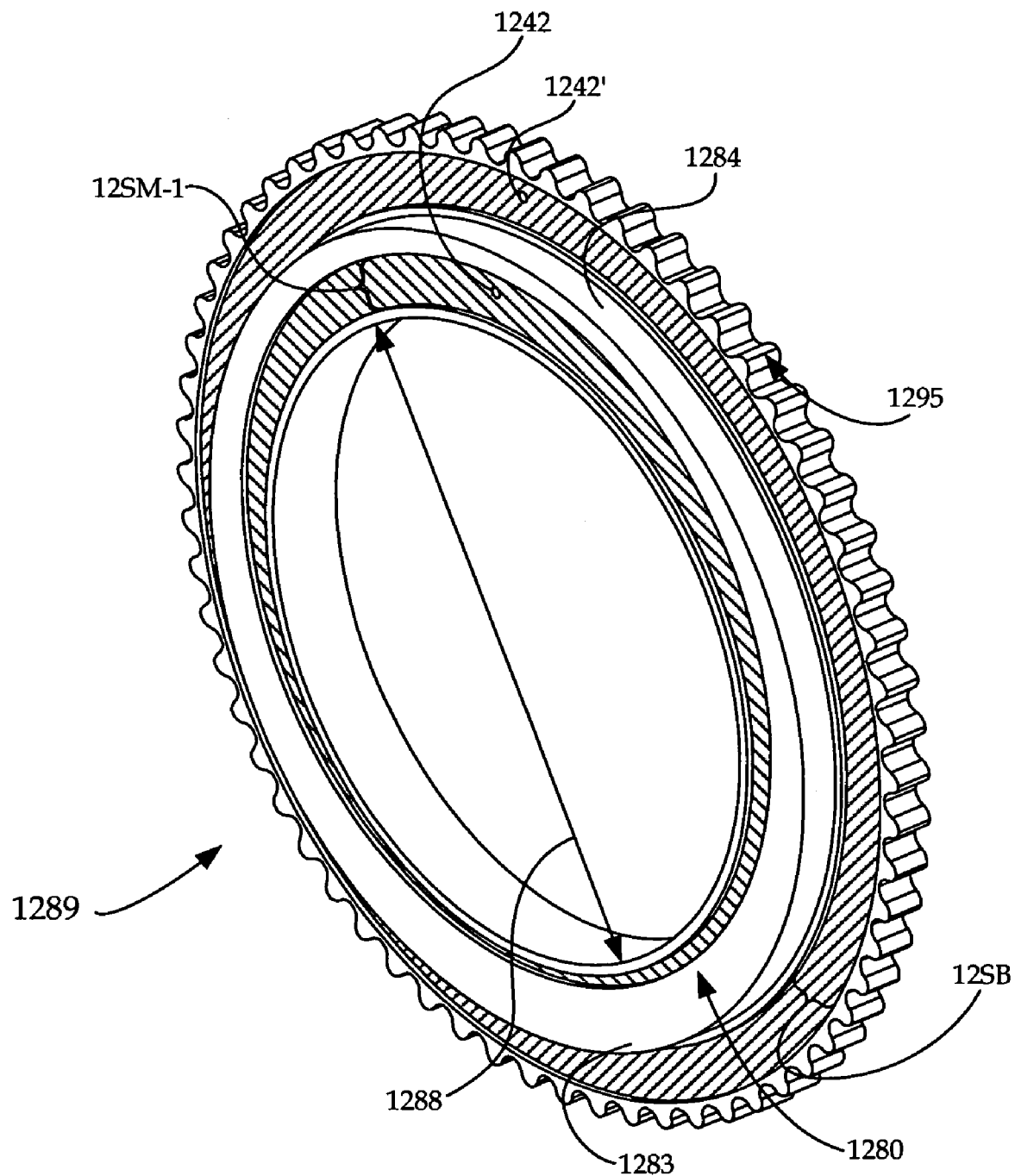
FIG. 49 is an isometric view of the exemplary secondary scale member shown in FIGS. 39-45.
Figure 50:
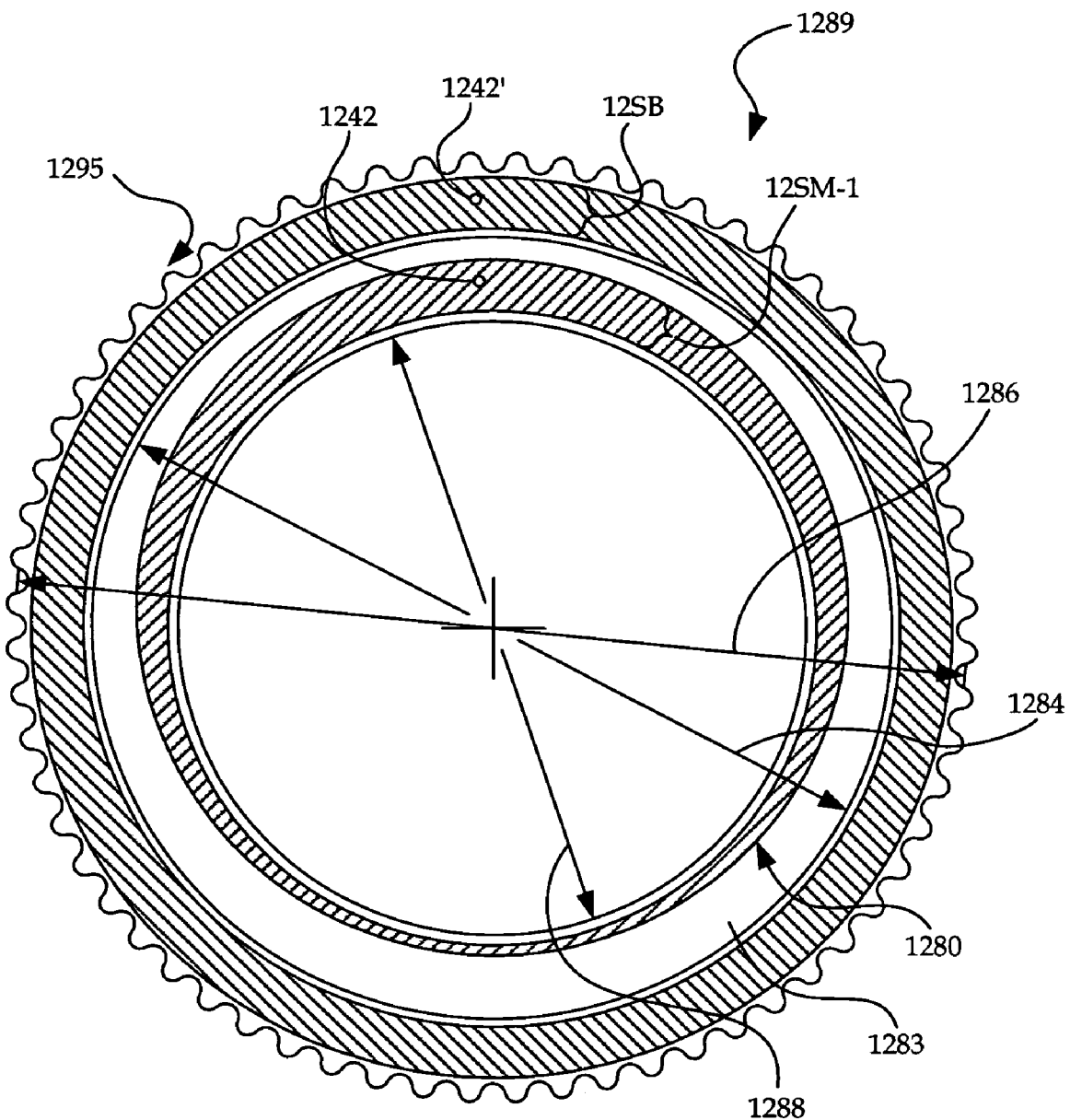
FIG. 50 is a plan view of a first side of the exemplary secondary scale member shown in FIG. 49, including an exemplary secondary scale modulation pattern, and a bridge electrode, usable in conjunction with the receiver and transmitter electrode configurations shown in FIGS. 46 and 47.
Figure 51:
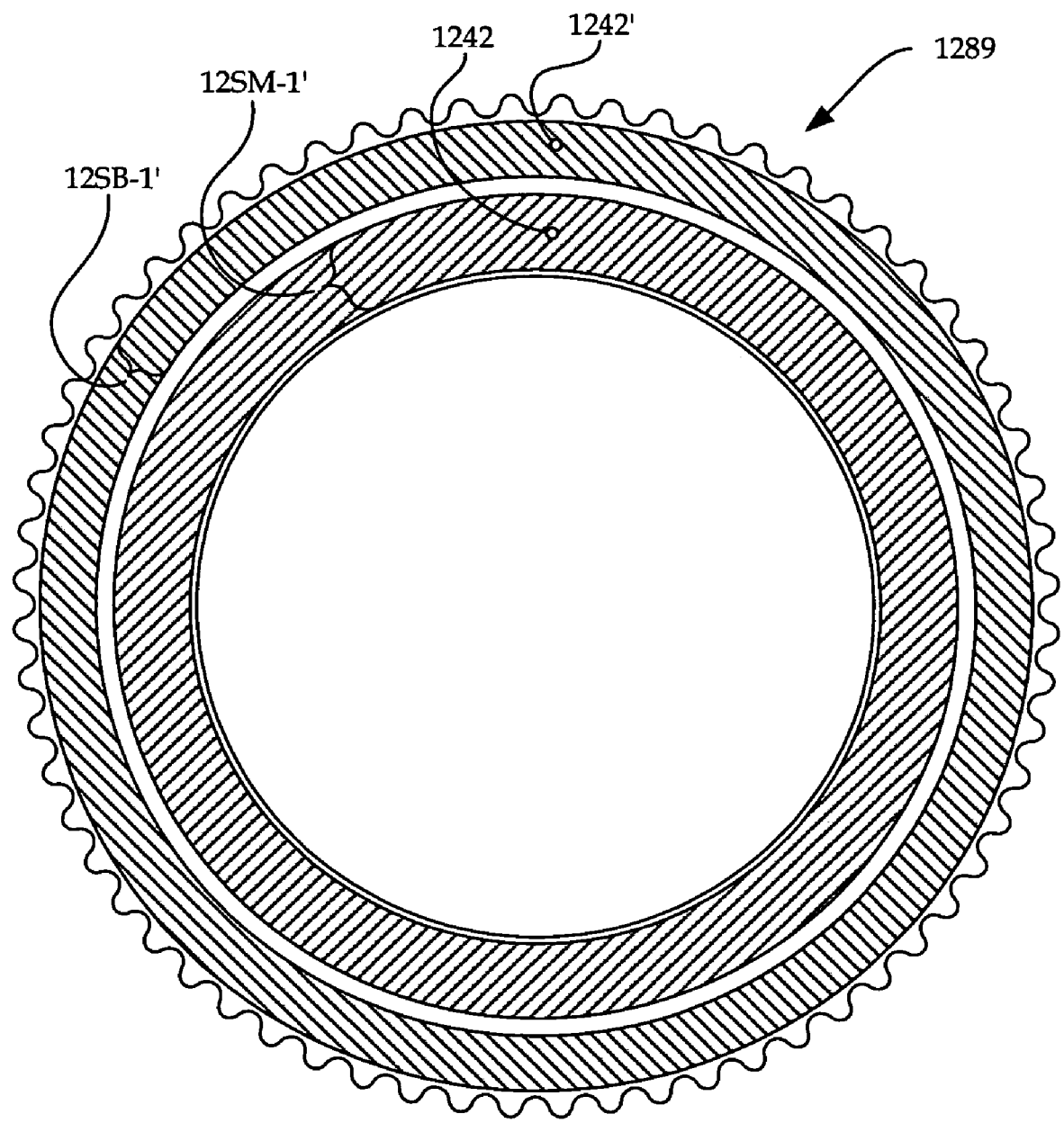
FIG. 51 is a plan view of a second side of the exemplary secondary scale member shown in FIG. 51, including two bridge electrodes.

FIGS. 49–51 show an isometric view, a first-side plan view, and a second-side plan view of the secondary scale member 1289, carrying the secondary scale modulator pattern 1280, and a non-modulating bridge electrode arrangement. FIG. 49 shows an inner diameter 1288, a raised shoulder portion 1283 carrying the. secondary scale modulation pattern 1280 including a single modulation region 12SM-1, a first bridge electrode plate 12SB of the non-modulating bridge electrode arrangement, gear teeth 1295, and conductive feedthrough 1242 and 1242'. FIG. 50 is a plan view of a first side of the secondary scale member shown in FIG. 49, which also identifies the outer diameter 1284 of the shoulder 1283, and the nominal outer diameter 1286 of the secondary scale member 1289. FIG. 51 is a plan view of the second side of the secondary scale member 1289, including a bridge electrode 12SM-1' connected to the modulation region 12SM-1 by the conductive feedthrough 1242, and a non-modulating bridge electrode 12SB' connected to the non-modulating bridge electrode 12SB by the conductive feedthrough 1242'.

Figure 52:
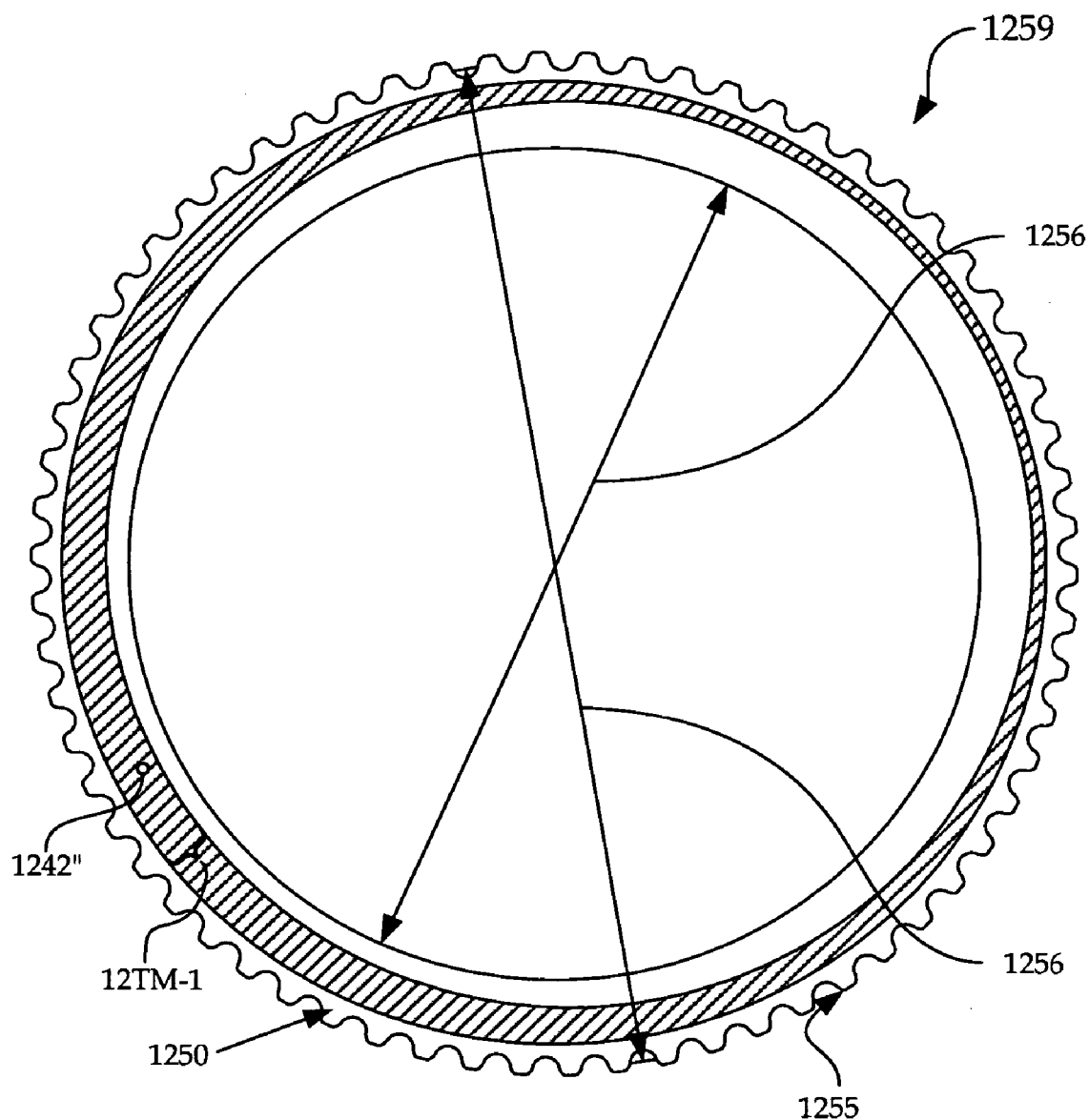
FIG. 52 is a plan view of a first side of the exemplary tertiary scale member shown in FIGS. 39-45, including an exemplary tertiary scale modulation pattern usable in conjunction with the receiver and transmitter electrode configurations shown in FIGS. 46 and 47.
Figure 53:
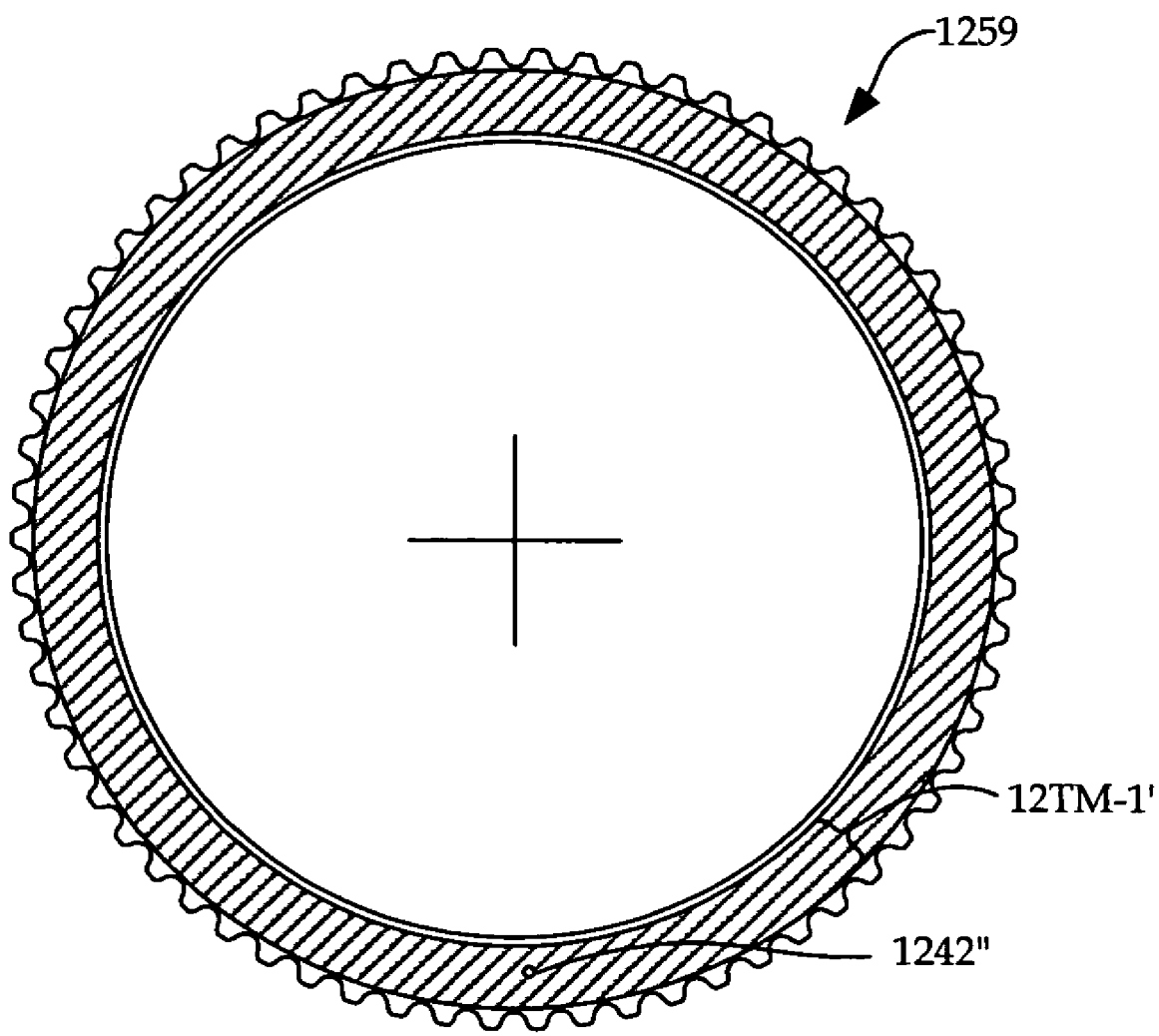
FIG. 53 is a plan view of the second side of the exemplary secondary scale member shown in FIG. 52, including a bridge electrode.

FIGS. 52 and 53 show a first-side plan view and a second-side plan view, respectively, of the tertiary scale member 1259. FIG. 52 shows an inner diameter 1258, the tertiary scale modulation pattern 1250 including a single modulation region 12TM-1, gear teeth 1255, conductive feedthrough 1242", and the nominal outer diameter 1256 of the tertiary scale member 1259. FIG. 53 shows a non-modulating bridge electrode 12TM-1' connected to the modulation region 12TM-1 by the conductive feedthrough 1242".

In operation, the TYPE A primary scale track, including the primary scale modulation pattern 1240 and approximately coinciding with the extents of the outer flange 1245 provides for angular position measurement within a single turn, and the TYPE C secondary scale track, including the secondary scale modulation pattern 1280 and approximately coinciding with the extents of the shoulder 1283 of the secondary scale member 1289 provides for an angular position measurement that is used to indicate or count multiple turns of the multi-turn capacitive encoder 1200. Due to the 64:66 cycloid gear ratio of the secondary scale member 1289, it takes 32 primary turns to provide one revolution of the secondary scale member 1289. In addition, the TYPE C tertiary scale track, including the tertiary scale modulation pattern 1250 and approximately coinciding with the extents of the tertiary scale member 1259, is captured concentrically on the shoulder 1283 and therefore precisely follows the cycloid motion of the secondary scale member 1289. The non-modulating bridge electrode arrangement 12SB-12SB' of the secondary scale member 1289 strongly couples the bridge electrode 12TM-1' to the receiver electrode 12TR-1 to strengthen the capacitive coupling of the tertiary scale track measuring signal. Due to the 66:68 cycloid gear ratio of the tertiary scale member 1259, it takes 33 primary turns to provide one revolution of the tertiary scale member 1259. This means that the phase difference between the output signal of the secondary scale track in the output signal of the tertiary scale track increases by $\frac{1}{33}^{rd}$ of a "phase-difference" cycle for each 32 turns of the primary scale member 1249. Thus, the period of one complete phase-difference cycle is 32*33=1056 primary scale turns. Of course, this entire theoretical turn-counting range cannot be realized in practice due to various mechanical and electronic measuring errors. By analogy to the discussion of FIG. 38, the phase-difference measurement must be accurate enough to identify the correct cycle of the secondary scale measurement within approximately +/−⅜ of a cycle, which is +/−⅜*360°, or +/−135° for the secondary scale track. This is not a very demanding measurement requirement. Thus, is clear that by determining the phase difference between the secondary and tertiary scale track measurement signals, the turn counting range of a multiturn capacitive encoder 1200, can be extended to at least several times that of the multiturn capacitive encoder 1000. The actual accuracy and reliability of the phase-difference signal can be determined experimentally, in order to determine the total number of turns that can be practically and reliably a multiturn capacitive encoder 1200.

Regarding the mechanical operation of the cycloidal gear system 1290, the desired rotary actuation of the secondary scale member 1289 and the tertiary scale member 1259 will be understood based on the previous description of the cycloidal gear system 1090 of the multiturn capacitive encoder 1000. As previously described, outer diameter 1248 of the primary scale member 1249 has a center 1247 which is offset from the center of rotation 1205 by an offset 1206 that is sufficient for providing a "wobble" of the secondary scale member 1289, and the "shoulder-captured" tertiary scale member 1259, that insures the desired cycloidal clearance gaps 1294 and 1274, for the proper operation of the cycloid gear system 1290.

In one exemplary embodiment, the primary scale member outer diameter 1248 has a diameter of approximately 31.75 mm, which is made slightly less than the inner diameters 1288 of the secondary scale 1289, which has a dimension that may be, for example, approximately 31.85 mm, such that one may turn freely within the other, yet with a sufficiently close fit that the cycloid gear system of the multiturn capacitive encoder 1200 operates without excessive play or backlash. The outer diameter of the primary scale member shoulder 1283, may be any diameter that accommodates the dimensions of the secondary scale modulation pattern 1280, and is made slightly less than the inner diameter 1258 of the tertiary scale member 1259, which has a dimension that may be, for example, approximately 0.1 mm larger in diameter, such that it may turn freely on the shoulder, yet with a sufficiently close fit that the cycloid gear system of the multiturn capacitive encoder 1200 operates without excessive play or backlash. The center 1247 of the outer diameter 1248 is offset from the center of rotation 1205 by approximately 0.75 mm. With this amount of offset, as the primary scale member 1249 rotates it causes the center of the secondary scale member 1289 to follow a circle having a 0.75 mm radius. In this exemplary embodiment, this is the amount of "side to side" radial wobble that provides the required cycloidal gear engagement and the cycloidal clearance gap 1294 on opposite sides of the secondary scale 1289 during operation of the cycloid gear assembly 1290.

The nominal outer diameters 1286 and 1256 of the secondary and tertiary scale members may be conveniently made the same, although this is not a requirement, and they may be any diameter that accommodates the dimensions of the tertiary scale modulation pattern 1250. The gear teeth of the secondary and tertiary outer cycloid gear members 1299 and 1279 are arranged along nominal diameters 1296 and 1276 that are approximately 1.5 mm larger than the nominal diameters 1286 and 1256 of the secondary and tertiary scale members. Accordingly, in this exemplary embodiment the gear teeth of the cycloid gear assembly 1290 may have a peak to valley height of approximately 0.75 mm, which leaves a maximum clearance of approximately 0.75 mm between the peaks of the gear teeth 1285 and 1295 in the cycloidal clearance gap 1294. The approximate dimensional guidelines may require slight adjustments due to various molding or machining tolerances or other factors. Such adjustments may be determined by specific analysis or experiment.

Figure 54:
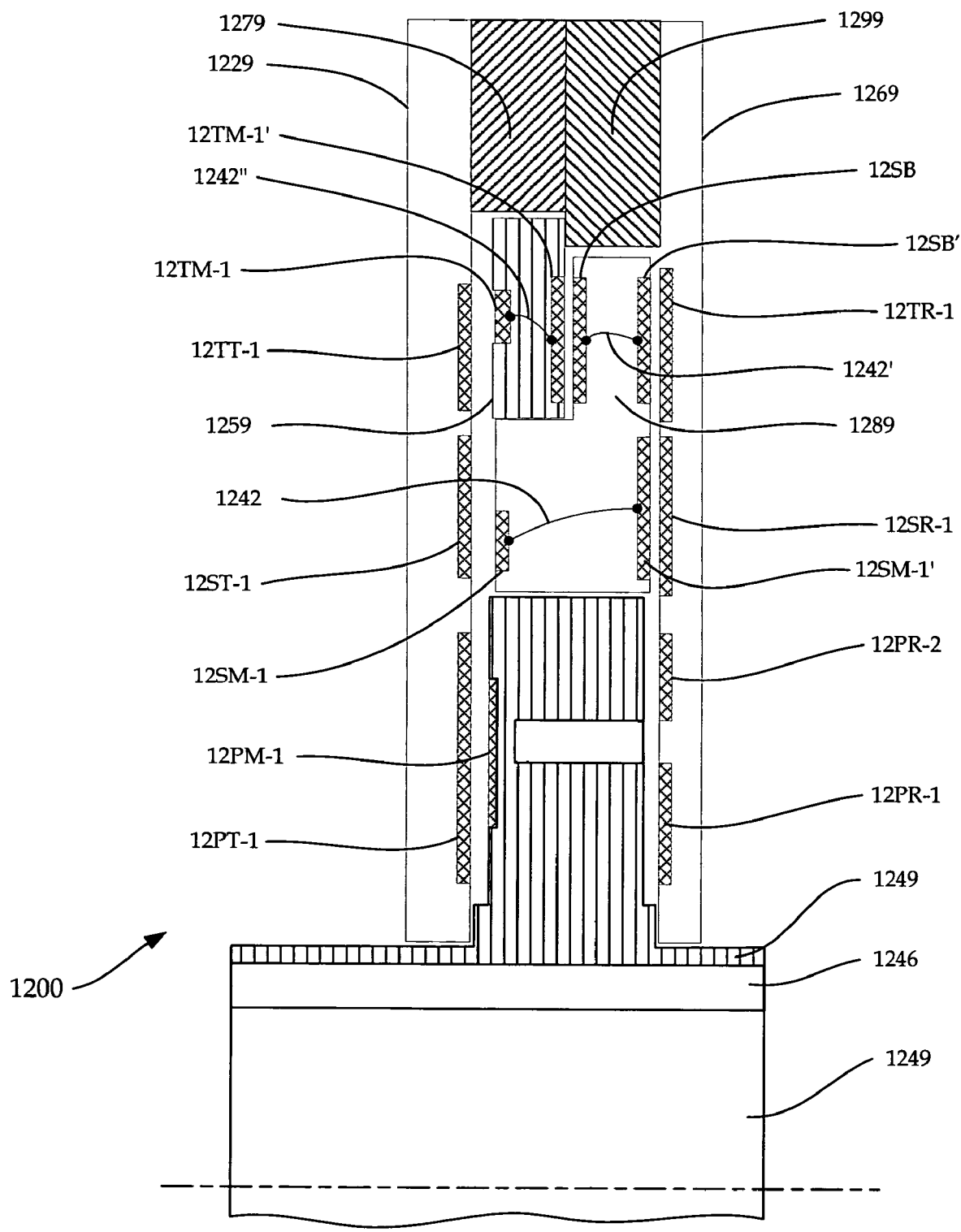
FIG. 54 is a cross-section view illustrating a portion of the first exemplary embodiment of a multi-turn capacitive encoder.

FIG. 54 illustrates a cross-section of the multi-turn capacitive encoder 1200, which further clarifies its assembly and implicitly shows one exemplary embodiment of the approximate aspect ratios of various parts and capacitive signal gaps. The design and function of the various parts will be understood by reference to their previous descriptions. It should be appreciated the electrical connections between the various bridge electrodes, that is, 1242-1242", are shown schematically.

Figure 55:
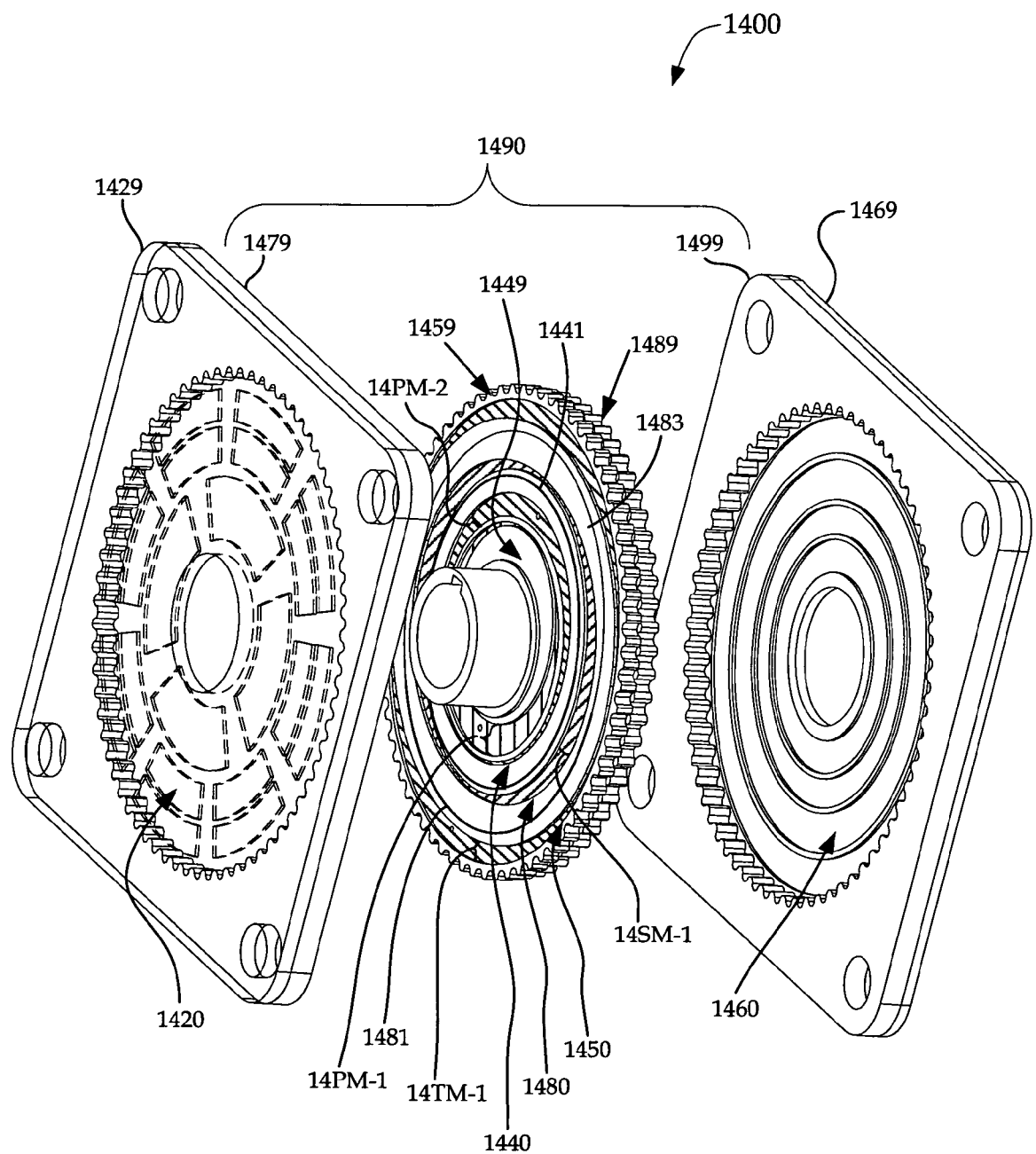
FIG. 55 is an exploded isometric view illustrating a third exemplary embodiment of a multi-turn capacitive encoder, including a receiver electrode member in transparent outline.

FIG. 55 is an isometric view of a third exemplary embodiment of a multi-turn capacitive encoder 1400 according to this invention. As shown in FIG. 55, the multi-turn capacitive encoder 1400 includes a transmitter electrode configuration 1420 carried on the interior side of a transmitter electrode member 1429 (shown in transparent outline), a tertiary scale modulation pattern 1450 having a single portion 14TM-1 carried on a tertiary scale member 1459, a primary scale modulation pattern 1440 having two portions 14PM-1 and 14PM-2 that is carried on a primary scale member 1449, a secondary scale modulation pattern 1480 having a single portion 14SM-1 carried on a secondary scale member 1489, and a receiver electrode configuration 1460 carried on the interior side of a receiver electrode member 1469. FIG. 55 also shows a tertiary outer cycloid gear member 1479, also referred to as the tertiary outer gear member 1479, and a secondary outer cycloid gear member 1499, also referred to as the secondary outer gear member 1499. The primary scale member 1449, the secondary scale member 1489, the tertiary scale member 1459 and the secondary and tertiary outer cycloid gear members 1499 and 1479, all together, form a cycloid gear assembly 1490. The primary scale member 1449 of the cycloid gear assembly 1490 rotates at the same rate as the input shaft that drives the encoder, while the secondary scale member 1489 and the tertiary scale member 1459 rotate at a much slower rate determined by the gear characteristics of the cycloid gear assembly 1490, as previously described with reference to the corresponding components of the multiturn capacitive encoder 1200.

The arrangement of coordinate axes, including the circular measuring axis 80, described with reference to FIG. 1, will be understood to apply, in a similar orientation, to the multiturn capacitive encoder 1400. The inner ring of four transmitter electrodes of the transmitter electrode configuration 1420 is nominally aligned with the primary scale modulation pattern 1440 and an inner pair of circular differential receiver electrodes 14PR-1 and 14PR-2 (shown in FIG. 56) to form and/or coincide with an inner modulation track, or primary scale track. The primary scale track is TYPE D track, and is designed and operated as such. Similarly, the middle ring of eight transmitter electrodes of the transmitter electrode configuration 1420 is nominally aligned with the secondary scale modulation pattern 1440 and a middle circular receiver electrode 14SR-1 of the receiver electrode configuration 1460 (shown in FIG. 56) to form and/or coincide with a middle or secondary scale track. The secondary scale track is TYPE E track, and is designed and operated as such. Similarly, the outer ring of eight transmitter electrodes of the transmitter electrode configuration 1420 is nominally aligned with the tertiary scale modulation pattern 1450 and an outer circular receiver electrode 14TR-1 of the receiver electrode configuration 1460 (shown in FIG. 56) to form and/or coincide with an outer or tertiary scale track. The tertiary scale track is TYPE E track, and is designed and operated as such. The tertiary scale track also includes a non-modulating bridge electrode arrangement carried on the secondary scale member 1489, as described further below. Of course, the various electrode dimensions of the multiturn capacitive encoder 1400 should be designed with wobble taken into considerations, as previously discussed with reference to FIG. 36.

The secondary outer cycloid gear member 1499 has 66 internal cogs or gear teeth, and the secondary scale member 1489 has 64 external cogs or gear teeth. In operation, the internal and external cogs are aligned in the same plane and mesh with each other in a conventional cycloidal gear reduction fashion when the secondary scale member 1489 is driven by the primary scale member 1449. The tertiary outer cycloid gear member 1479 has 68 internal cogs or gear teeth, and the tertiary scale member 1459 has 66 external cogs or gear teeth. In operation, the internal and external cogs are aligned in the same plane and mesh with each other in a conventional cycloidal gear reduction fashion when the tertiary scale member 1489 is driven by the shoulder 1483 of the secondary scale member 1489. The primary scale member 1449 is aligned in the same plane with the secondary and tertiary scale members 1489 and 1459, and has an outer diameter 1448 that is eccentric with respect to a nominal center of rotation of the primary scale member 1449. The eccentric outer diameter 1448 closely fits an inner diameter 1488 of the secondary scale member 1489. Similarly, the outer diameter 1484 of the shoulder 1483, which is concentric with the center of the secondary scale member 1489, closely fits an inner diameter 1458 of the tertiary scale member 1459, such that the tertiary scale member 1459 is carried along with the secondary scale member 1489, but is free to rotate about the shoulder 1483. Thus, when the rotation of a drive shaft is coupled by a shaft coupling (not shown) to the primary scale member 1449, it drives the entire cycloid gear assembly 1490.

Figure 56:
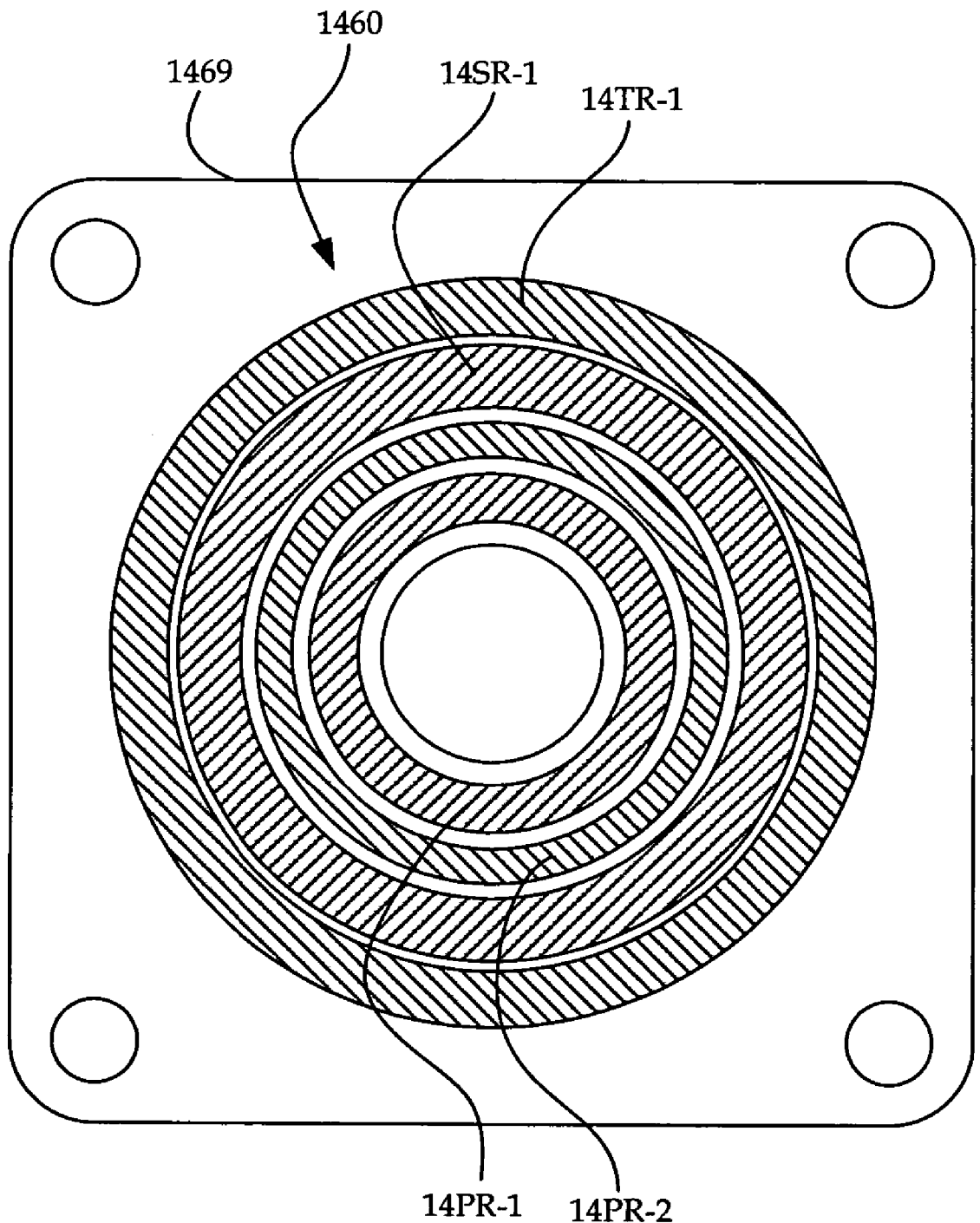
FIG. 56 is a plan view of an exemplary receiver electrode configuration usable in the multi-turn capacitive encoder shown in FIG. 55.

FIG. 56 is a plan view of the receiver electrode member 1469 carrying the receiver electrode pattern 1460. In various exemplary embodiments, the receiver electrode member 1469 comprises a printed circuit board, and the various receiver electrodes comprise plated areas on the print circuit board. The receiver electrode pattern 1460 includes the TYPE D differential pair of receiver electrodes 14PR-1 and 14PR-2 of the primary track. The receiver electrode pattern 1460 also includes the TYPE E receiver electrode 14SR-1 of the secondary track, and the TYPE E receiver electrode 14TR-1 of the tertiary track.

Figure 57:
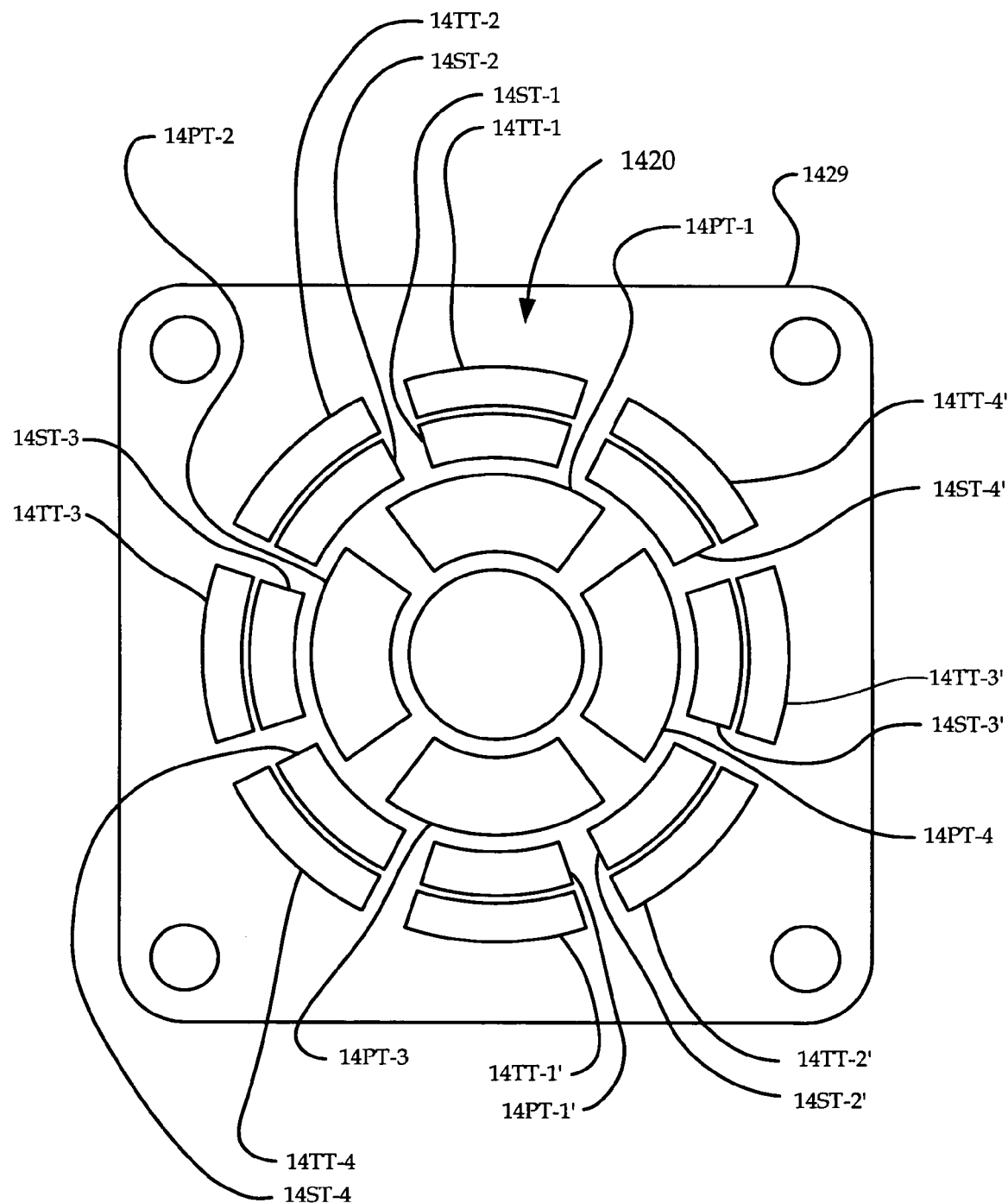
FIG. 57 is a plan view of an exemplary transmitter electrode configuration usable in conjunction with the receiver electrode configuration shown in FIG. 56.

FIG. 57 is a plan view of the transmitter electrode member 1429 carrying the transmitter electrode pattern 1420. In various exemplary embodiments, the transmitter electrode member 1429 comprises a printed circuit board, and the various transmitter electrodes comprise plated areas on the print circuit board. The transmitter electrode pattern 1420 includes the TYPE D set of transmitter electrodes 14PT-1 through 14PT-4 of the primary track, which are connected to input 4 sinusoidal AC signals, having nominally identical amplitudes and relative phases of 0°, and 80°, 180°, and 270°. The transmitter electrode pattern 1420 also includes the TYPE E transmitter electrodes 14ST-1 through 14ST-4 and 14ST-1' through 14ST-4' of the secondary track, which are also connected to input 4 sinusoidal AC signals, having nominally identical amplitudes and relative phases of 0°, and 80°, 180°, and 270°, in a manner previously described with reference to their counterparts in the TYPE E track description of FIGS. 21-25. The transmitter electrode pattern 1420 also includes the TYPE E transmitter electrodes 14TT-1 through 14TT-4 and 14TT-1' through 14TT-4' of the tertiary track, which are also connected to input 4 sinusoidal AC signals, having nominally identical amplitudes and relative phases of 0°, and 80°, 180°, and 270°, in a manner previously described with reference to their counterparts in the TYPE E track description of FIGS. 21-25. To obtain the highest measurement accuracy and best reliability, it is generally advantageous if the set of primary scale transmitter electrodes, the set of secondary scale transmitter electrodes, and the set of tertiary scale transmitter electrodes are energized at different times in order to acquire position measurements at different times from the primary, secondary, and tertiary scale tracks. This minimizes error inducing cross talk between the independent measurement signal channels in a multi-turn capacitive encoder according to this invention. However, for less demanding applications, simultaneous activation may be possible.

Figure 58:
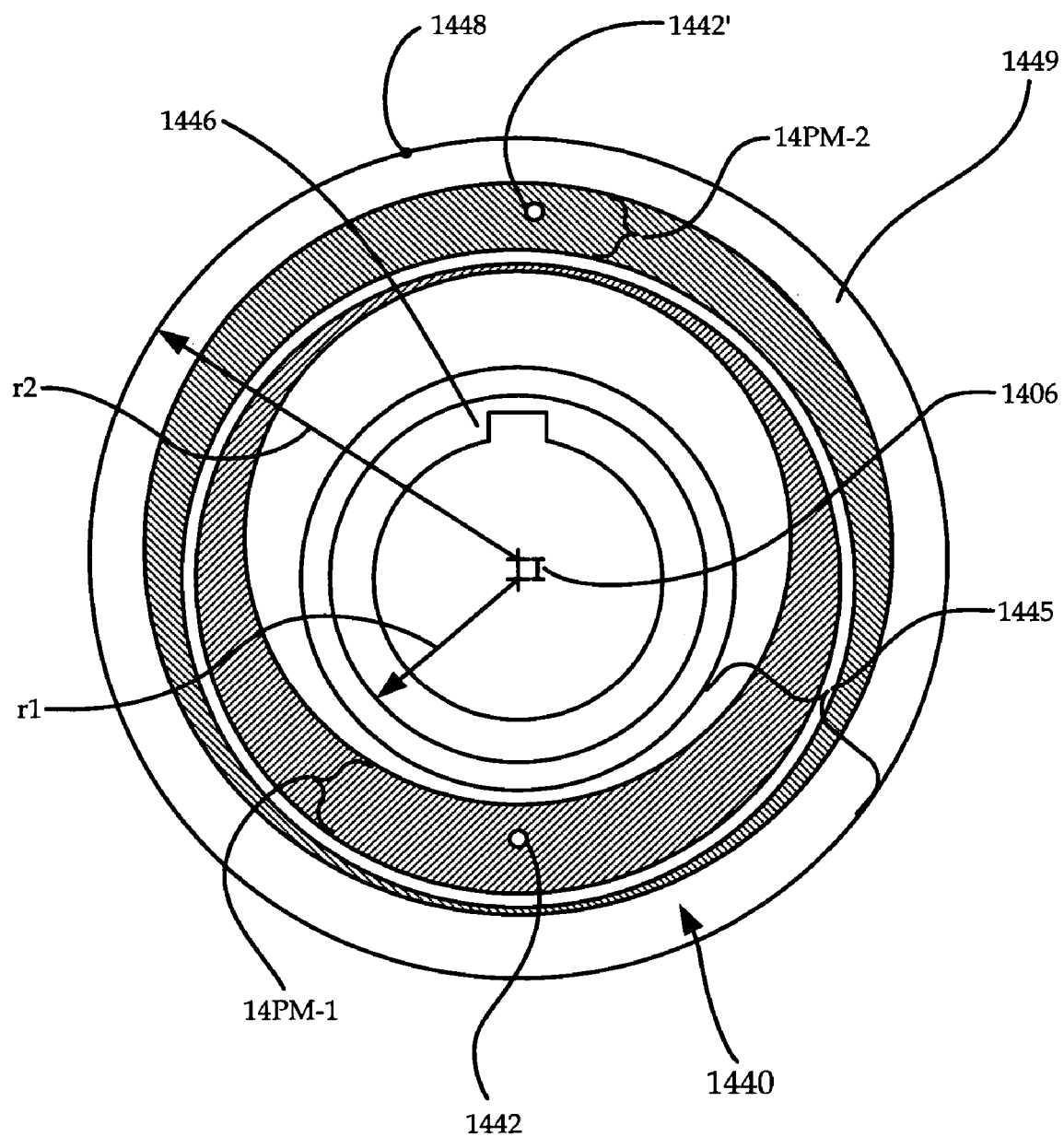
FIG. 58 is a plan view of a first side of the exemplary primary scale member shown in FIG. 55, including an exemplary primary scale modulation pattern usable in conjunction with the receiver and transmitter electrode configurations shown in FIGS. 56 and 57.
Figure 59:
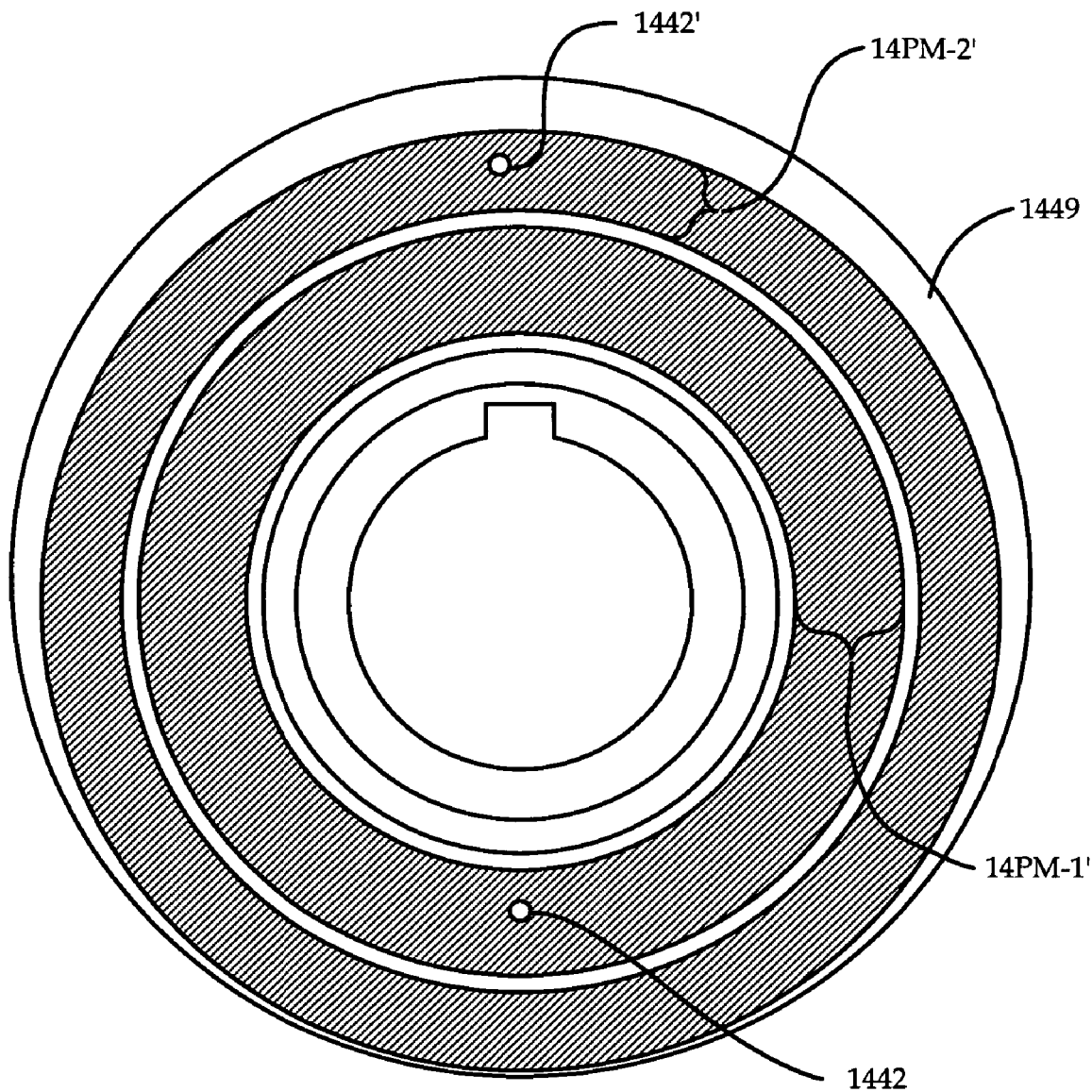
FIG. 59 is a plan view of the second side of the exemplary primary scale member shown in FIG. 58, including two bridge electrodes.

FIGS. 58 and 59 are plan views of first and second sides of the primary scale member 1449. FIG. 58 shows the transmitter-facing side, carrying the TYPE D primary scale modulation pattern 1440, which includes two modulator regions 14PM-1 and 14PM-2. In various exemplary embodiments, the primary scale member 1449 comprises a molded dielectric member and the modulator region 14PM-1 comprises a conductive bridge electrode plate formed on, bonded to, or molded into the primary scale member 1449. The modulator region 14PM-1 includes an electrical connection 1442 that is connected to the bridge electrode 14PM-1', shown in FIG. 59. The modulator region 14PM-2 also comprises a conductive bridge electrode plate formed on, bonded to, or molded into the primary scale member 1449. The modulator region 14PM-2 includes an electrical connection 1442' that is connected to the bridge electrode 14PM-2', shown in FIG. 59.

In the embodiment shown in FIGS. 58 and 59, the primary scale 1449 includes a central keyway portion 1446 that has an outer radius $r_1$ relative to the center of rotation 1405. The radius $r_1$ is selected to provide a slight clearance through the central through holes in the receiver and transmitter electrode members, as it extends through them along the direction of the z-axis in a collar-like fashion. The central keyway portion 1446 mates with a corresponding keyway of shaft coupling, as previously described for the multiturn capacitive encoder 1000. The primary scale member 1449 also includes an outer flange portion 1445 that carries the modulator region 14PM-1. The outer diameter 1448 of the outer flange portion 1445 has a center 1447 which is offset from the center of rotation 1405 by an offset 1406 that is sufficient for providing a proper clearance and "wobble" for the proper operation of the cycloid gear system 1490, as previously described for the cycloid gear system 1090 of the multiturn capacitive encoder 1000. The outer diameter 1448 is just slightly less than the inner diameter of the secondary scale member 1489, such that one may turn freely within the other, yet with a sufficiently close fit that the cycloid gear system of the multiturn capacitive encoder 1400 operates with a desired precision. The radius $r_2$ is chosen such the outer flange is wide enough to accommodate the desired layout and spacing for the various operational electrodes and modulator of the TYPE D primary scale track.

Figure 60:
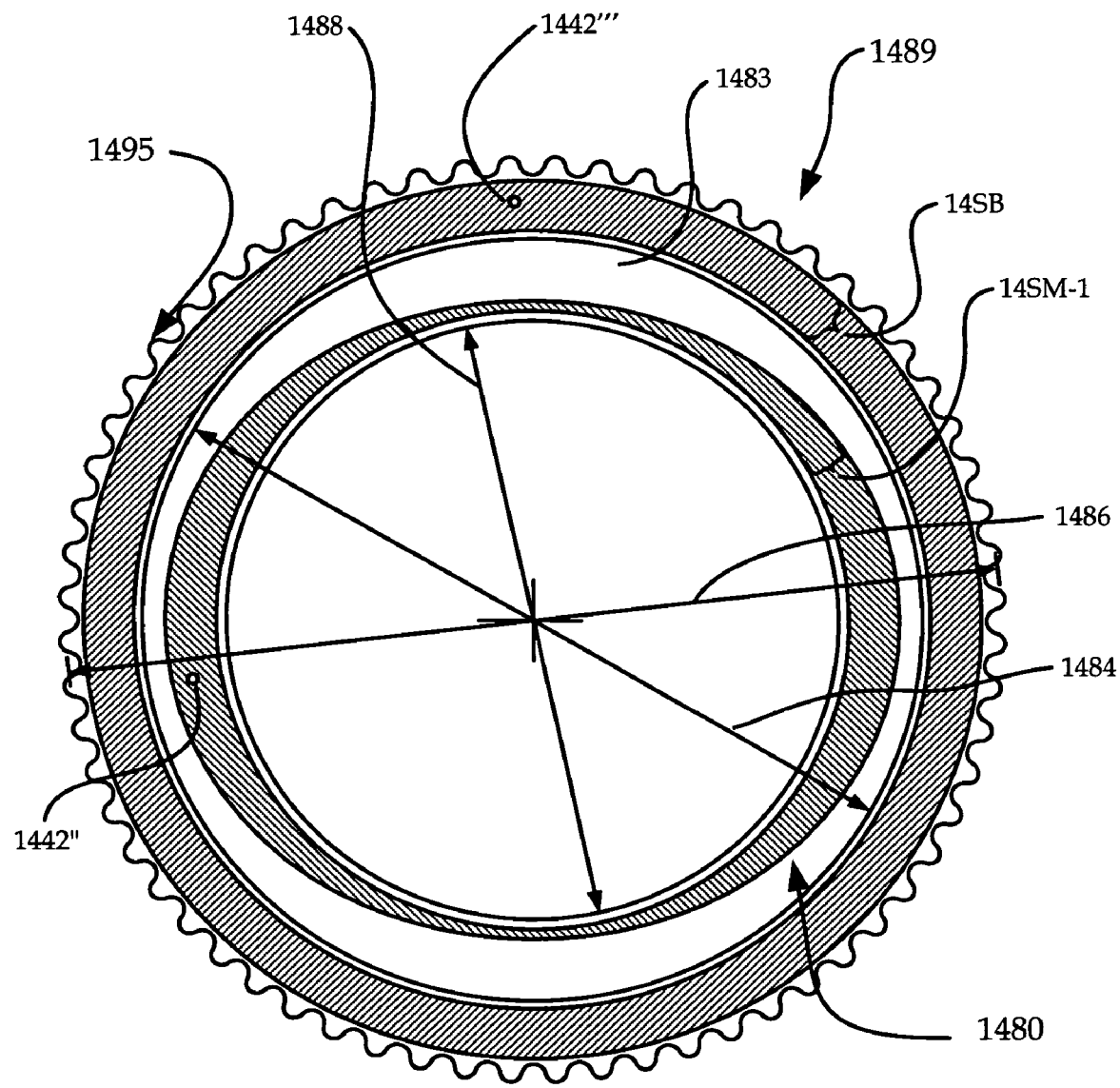
FIG. 60 is a plan view of a first side of the exemplary secondary scale member shown in FIG. 55, including an exemplary secondary scale modulation pattern, and a bridge electrode, usable in conjunction with the receiver and transmitter electrode configurations shown in FIGS. 56 and 57.
Figure 61:
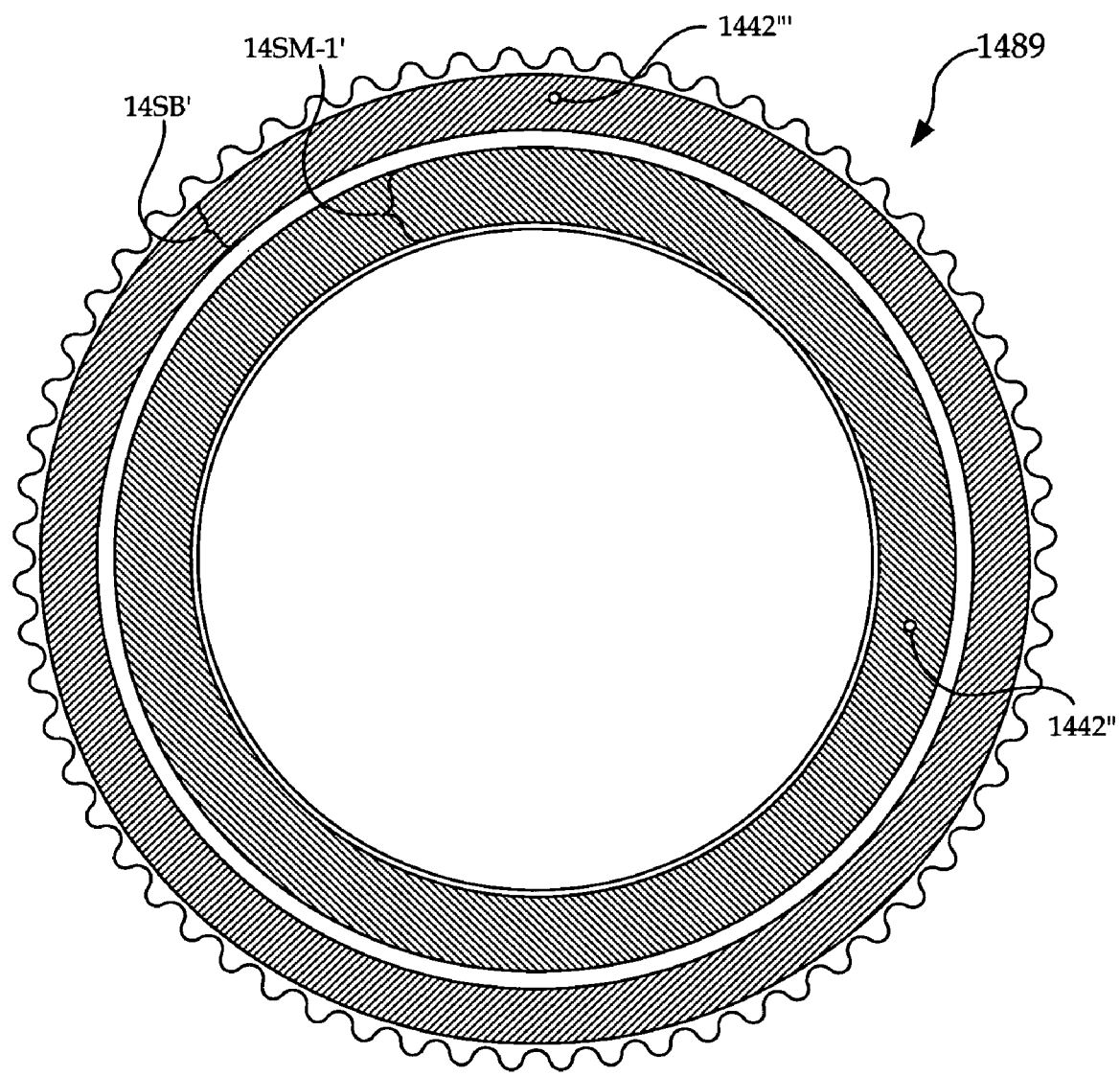
FIG. 61 is a plan view of the second side of the exemplary secondary scale member shown in FIG. 60, including two bridge electrodes.

FIGS. 60 and 61 show a first-side plan view, and a second-side plan view of the secondary scale member 1489, carrying the secondary scale modulator pattern 1480, and a non-modulating bridge electrode arrangement. FIG. 60 shows an inner diameter 1488, a raised shoulder portion 1483 carrying the secondary scale modulation pattern 1480 including a single modulation region 14SM-1, a first bridge electrode plate 14SB of the non-modulating bridge electrode arrangement, gear teeth 1495, and conductive feedthroughs 1442'' and 1442'''. FIG. 60 also identifies the outer diameter 1484 of the shoulder 1483, and the nominal outer diameter 1486 of the secondary scale member 1489. FIG. 61 shows the second side of the secondary scale member 1489, including a bridge electrode 14SM-1' connected to the modulation region 14SM-1 by the conductive feedthrough 1442'', and a non-modulating bridge electrode 14SB' connected to the non-modulating bridge electrode 14SB by the conductive feedthrough 1442'''.

Figure 62:
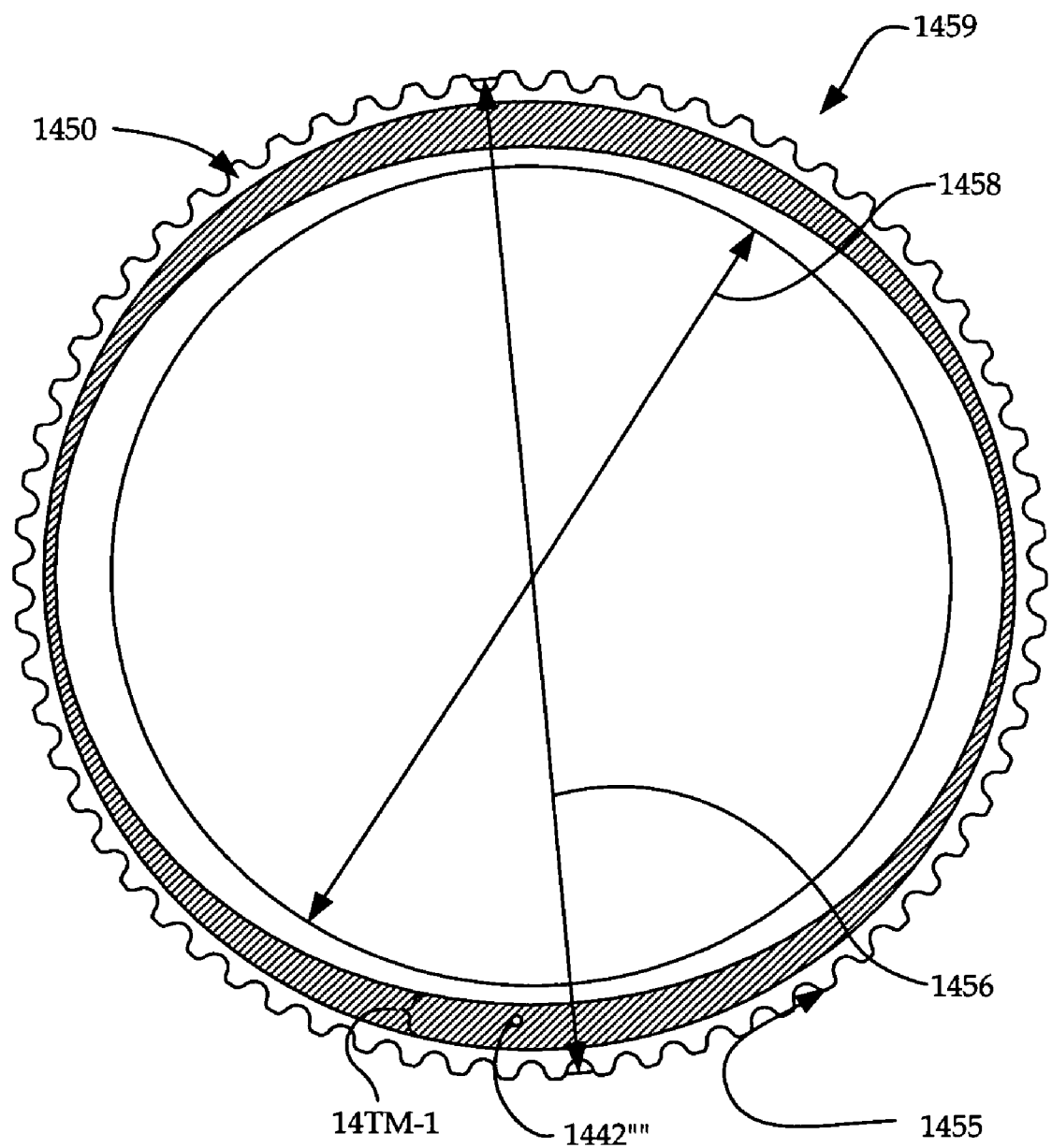
FIG. 62 is a plan view of a first side of the exemplary tertiary scale member shown in FIG. 55, including an exemplary tertiary scale modulation pattern usable in conjunction with the receiver and transmitter electrode configurations shown in FIGS. 56 and 57.
Figure 63:
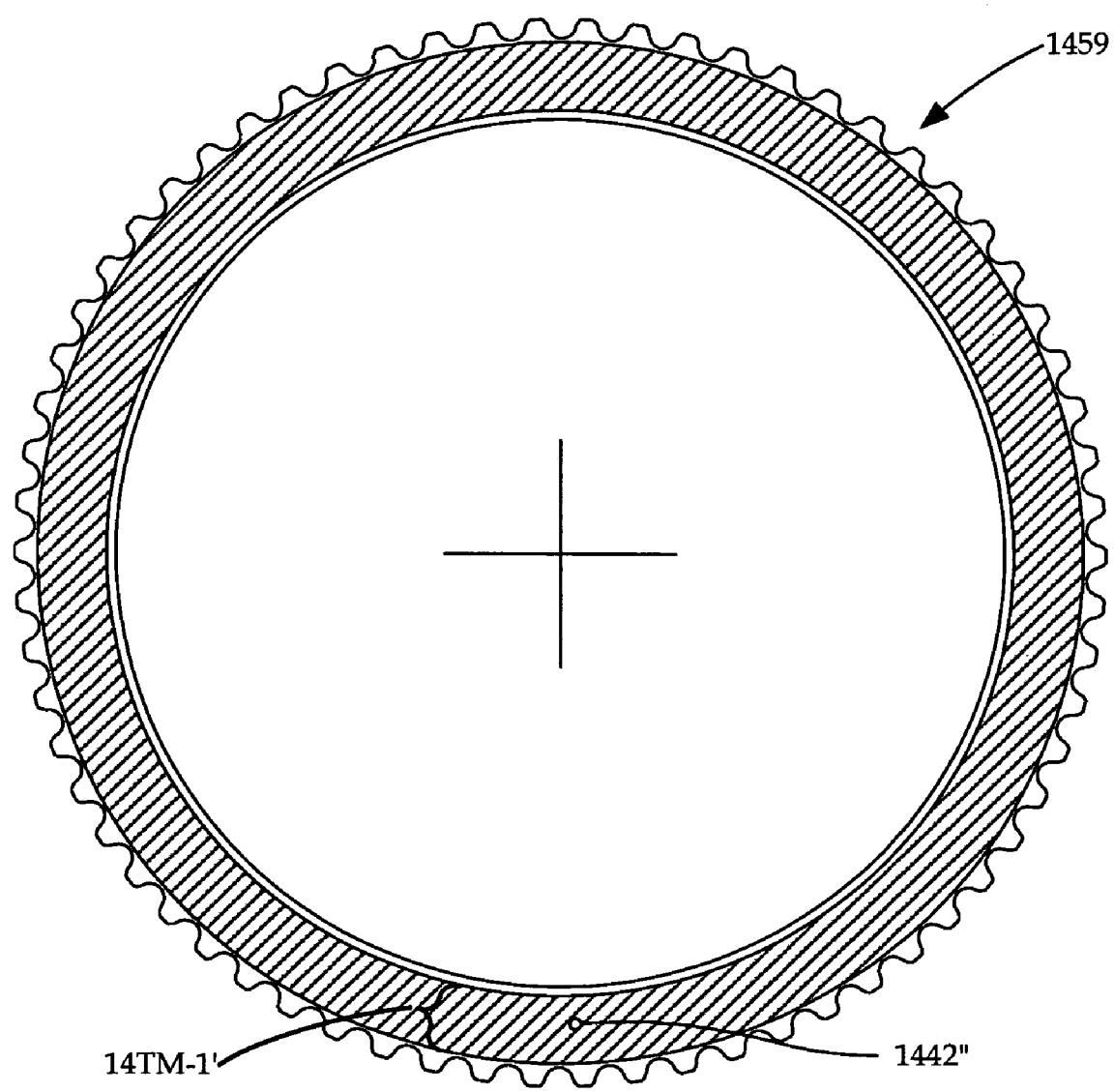
FIG. 63 is a plan view of the second side of the exemplary tertiary scale member shown in FIG. 62, including a bridge electrode.

FIGS. 62 and 63 show a first-side plan view and a second-side plan view, respectively, of the tertiary scale member 1459. FIG. 62 shows an inner diameter 1458, the tertiary scale modulation pattern 1450 including a single modulation region 14TM-1, gear teeth 1455, conductive feedthrough 1442'''', and the nominal outer diameter 1456 of the tertiary scale member 1459. FIG. 63 shows a non-modulating bridge electrode 14TM-1' connected to the modulation region 14TM-1 by the conductive feedthrough 1442"".

Figure 64:
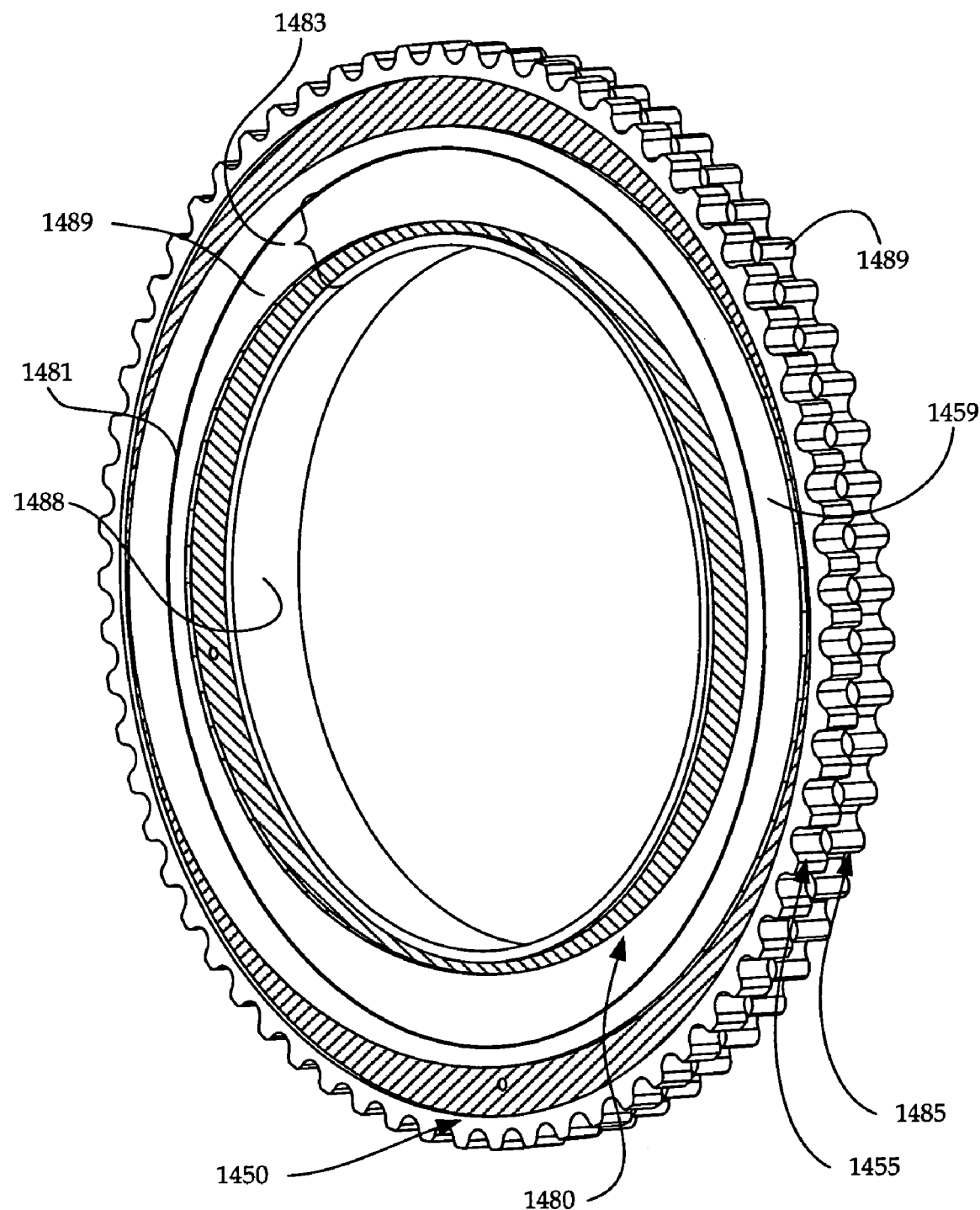
FIG. 64 is an isometric view illustrating the secondary scale member of FIGS. 60 and 61, and the tertiary scale member of FIGS. 62 and 63 in their assembled positions.

FIG. 64 is an isometric view illustrating the tertiary scale member 1459 assembled on the shoulder 1483 of the secondary scale member 1489 in their assembled positions. The members are free to rotate relative to one another at the sliding interface 1481. The other elements shown in FIG. 64 will be understood based on previous descriptions.

In operation, the TYPE D primary scale track, including the primary scale modulation pattern 1440 and approximately coinciding with the extents of the outer flange 1445 provides for angular position measurement within a single turn, and the TYPE E secondary scale track, including the secondary scale modulation pattern 1480 and approximately coinciding with the extents of the shoulder 1483 of the secondary scale member 1489 provides for an angular position measurement that is used to indicate or count multiple turns of the multi-turn capacitive encoder 1400, in cooperation with the tertiary scale track, in a manner analogous to that previously described for the multiturn capacitive encoder 1200. Due to the 64:66 cycloid gear ratio of the secondary scale member 1489, it takes 32 primary turns to provide one revolution of the secondary scale member 1489. In addition, the TYPE E tertiary scale track, including the tertiary scale modulation pattern 1450 and approximately coinciding with the extents of the tertiary scale member 1459, is captured concentrically on the shoulder 1483 and therefore precisely follows the cycloid motion of the secondary scale member 1489. The non-modulating bridge electrode arrangement 14SB-12SB' of the secondary scale member 1489 strongly couples the bridge electrode 14TM-1' to the receiver electrode 14TR-1 to strengthen the capacitive coupling of the tertiary scale track measuring signal. Due to the 66:68 cycloid gear ratio of the tertiary scale member 1459, it takes 33 primary turns to provide one revolution of the tertiary scale member 1459. Each of the secondary and tertiary scale tracks provides two measurement signal cycles per revolution. This means that the phase difference between the output signal of the secondary scale track in the output signal of the tertiary scale track increases by $\frac{1}{33}^{rd}$ of a "phase-difference" cycle for each 16 turns of the primary scale member 1449. Thus, the period of one complete phase-difference cycle is 16*33=528 primary scale turns. Of course, this entire theoretical turn-counting range cannot be realized in practice due to various mechanical and electronic measuring errors. By analogy to the discussion of FIG. 38, the phase-difference measurement must be accurate enough to identify the correct cycle of the secondary scale measurement within approximately +/-⅜ of a cycle, which is +/-⅜*180°, or +/-67.5° for the secondary scale track. This is not a very demanding measurement requirement. Thus, is clear that by determining the phase difference between the secondary and tertiary scale track measurement signals, the turn counting range of a multiturn capacitive encoder 1400, can be extended to at least several times that of the multiturn capacitive encoder 1000. The actual accuracy and reliability of the phase-difference signal can be determined experimentally, in order to determine the total number of turns that can be practically and reliably a multiturn capacitive encoder 1400.

One advantage of the multiturn capacitive encoder 1400 over the multiturn capacitive encoder 1200 is that each of the primary, secondary and tertiary scale tracks use modulation patterns that include bilateral symmetry (or in the case of the primary scale modulation pattern, nearly bilateral symmetry.) This feature the patterns significantly enhances the accuracy and reliability of the measuring signals that they provide, since any wobble or deviation tends provide self-compensating signal changes from the opposite portions of the symmetric modulation pattern.

Regarding the mechanical operation of the cycloidal gear system 1490, the desired rotary actuation of the secondary scale member 1489 and the tertiary scale member 1459 will be understood based on the previous description of the cycloidal gear system 1290 of the multiturn capacitive encoder 1200. All of the various exemplary dimensions may be the same as those previously described for their counterparts in the multiturn capacitive encoder 1200. The approximate dimensional guidelines described there may require slight adjustments due to various molding or machining tolerances or other factors. Such adjustments may be determined by specific analysis or experiment for the multiturn capacitive encoder 1400.

Figure 65:
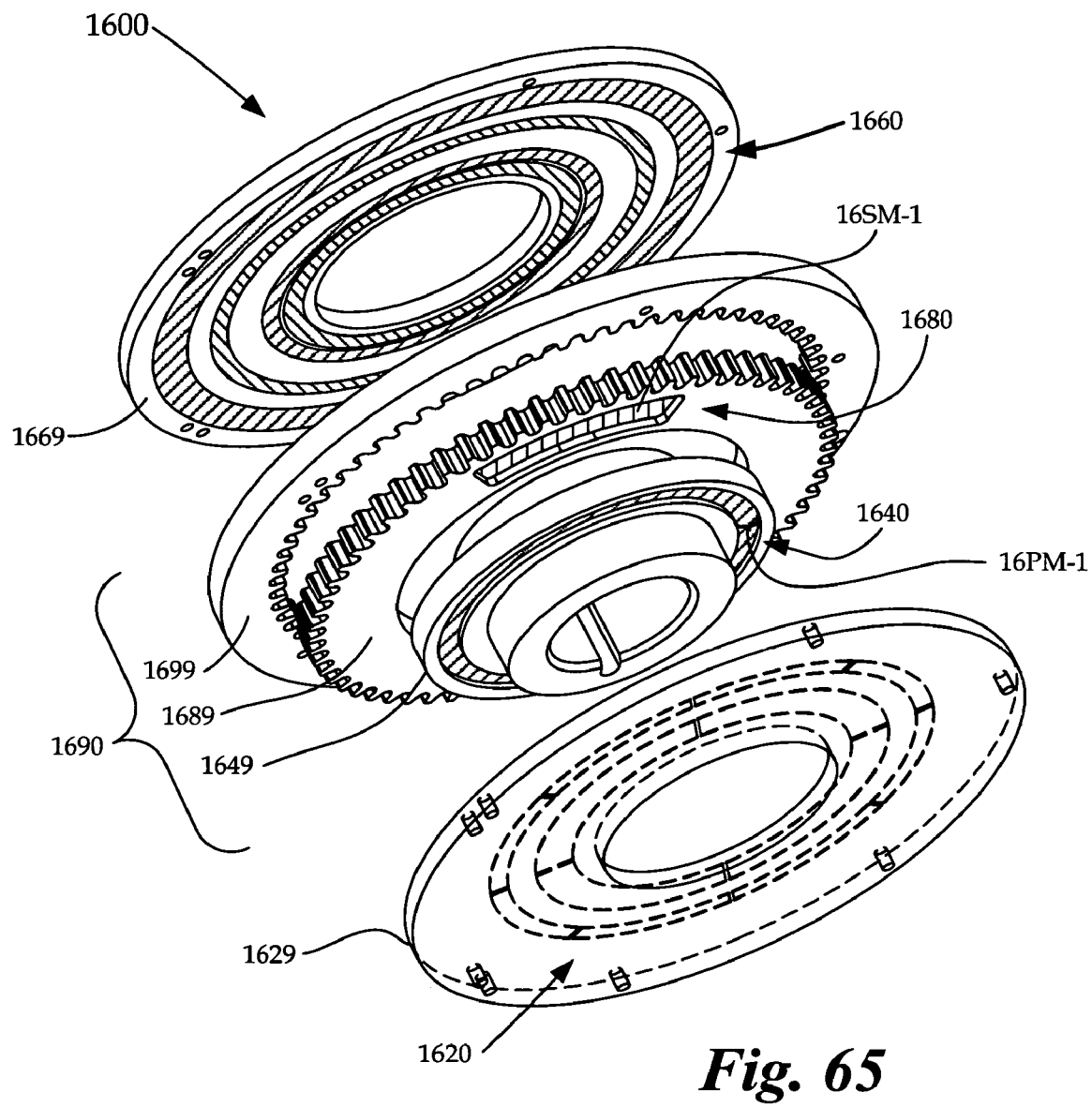
FIG. 65 is a partially exploded isometric view illustrating a fourth exemplary embodiment of a multi-turn capacitive encoder, including a transmitter electrode member in transparent outline.

FIG. 65 is an isometric view of a fourth exemplary embodiment of a multi-turn capacitive encoder 1600 according to this invention. As shown in FIG. 65, the multi-turn capacitive encoder 1600 includes a transmitter electrode configuration 1620 carried on the interior side of a transmitter electrode member 1629 (shown in transparent outline), a primary scale modulation pattern 1640 having one portion 16PM-1 that is carried on a primary scale member 1649, a secondary scale modulation pattern 1680 having a two symmetrically placed portions 16SM-1 and 16SM-1' carried on a secondary scale member 1689, and a receiver electrode configuration 1660 carried on the interior side of a receiver electrode member 1669. FIG. 65 also shows a secondary outer cycloid gear member 1699, also referred to as the secondary outer gear member 1699. The primary scale member 1649, the secondary scale member 1689, and the secondary outer cycloid gear member 1699, all together, form a cycloid gear assembly 1690. The primary scale member 1649 of the cycloid gear assembly 1690 rotates at the same rate as the input shaft that drives the encoder, while the secondary scale member 1689 rotates at a much slower rate determined by the gear characteristics of the cycloid gear assembly 1690, as previously described with reference to the corresponding components of the multiturn capacitive encoder 1000.

The arrangement of coordinate axes, including the circular measuring axis 80, described with reference to FIG. 1, will be understood to apply, in a similar orientation, to the multiturn capacitive encoder 1600. The inner ring of four transmitter electrodes of the transmitter electrode configuration 1620 is nominally aligned with the primary scale modulation pattern 1640 and an inner pair of circular differential receiver electrodes 16PR-1 and 16PR-2 (shown in FIG. 66) to form and/or coincide with an inner modulation track, or primary scale track. The primary scale track is TYPE A track, and is designed and operated as such. Similarly, the outer ring of eight transmitter electrodes of the transmitter electrode configuration 1620 is nominally aligned with the secondary scale modulation pattern 1640 and an outer circular receiver electrode 16SR-1 of the receiver electrode configuration 1660 (shown in FIG. 66) to form and/or coincide with secondary scale track. Due to its symmetry and its two cycles per revolution, the secondary scale track is variation of a TYPE E track, and is generally designed and operated as such, except as described below. Of course, the various electrode dimensions of the multiturn capacitive encoder 1600 should be designed with wobble taken into considerations, as previously discussed with reference to FIG. 36.

The secondary outer cycloid gear member 1699 has 66 internal cogs or gear teeth, and the secondary scale member 1689 has 64 external cogs or gear teeth. In operation, the internal and external cogs are aligned in the same plane and mesh with each other in a conventional cycloidal gear reduction fashion when the secondary scale member 1689 is driven by the primary scale member 1649. The primary scale member 1649 is aligned in the same plane with the secondary scale member 1689, and has an outer diameter 1648 that is eccentric with respect to a nominal center of rotation of the primary scale member 1649. The eccentric outer diameter 1648 closely fits an inner diameter 1688 of the secondary scale member 1689. Thus, when the rotation of a drive shaft is coupled by a shaft coupling (not shown) to the primary scale member 1649, it drives the entire cycloid gear assembly 1690.

Figure 66:
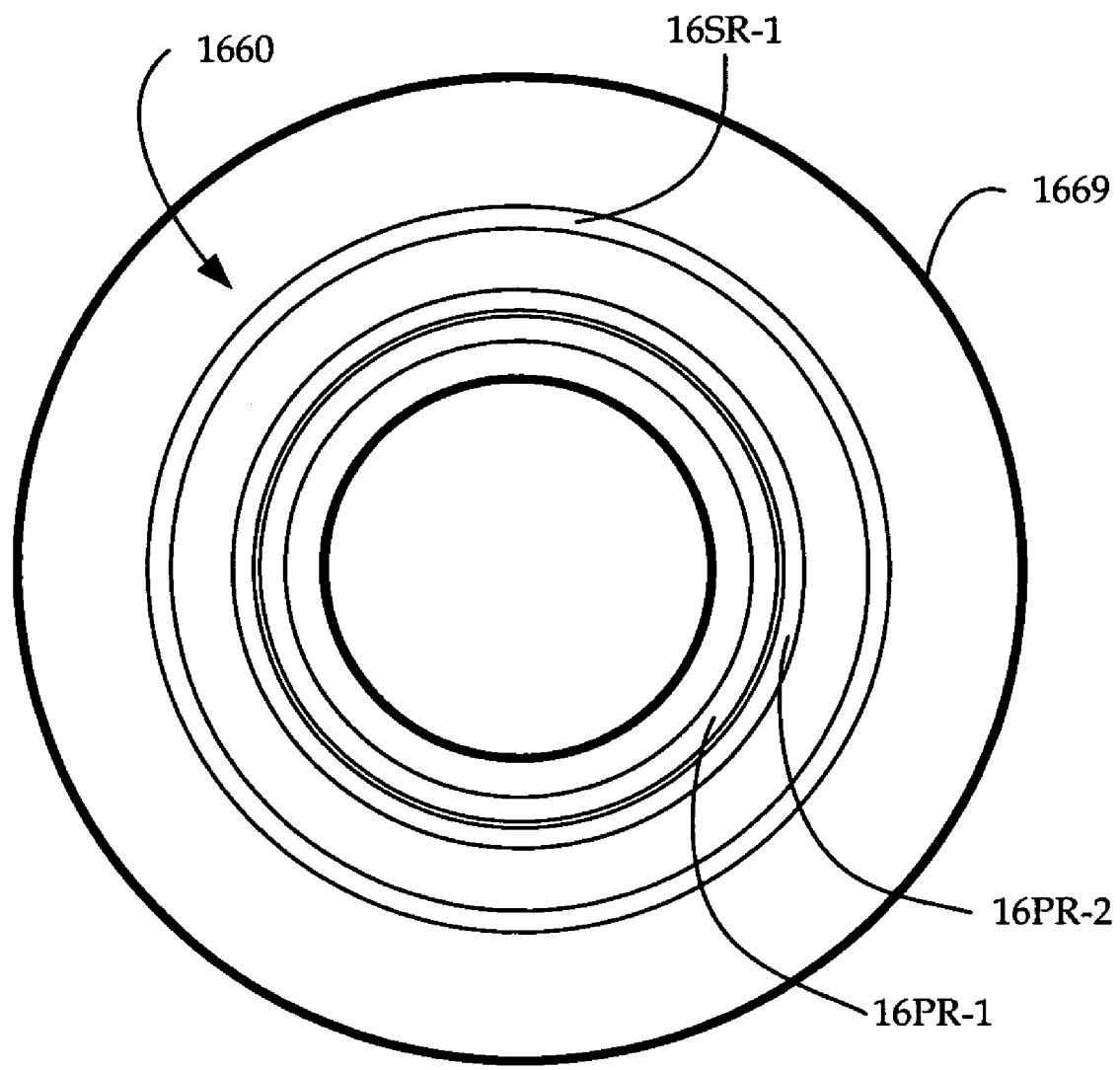
FIG. 66 is a plan view of an exemplary receiver electrode configuration usable in the multi-turn capacitive encoder shown in FIG. 65.

FIG. 66 is a plan view of the receiver electrode member 1669 carrying the receiver electrode pattern 1660. In various exemplary embodiments, the receiver electrode member 1669 comprises a printed circuit board, and the various receiver electrodes comprise plated areas on the print circuit board. The receiver electrode pattern 1660 includes the TYPE A differential pair of receiver electrodes 16PR-1 and 16PR-2 of the primary track. The receiver electrode pattern 1660 also includes the TYPE E receiver electrode 16SR-1 of the secondary track.

Figure 67:
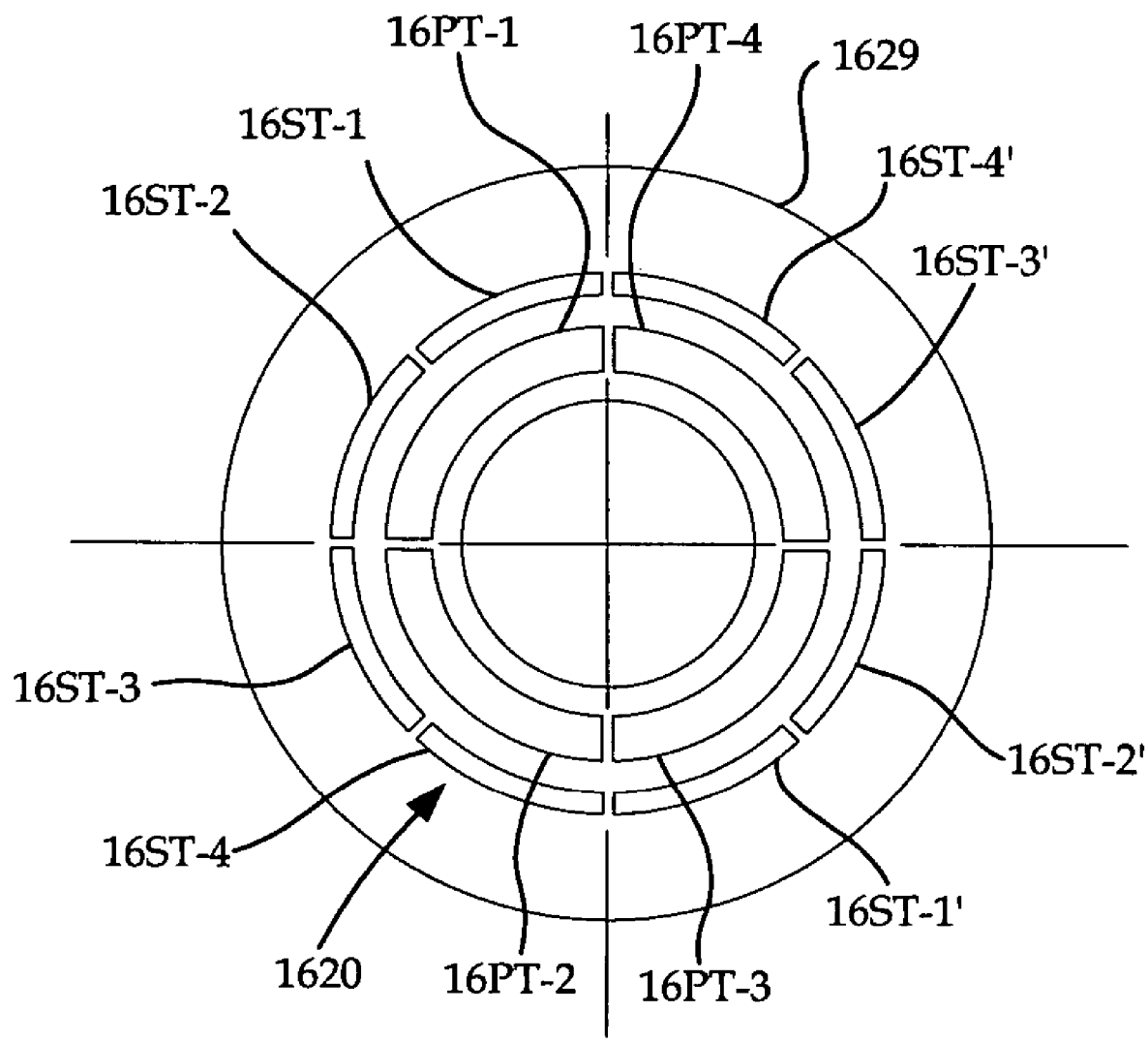
FIG. 67 is a plan view of an exemplary transmitter electrode configuration usable in conjunction with the receiver electrode configuration shown in FIG. 66.

FIG. 67 is a plan view of the transmitter electrode member 1629 carrying the transmitter electrode pattern 1620. In various exemplary embodiments, the transmitter electrode member 1629 comprises a printed circuit board, and the various transmitter electrodes comprise plated areas on the print circuit board. The transmitter electrode pattern 1620 includes the TYPE A set of transmitter electrodes 16PT-1 through 16PT-4 of the primary track, which are connected to input 4 sinusoidal AC signals, having nominally identical amplitudes and relative phases of 0°, and 80°, 180°, and 270°. The transmitter electrode pattern 1620 also includes the TYPE E transmitter electrodes 16ST-1 through 16ST-4 and 16ST-1' through 16ST-4' of the secondary track, which are also connected to input 4 sinusoidal AC signals, having nominally identical amplitudes and relative phases of 0°, and 80°, 180°, and 270°, in a manner previously described with reference to their counterparts in the TYPE E track description of FIGS. 21-25. To obtain the highest measurement accuracy and best reliability, it is generally advantageous if the set of primary scale transmitter electrodes and the set of secondary scale transmitter electrodes are energized at different times in order to acquire position measurements at different times from the primary, and secondary scale tracks. This minimizes error inducing cross talk between the independent measurement signal channels in a multi-turn capacitive encoder according to this invention. However, for less demanding applications, simultaneous activation may be possible.

Figure 68:
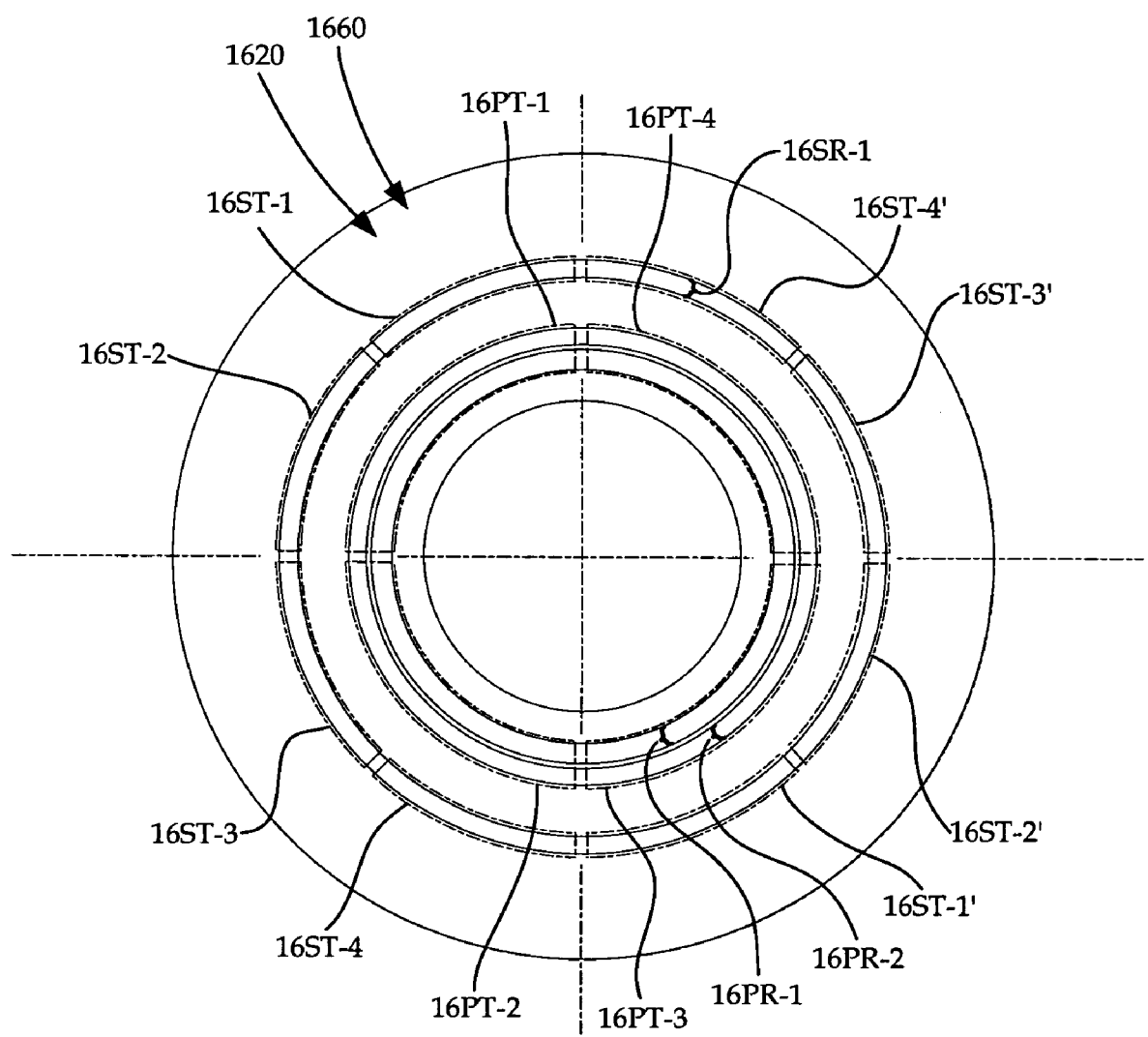
FIG. 68 illustrates the receiver and transmitter electrode patterns of FIGS. 66 and 67, superimposed to show their nominal assembled alignment.

FIG. 68 illustrates the receiver and transmitter electrode patterns 1660 and 1620, of FIGS. 66 and 67, superimposed to show their nominal assembled alignment. The various elements shown in FIG. 68 will be understood based on previous descriptions.

Figure 69:
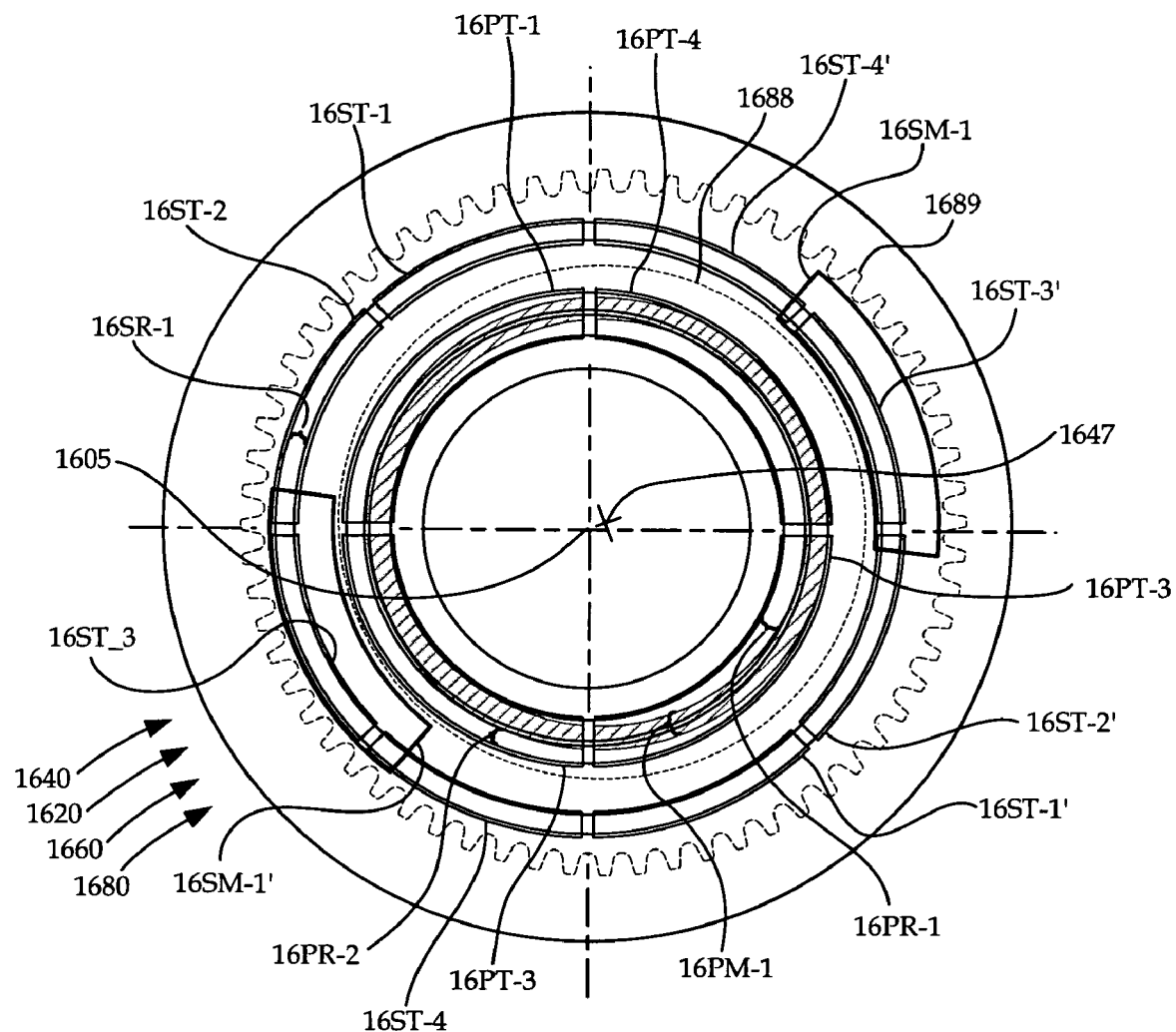
FIG. 69 illustrates primary and secondary scale modulation patterns that are usable with the receiver and transmitter electrode patterns of FIGS. 66 and 67, all superimposed to show their nominal assembled alignment for one position of the primary scale.

FIG. 69 illustrates the primary and secondary scale modulation patterns 1640 and 1680 (shown in FIGS. 70A-72, in greater detail), along with the receiver and transmitter electrode patterns shown in FIG. 68, all superimposed to show their nominal assembled alignment for one position of the primary scale. These and other elements shown in FIG. 69 will be understood based on previous description and/or by analogy to their previously described counterparts in similar TYPE A and TYPE E tracks. As previously mentioned, the secondary track modulation regions 16SM-1 and 16SM-1' of the secondary scale modulator pattern 1680 are symmetrically placed relative to the center of the secondary scale member 1689, and function similarly to a TYPE E secondary modulator pattern, along with the TYPE E secondary transmitter pattern. The secondary scale modulator pattern 1680 will not produce a sinusoidal capacitance modulation is a function of rotational position. However, it will produce a roughly quasi-sinusoidal capacitance modulation that is usable in a multiturn capacitive encoder 1600. It is preferred that the angular extents of each of the individual modulation regions 16SM-1 and 16SM-1' be approximately equal to or greater than the angular extents of an individual transmitter electrode and at least one of its adjacent gaps between the transmitter electrodes, in order to produce a high level of measurement signal modulation, although modulation regions having greater, or slightly less, angular extent are also operable. It is preferred that the radial extents of each of the individual modulation regions 16SM-1 and 16SM-1' be approximately equal to or greater than the radial extents of an individual secondary track transmitter electrode (or the secondary track receiver electrode, if it has a greater redial extent) along with an addition radial extent to account for wobble, approximately as shown in FIG. 69 and by analogy with the wobble considerations described with reference to FIG. 36.

Figure 70A:
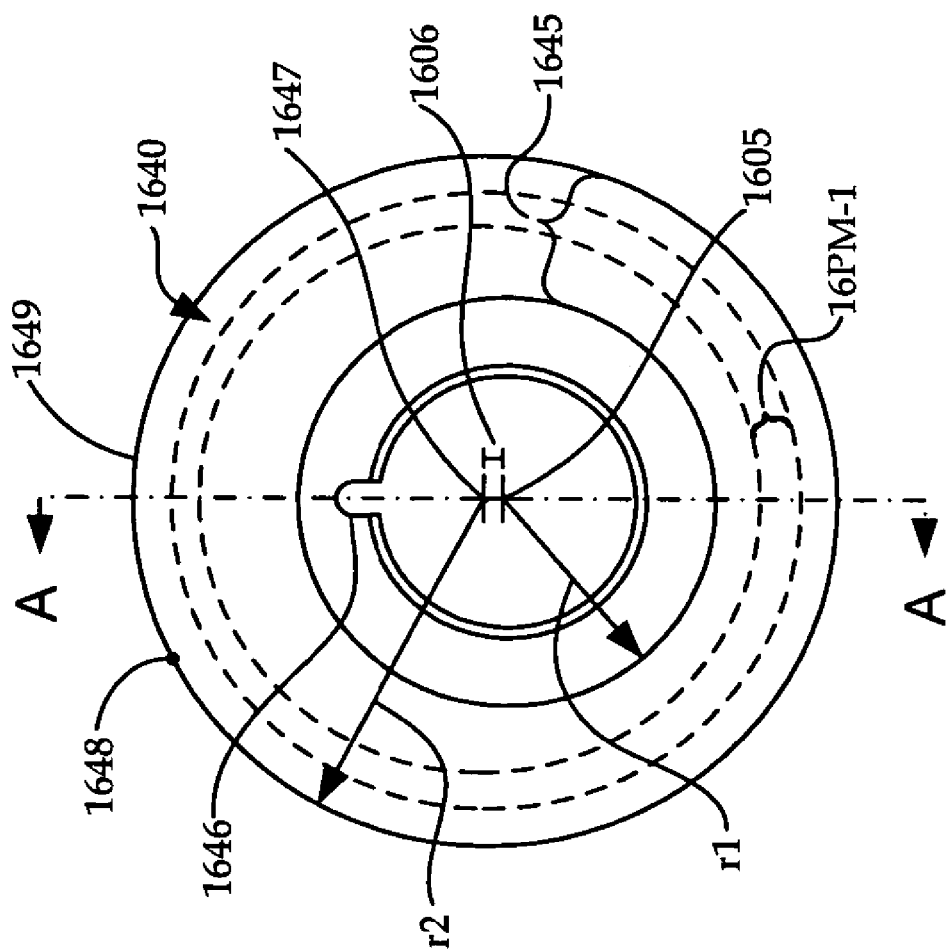
FIG. 70A is a plan view illustrating an exemplary primary scale member usable in the fourth exemplary multiturn capacitive encoder, including the primary scale modulation pattern shown in FIG. 69.
Figure 70B:
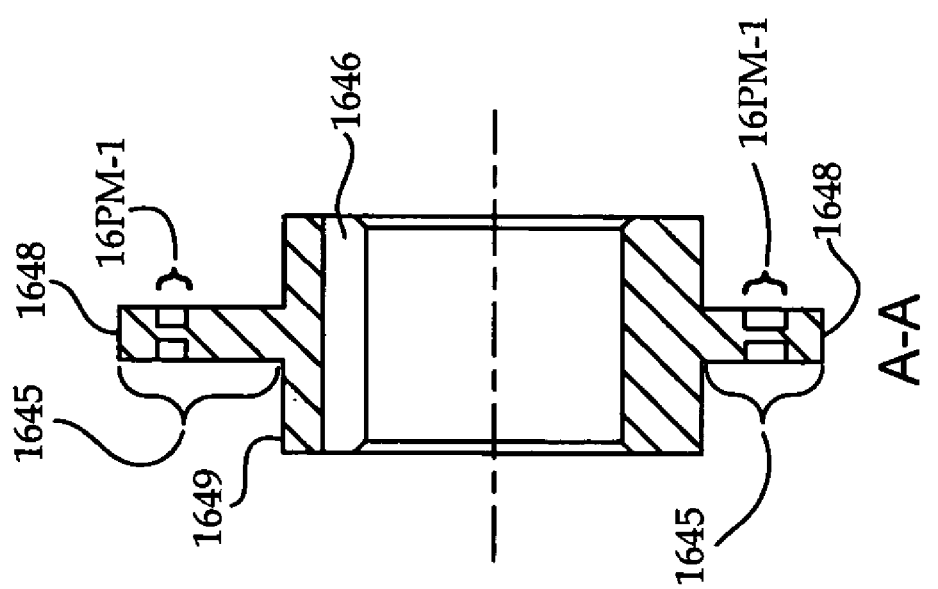
FIG. 70B is side cross-section that views illustrating the exemplary primary scale member shown in FIG. 70A.

FIGS. 70A and 70B are a plan view and a side cross-section view, respectively, illustrating the primary scale member 1649, carrying the primary scale modulation pattern 1640 that includes the modulation region 16PM-1. The various elements shown in FIGS. 70A and 70B will be understood based on previous description and/or by analogy to their previously described counterparts. In this embodiment, the modulation region 16PM-1 comprises a reduced thickness region in an otherwise uniformly thick dielectric that forms the flange 1645 of the primary scale member 1649. The modulation pattern 1640 acts to reduce the capacitive coupling between the transmitter and receiver electrodes.

Figure 71:
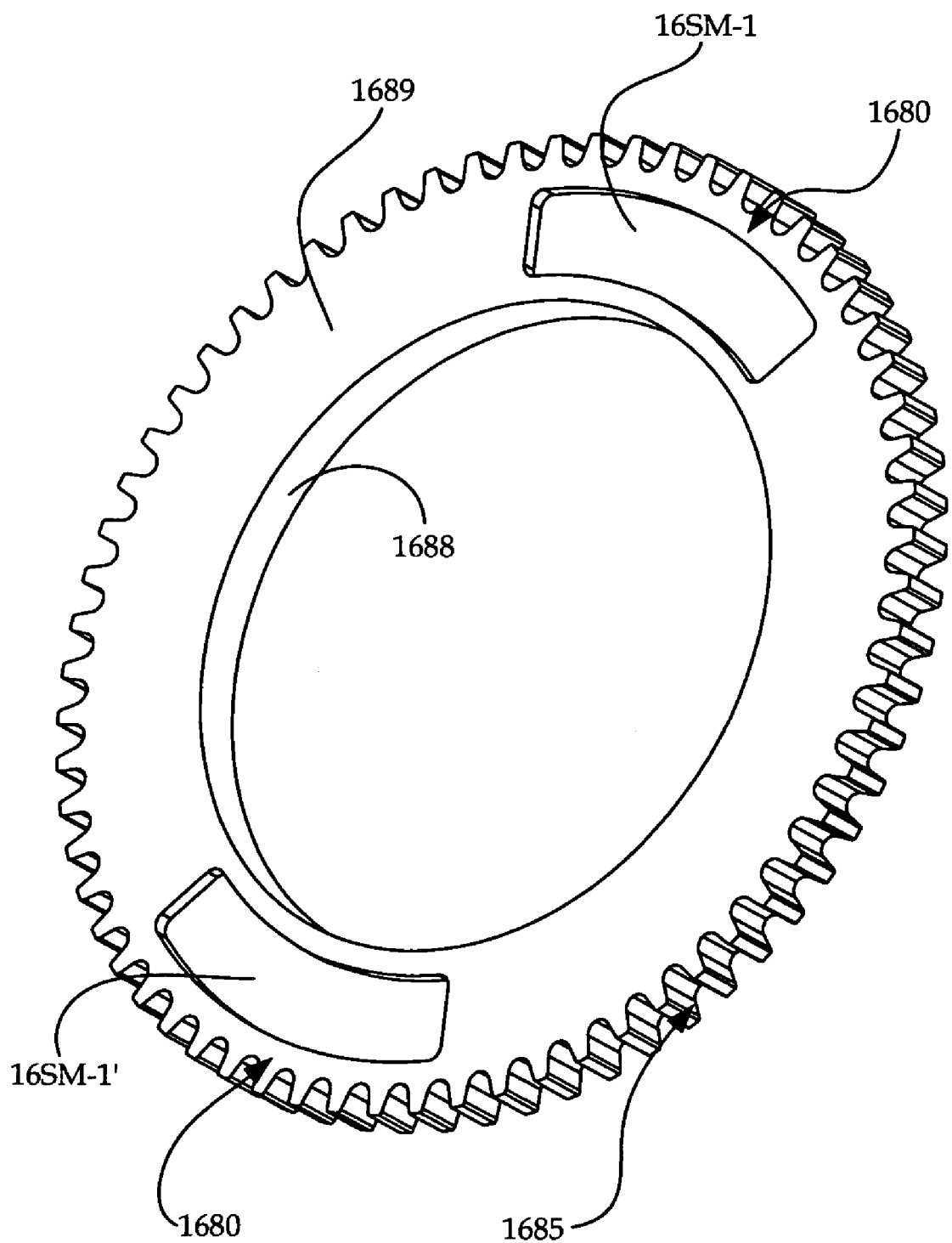
FIGS. 71 and 72 are isometric and plan views, respectively, illustrating a secondary scale member usable in the fourth exemplary multiturn capacitive encoder, including the secondary scale modulation pattern shown in FIG. 69.
Figure 72:
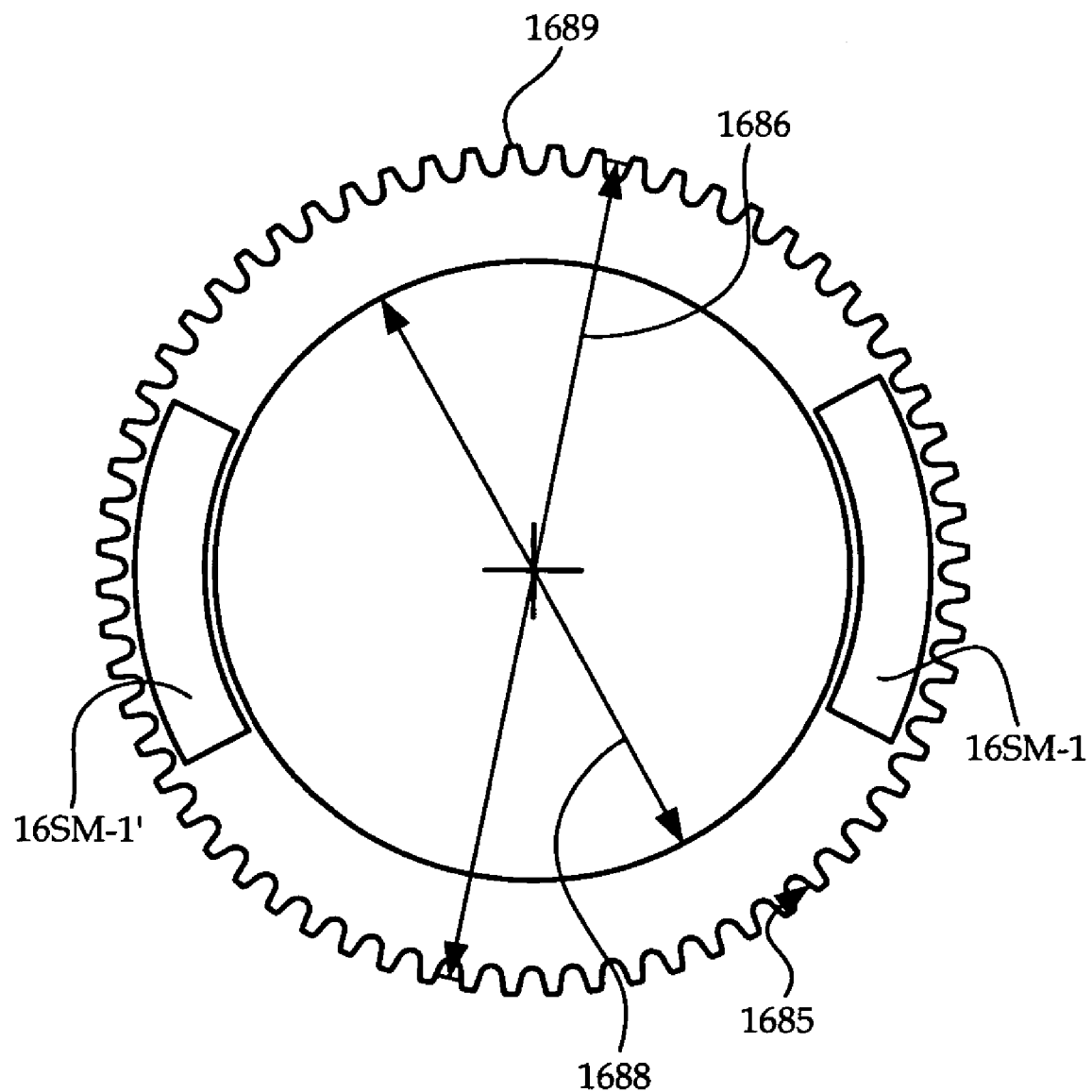

FIGS. 71 and 72 are isometric and plan views, respectively, illustrating the secondary scale member 1689, including the secondary scale modulation pattern 1680 including the to symmetrically placed modulation regions 16SM-1 and 16SM-1'. In this embodiment, the modulation regions 16SM-1 and 16SM-1' comprise a reduced thickness region in an otherwise uniformly thick dielectric that forms the secondary scale member 1649. In various embodiments, thickness may be reduced to zero, that is, the modulation regions may comprise holes. The modulation pattern 1680 acts to reduce the capacitive coupling between the transmitter and receiver electrodes. The various other elements shown in FIGS. 71 and 72 will be understood based on previous description and/or by analogy to their previously described counterparts.

Figure 73:
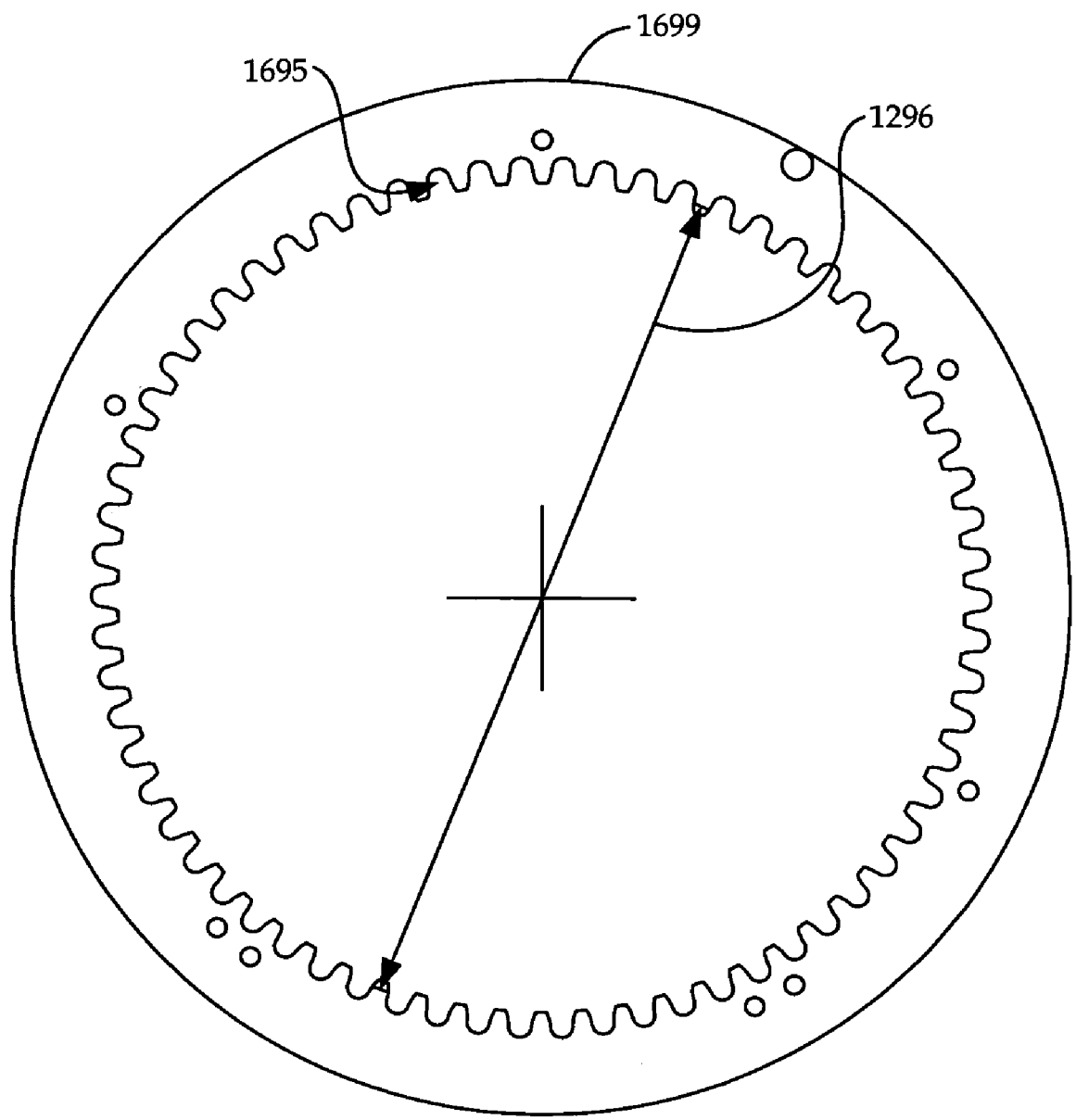
FIG. 73 is a plan view illustrating an outer cycloid gear member usable in the fourth exemplary multiturn capacitive encoder.

FIG. 73 is a plan view illustrating the outer cycloid gear member 1699. The various elements shown in FIG. 73 will be understood based on previous description and/or by analogy to their previously described counterparts.

Figure 74:
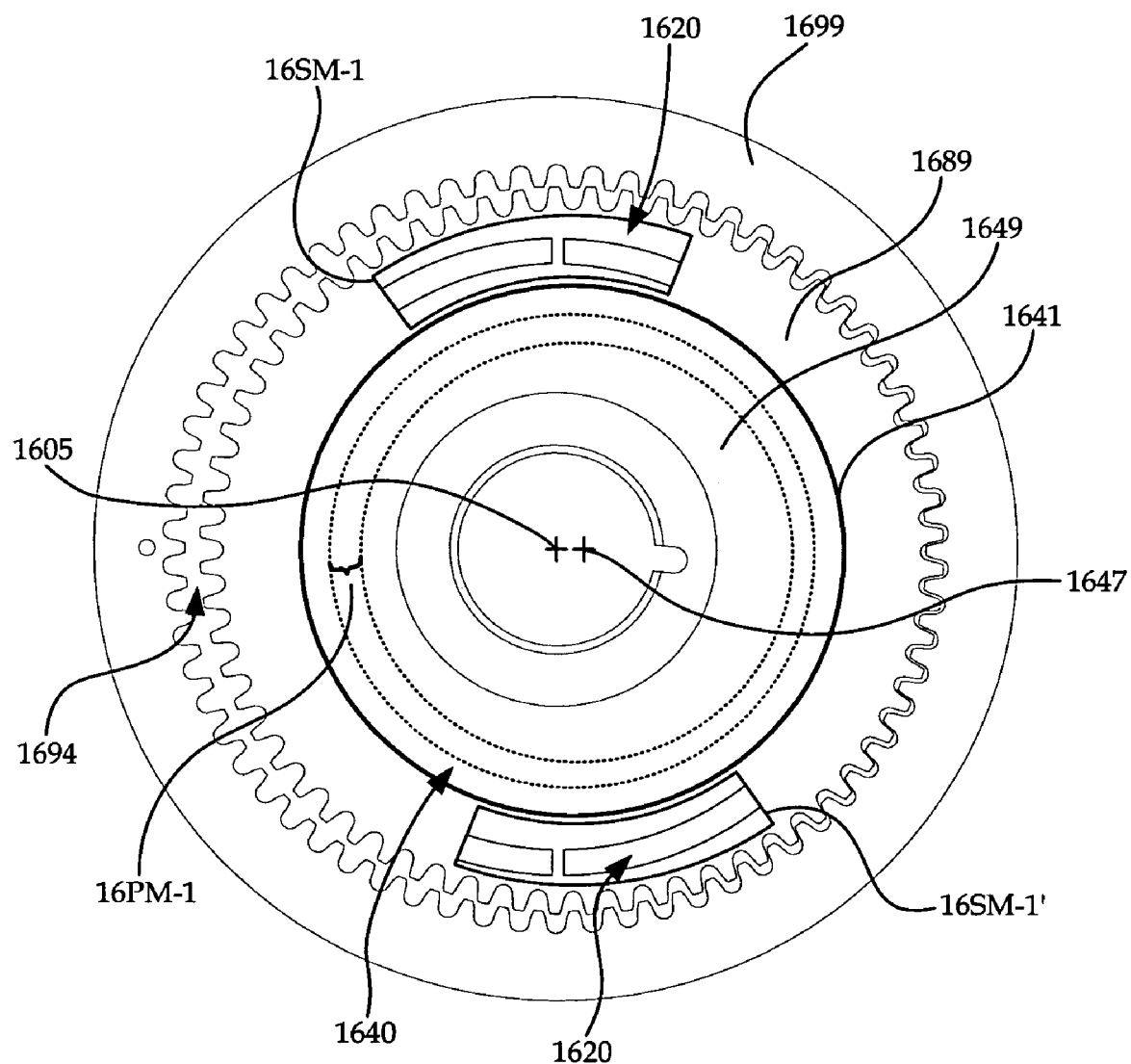
FIG. 74 is a plan view illustrating the primary scale member, secondary scale member, and outer cycloid gear member in their assembled positions, for one position of the primary scale member.

FIG. 74 is a plan view illustrating the primary scale member 1649, secondary scale member 1689, and outer cycloid gear member 1699 in their assembled positions, for one position of primary and secondary scale members. The design and operation of the various elements shown in FIG. 74 will be understood based on previous description and/or by analogy to their previously described counterparts.

In operation, the TYPE A primary scale track, including the primary scale modulation pattern 1640 approximately coinciding with the extents of the outer flange 1645 provides for angular position measurement within a single turn, and the modified TYPE E secondary scale track, including the secondary scale modulation pattern 1680 approximately coinciding with the extents of the shoulder 1683 of the secondary scale member 1689 provides for an angular position measurement that is used to indicate or count multiple turns of the multi-turn capacitive encoder 1600, in a manner analogous to that previously described for the multiturn capacitive encoder 1000. Due to the 64:66 cycloid gear ratio of the secondary scale member 1689, it takes 32 primary turns to provide one revolution of the secondary scale member 1689. The secondary scale track provides two measurement signal cycles per revolution, which introduces an ambiguous signal every 180°. Thus, in contrast to the multiturn capacitive encoder 1000, which similarly determines a number of turns based on the measurement signal from the secondary scale track, the multiturn capacitive encoder 1600 can only unambiguously count approximately 16 turns. One advantage of the multiturn capacitive encoder 1600 over the multiturn capacitive encoder 1000 is that the secondary scale track uses a modulation pattern that includes bilateral symmetry. This feature of the pattern significantly enhances the accuracy and reliability of the measuring signal that it provides, since any wobble or deviation tends provide self-compensating signal changes from the opposite portions of the symmetric modulation pattern.

Regarding the mechanical operation of the cycloidal gear system 1690, the desired rotary actuation of the secondary scale member 1689 will be understood based on the previous description of the cycloidal gear system 1090 of the multi-turn capacitive encoder 1000. All of the various exemplary dimensions may be the same as those previously described for their counterparts in the multiturn capacitive encoder 1000. The approximate dimensional guidelines described there may require slight adjustments due to various molding or machining tolerances or other factors. Such adjustments may be determined by specific analysis or experiment for the multiturn capacitive encoder 1600.

Figure 75:
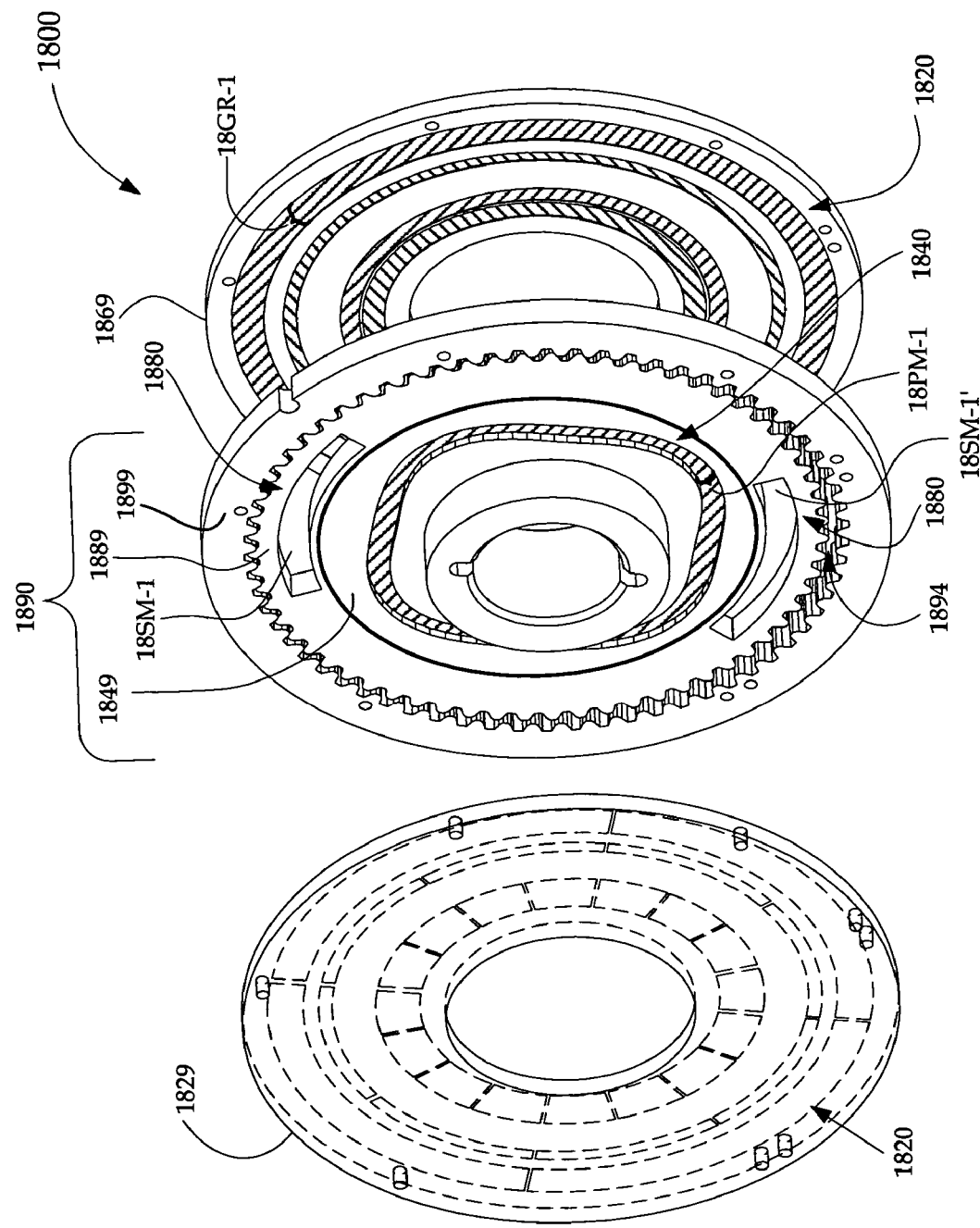
FIG. 75 is a partially exploded isometric view illustrating a fifth exemplary embodiment of a multi-turn capacitive encoder, including a transmitter electrode member in transparent outline.

FIG. 75 is an isometric view of a fifth exemplary embodiment of a multi-turn capacitive encoder 1800 according to this invention. As shown in FIG. 75, the multi-turn capacitive encoder 1800 includes a transmitter electrode configuration 1820 carried on the interior side of a transmitter electrode member 1829 (shown in transparent outline), a primary scale modulation pattern 1840 having one portion 18PM-1 that is carried on a primary scale member 1849, a secondary scale modulation pattern 1880 having a two symmetrically placed portions 18SM-1 and 18SM-1' carried on a secondary scale member 1889, and a receiver electrode configuration 1860 carried on the interior side of a receiver electrode member 1869. FIG. 75 also shows a secondary outer cycloid gear member 1899, also referred to as the secondary outer gear member 1899. The primary scale member 1849, the secondary scale member 1889, and the secondary outer cycloid gear member 1899, all together, form a cycloid gear assembly 1890. The primary scale member 1849 of the cycloid gear assembly 1890 rotates at the same rate as the input shaft that drives the encoder, while the secondary scale member 1889 rotates at a much slower rate determined by the gear characteristics of the cycloid gear assembly 1890, as previously described with reference to the corresponding components of the multiturn capacitive encoder 1000.

The arrangement of coordinate axes, including the circular measuring axis 80, described with reference to FIG. 1, will be understood to apply, in a similar orientation, to the multiturn capacitive encoder 1800. The inner ring of 16 transmitter electrodes of the transmitter electrode configuration 1820 is nominally aligned with the primary scale modulation pattern 1840 and an inner pair of circular differential receiver electrodes 18PR-1 and 18PR-2 (shown in FIG. 76) to form and/or coincide with an inner modulation track, or primary scale track. Due to its four cycles per revolution, and its 16 transmitter electrodes, the secondary scale track is variation of a TYPE A track (in that the meandering of the primary modulation pattern relative to the two differential receiver electrodes produces the modulation of the position measuring signal), and is generally designed and operated as such, except as described below. Similarly, the middle ring of eight transmitter electrodes of the transmitter electrode configuration 1820 is nominally aligned with the secondary scale modulation pattern 1840 and a middle circular receiver electrode 18SR-1 of the receiver electrode configuration 1860 (shown in FIG. 76) to form and/or coincide with secondary scale track. Due to its symmetry and its two cycles per revolution, the secondary scale track is variation of a TYPE E track that is essentially the same as the secondary track of the multi-turn capacitive encoder 1600, and is generally designed and operated as such.

A unique feature of a multiturn capacitive encoder 1800 is that it uses the cycloidal gap 1894 to provide an additional sensing signal, as described further below. Thus, an outer ring of four transmitter electrodes of the transmitter electrode configuration 1820 is nominally aligned with the "modulation pattern" of the cycloidal gap 1894 and an outer circular receiver electrode 18GR-1 ("GR" for Gap Receiver) of the receiver electrode configuration 1860 (shown in FIG. 76) to form and/or coincide with "cycloidal gap" scale track. The cycloidal gap scale track is variation of a TYPE B track and the transmitter and receiver electrodes are conceptually designed and operated as such, except as described below. Of course, the various electrode dimensions of the multiturn capacitive encoder 1800 should be designed with wobble taken into considerations, as previously discussed with reference to FIG. 36.

The secondary outer cycloid gear member 1899 has 66 internal cogs or gear teeth, and the secondary scale member 1889 has 64 external cogs or gear teeth. In operation, the internal and external cogs are aligned in the same plane and mesh with each other in a conventional cycloidal gear reduction fashion when the secondary scale member 1889 is driven by the primary scale member 1849. The primary scale member 1849 is aligned in the same plane with the secondary scale member 1889, and has an outer diameter 1848 that is eccentric with respect to a nominal center of rotation of the primary scale member 1849. The eccentric outer diameter 1848 closely fits an inner diameter 1888 of the secondary scale member 1889. Thus, when the rotation of a drive shaft is coupled by a shaft coupling (not shown) to the primary scale member 1849, it drives the entire cycloid gear assembly 1890.

Figure 76:
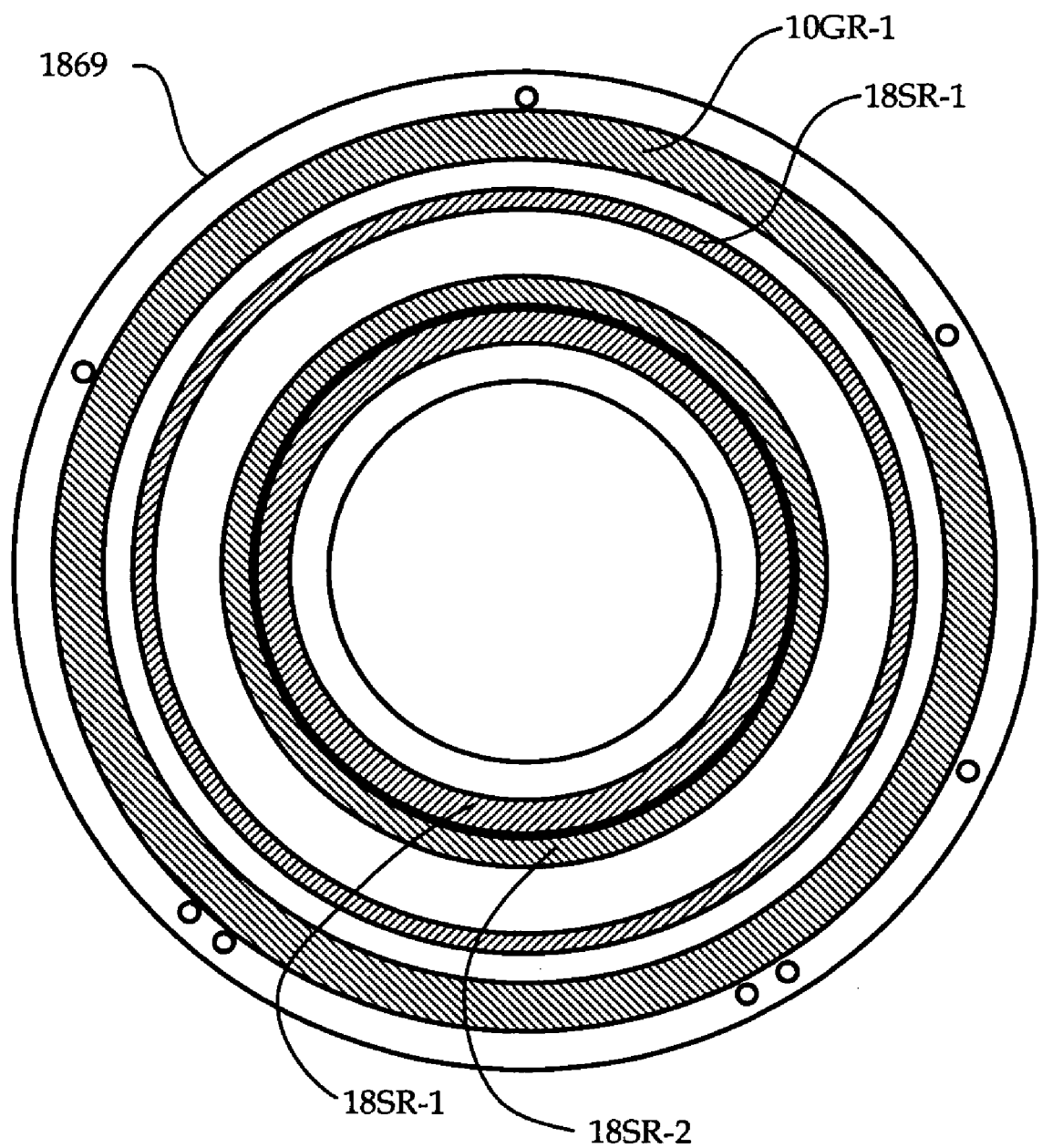
FIG. 76 is a plan view of an exemplary receiver electrode configuration usable in the multi-turn capacitive encoder shown in FIG. 75.

FIG. 76 is a plan view of the receiver electrode member 1869 carrying the receiver electrode pattern 1860. In various exemplary embodiments, the receiver electrode member 1869 comprises a printed circuit board, and the various receiver electrodes comprise plated areas on the print circuit board. The receiver electrode pattern 1860 includes the TYPE A differential pair of receiver electrodes 18PR-1 and 18PR-2 of the primary track. The receiver electrode pattern 1860 also includes the TYPE E receiver electrode 18SR-1 of the secondary track and the "TYPE B" receiver electrode 18GR-1 of the cycloidal gap track.

Figure 77:
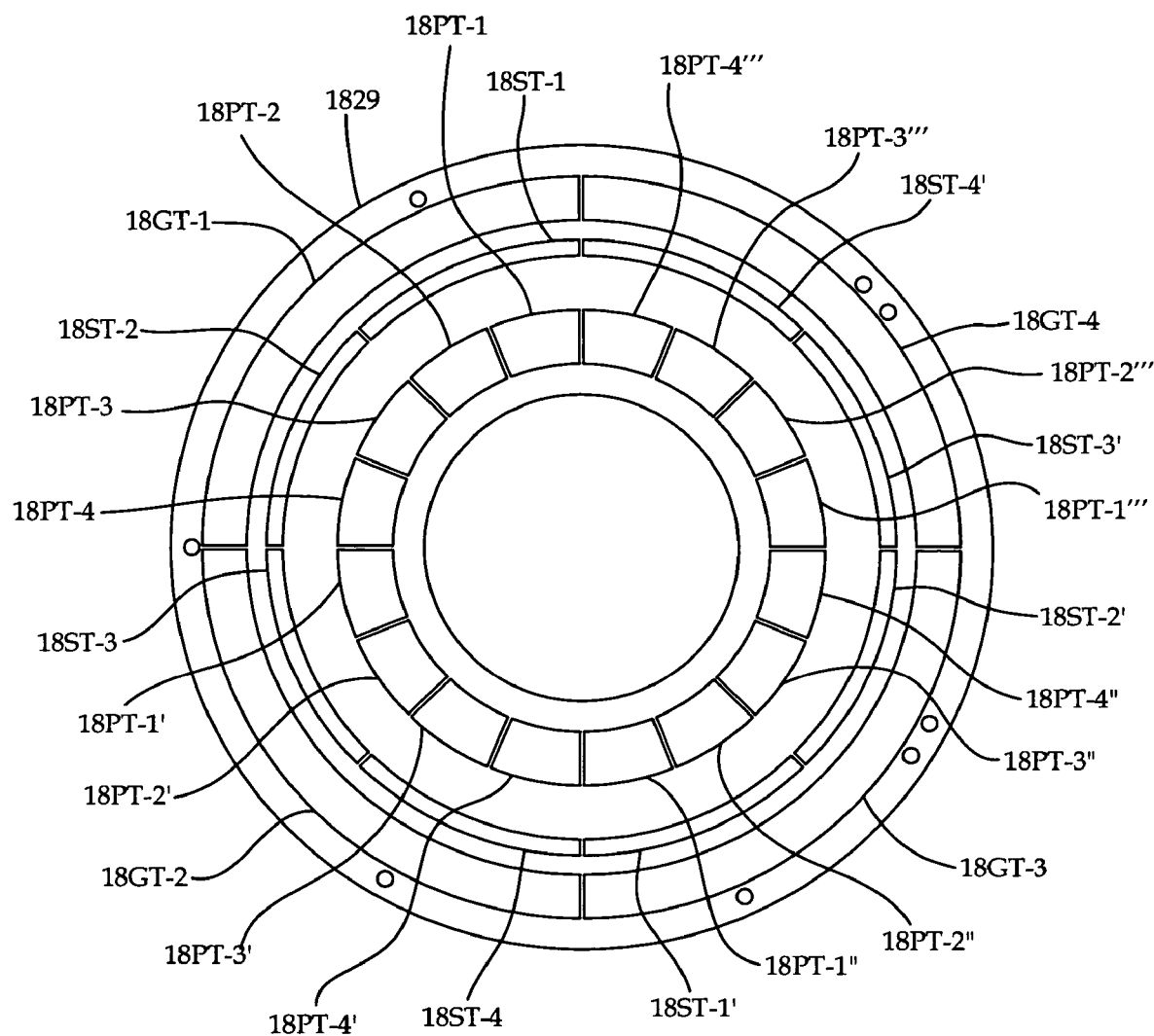
FIG. 77 is a plan view of an exemplary transmitter electrode configuration usable in conjunction with the receiver electrode configuration shown in FIG. 76.

FIG. 77 is a plan view of the transmitter electrode member 1829 carrying the transmitter electrode pattern 1820. In various exemplary embodiments, the transmitter electrode member 1829 comprises a printed circuit board, and the various transmitter electrodes comprise plated areas on the print circuit board. The transmitter electrode pattern 1820 includes the modified TYPE A set of transmitter electrodes 18PT-1 through 18PT-4, 18PT-1' through 18PT-4', 18PT-1" through 18PT-4", and 18PT-1'" through 18PT-4'" of the primary track, where in each "1-4" set is connected to input 4 sinusoidal AC signals, having nominally identical amplitudes and relative phases of 0°, and 80°, 180°, and 270° as previously described for similar sets herein. The transmitter electrode pattern 1820 also includes the TYPE E transmitter electrodes 18ST-1 through 18ST-4 and 18ST-1' through 18ST-4' of the secondary track, which are also connected to input 4 sinusoidal AC signals, having nominally identical amplitudes and relative phases of 0°, and 80°, 180°, and 270°, in a manner previously described with reference to their counterparts in the TYPE E track description of FIGS. 21-25. The transmitter electrode pattern 1820 also includes the TYPE B transmitter electrodes 18GT-1 through 18GT-4 of the cycloidal gap track, which are also connected to input 4 sinusoidal AC signals, having nominally identical amplitudes and relative phases of 0°, and 80°, 180°, and 270°, in a manner previously described with reference to their counterparts in the TYPE B track description of FIGS. 8-12.

To obtain the highest measurment accuracy and best reliability, it is generally advantageous if the set of primary scale transmitter electrodes, the set of secondary scale transmitter electrodes and the set of cycloidal gap scale transmitter electrodes are energized at different times in order to acquire position measurements at different times from the primary, secondary, and cycloidal gap scale tracks. This minimizes error inducing cross talk between the independent measurement signal channels in a multi-turn capacitive encoder according to this invention. However, for less demanding applications, simultaneous activation may be possible.

Figure 78:
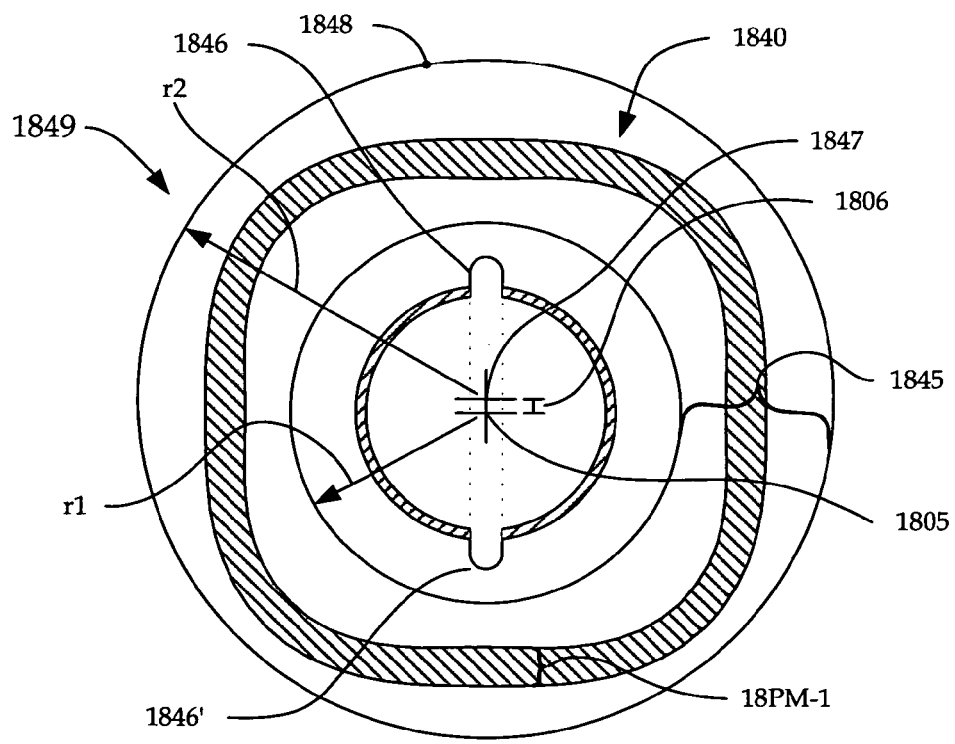
FIG. 78 is a plan view illustrating an exemplary primary scale member usable in the fifth exemplary multiturn capacitive encoder, including a multi-period primary scale modulation pattern usable in conjunction with the receiver and transmitter electrode configurations shown in FIGS. 76 and 77.

FIG. 78 is a plan view illustrating the primary scale member 1849, including the 4-period primary scale modulation pattern 1840. In the embodiment shown in FIG. 78, the primary scale member 1849 includes a central keyway portion 1846 that includes an optional keyway 1846' and that has an outer radius $r_1$ relative to the center of rotation 1805. The radius $r_1$ is selected to provide a slight clearance through the central through holes in the receiver and transmitter electrode members, as it extends through them along the direction of the z-axis in a collar-like fashion. The central keyway portion 1846 mates with a corresponding keyway(s) of a shaft coupling, as previously described for the multiturn capacitive encoder 1000. The primary scale member 1849 also includes an outer flange portion 1845 that carries the modulator region 18PM-1. The modulator region 18PM-1 may conveniently comprise either a signal balance shield electrode, or dialect or figures reduction, as previously described herein. The design principles previously discussed in relation to the TYPE A, and further discussed in the incorporated '772 Application may be used to the design the 4-period primary scale modulation pattern 1840.

The outer diameter 1848 of the outer flange portion 1845 has a center 1847 which is offset from the center of rotation 1805 by an offset 1806 that is sufficient for providing a proper clearance and "wobble" for the proper operation of the cycloid gear system 1890, as previously described for the cycloid gear system 1090 of the multiturn capacitive encoder 1000. The outer diameter 1848 is just slightly less than the inner diameter of the secondary scale member 1889, such that one may turn freely within the other, yet with a sufficiently close fit that the cycloid gear system of the multiturn capacitive encoder 1800 operates with a desired precision. The radius $r_2$ is chosen such the outer flange is wide enough to accommodate the desired layout and spacing for the various operational electrodes and 4-period modulator of the modified TYPE A primary scale track. Other elements shown in FIG. 78 will be understood based on previous description and/or by analogy to their previously described counterparts.

Figure 79:
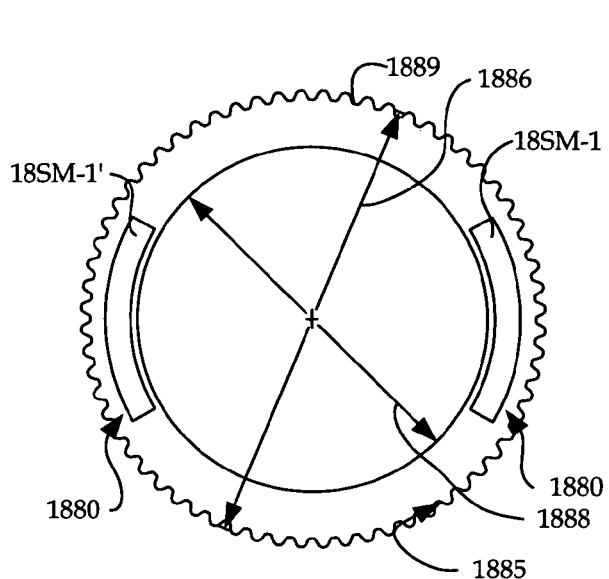
FIG. 79 is they plan view illustrating a secondary scale member usable in the fifth exemplary multiturn capacitive encoder, including a secondary scale modulation pattern usable in conjunction with the receiver and transmitter electrodes shown in FIGS. 76 and 77.

FIG. 79 is they plan view illustrating the secondary scale member 1889, including the secondary scale modulation pattern 1880 including the two symmetrically placed modulation regions 18SM-1 and 18SM-1'. In various embodiments, the modulation regions 18SM-1 and 18SM-1' comprise a reduced thickness region in an otherwise uniformly thick dielectric that forms the secondary scale member 1849. In the embodiment shown, the thickness is reduced to zero, that is, the modulation regions comprise holes. The modulation pattern 1880 acts to reduce the capacitive coupling between the transmitter and receiver electrodes. The various other elements FIG. 79 will be understood based on previous description and/or by analogy to its previously described counterpart(s), especially the secondary scale member of the multiturn capacitive encoder 1600.

Figure 80:
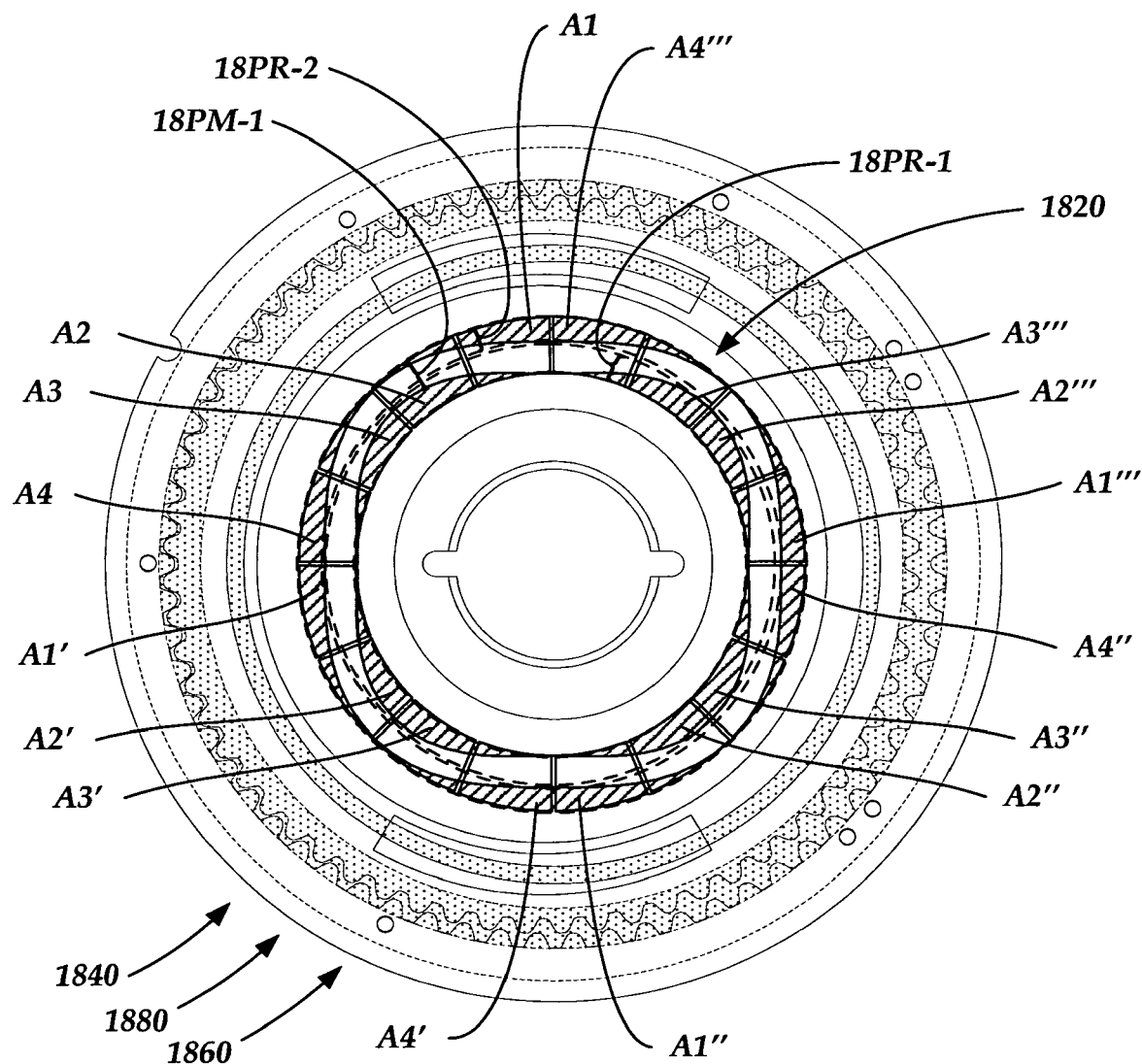
FIG. 80 is a plan view illustrating the cycloid gear assembly of the fifth exemplary multiturn capacitive encoder, including the primary and secondary scale modulation patterns of FIGS. 78 and 79, and the receiver electrode pattern of FIG. 76, all superimposed to show their nominal assembled alignment for one position of the primary scale.

FIG. 80 is a plan view illustrating the cycloid gear assembly 1890, emphasizing the primary and secondary scale modulation patterns 1840 and 1880 and the receiver electrode pattern 1820, superimposed to show their nominal assembled alignment. The various elements shown in FIG. 80 will be understood based on previous description and/or by analogy to their previously described counterparts. Regarding the operation of the four-period primary scale modulation pattern 1840, the modulation pattern 1840 will always fully overlap each of the transmitter electrodes 18PM-X, regardless of its angular position, which maintains the required signal balance in the case that modulation pattern 1840 comprises a signal balanced shield electrode. For the angular position shown in FIG. 80 the modulation pattern 1840 intervenes in the overlapping coupling area between each respective transmitter electrode and each respective receiver electrode 18PR-1 and 18PR-2 such that the capacitive coupling in the crosshatched areas A1-A4 is nominally undisturbed. Assume, for the moment, that the modulation pattern 1840 intervenes to reduce capacitive coupling, and that AC signals having equal amplitudes and relative phases of 0, 90, 180 and 270 degrees are applied to the transmitter electrodes 18PT-1 through 18PT-4, respectively, and similarly for the additional sets of electrodes 18PT-1' through 18PT-4', and so on. Accordingly, for the receiver electrode 18PR-1, the 0°-phase signal will be weakly coupled through its portions of the "A1" crosshatched areas A1-A1'", the 90°-phase signal and the 180°-phase signals will be strongly coupled through the respective "A2" and "A3" crosshatched areas, and the 270°-phase signal will be weakly coupled in the "A4" crosshatched areas. Conversely, for the receiver electrode 18PR-2, the 0°-phase signal will be strongly coupled through its portions of the "A1" crosshatched areas A1-A1'", the 90°-phase signal and the 180°-phase signals will be weakly coupled through the respective "A2" and "A3" crosshatched areas, and the 270°-phase signal will be strongly coupled in the "A4" crosshatched areas. Thus, for the position shown in FIG. 7, the signal on the receiver electrode 18PR-1 will have a nominal phase of approximately 135°. By similar analysis, the signal on the receiver electrode 18PR-2 will have the opposing nominal phase of approximately 215°, as is desirable for this differential receiver arrangement. It will be apparent to one skilled in the art, that as the modulation pattern 1840 is rotated along the scale track, the portions of the various crosshatched areas will vary sinusoidally over each of the receiver electrodes 18PR-1 and 18PR-2, 4 times for each revolution, which will cause the phase of the net signal on the receiver electrodes 18PR-1 and 18PR-2 to vary linearly as a function of the rotation angle, and produce 4 signal cycles per revolution. Thus, the phase of the net signal on each receiver electrode is indicative of the angular position of the modulation pattern 1840, but repeats every 90°. The signal processing use to eliminate this position ambiguity is described below with reference to FIG. 83. The incorporated "772 Application to Andermo provides additional teachings related to various operating principles, circuits and signal processing techniques that are usable in conjunction with this invention and that are consistent with the principles outlined above.

Figure 81:
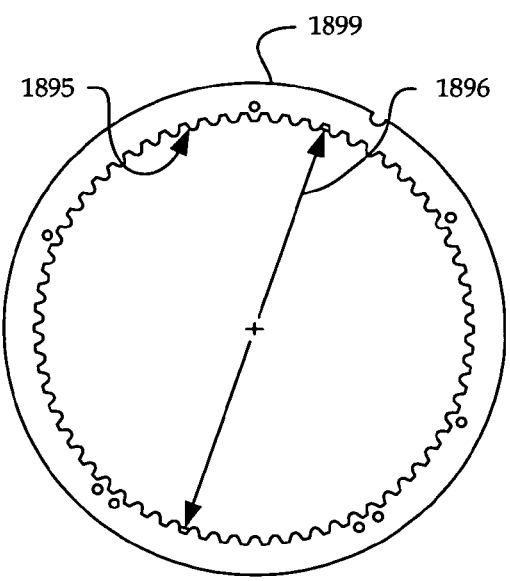
FIG. 81 is a plan view illustrating the outer cycloid gear member shown in FIG. 80.

FIG. 81 is a plan view illustrating the outer cycloid gear member 1899. The various elements shown in FIG. 81 will be understood based on previous description and/or by analogy to their previously described counterparts.

Figure 82:
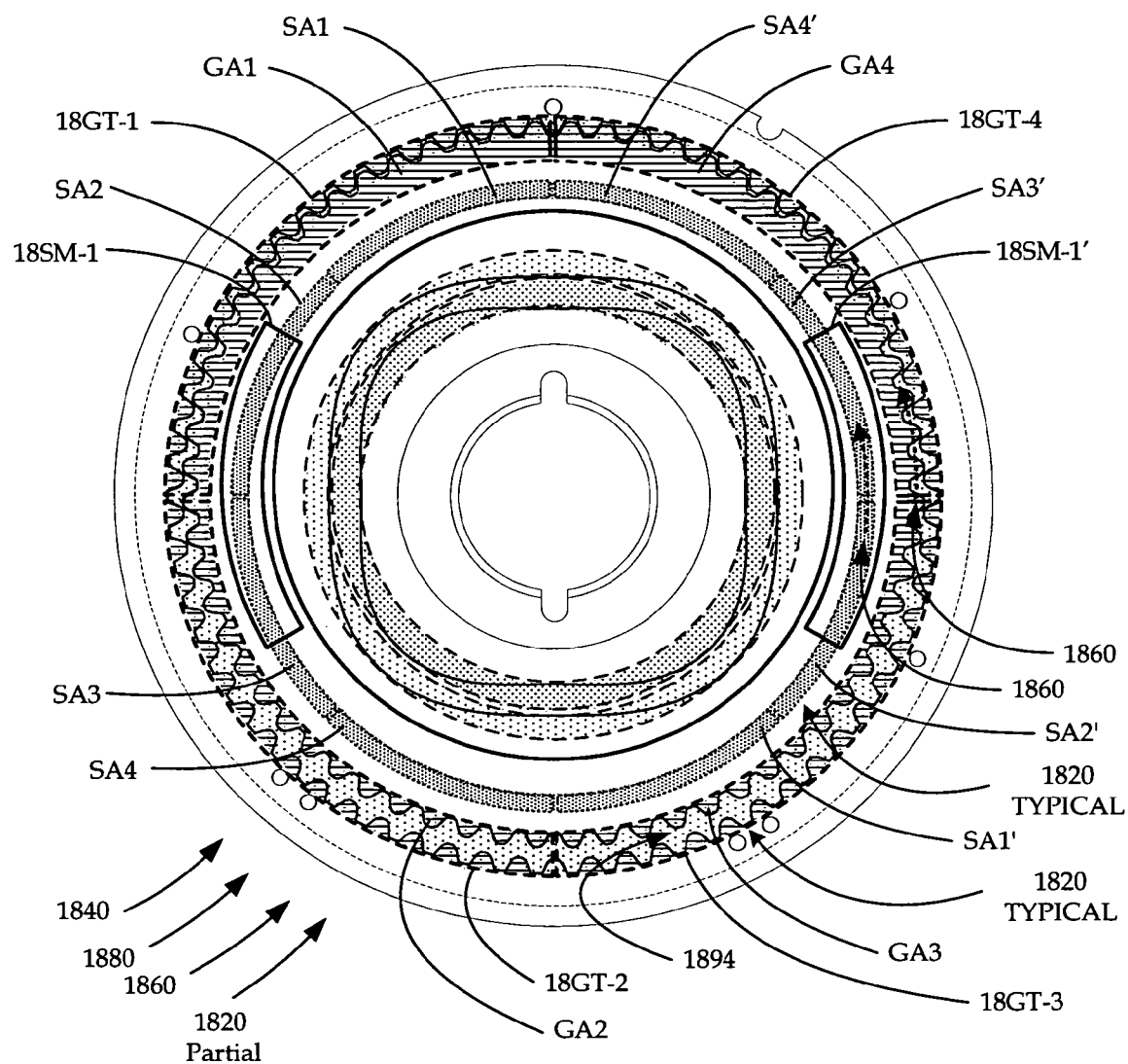
FIG. 82 is a plan view illustrating the cycloid gear assembly shown in FIG. 80, including the transmitter electrode configuration associated with the secondary scale and the transmitter electrode configuration associated with cycloidal gap sensing, all superimposed to show their nominal assembled alignment for one position of the primary scale.

FIG. 82 emphasizes the secondary scale modulation pattern 1880 and the cycloidal gap modulation pattern, along with the receiver and transmitter electrode patterns 1860 and 1820 for the secondary scale track, and the transmitter electrodes 18GT-1 through 18GT-4 and the receiver electrode 18GR-1 of the cycloidal gap scale track, all superimposed to show their nominal assembled alignment for one position of the primary and secondary scales. These and other elements shown in FIG. 81 will be understood based on previous description and/or by analogy to their previously described counterparts, especially those in similar TYPE B (for the cycloidal gap scale track) and TYPE E (for the secondary scale track) tracks. The secondary scale track of the multiturn capacitive encoder 1600 is particularly relevant for the secondary scale track of this embodiment. The secondary scale modulator pattern 1680 will not produce a sinusoidal capacitance modulation as a function of rotational position for the secondary scale track. Likewise, the cycloidal gap scale track will not produce an ideal sinusoidal capacitance modulation. However, both tracks will produce a quasi-sinusoidal capacitance modulation that is usable in the multiturn capacitive encoder 1800. It should be appreciated that the cycloidal gap scale track can be provided without any additional mechanical parts in various exemplary embodiments according to this invention. Thus, the number of usable scale tracks may actually exceed the number of specially provided modulation patterns in various embodiments according to this invention.

Figure 83:
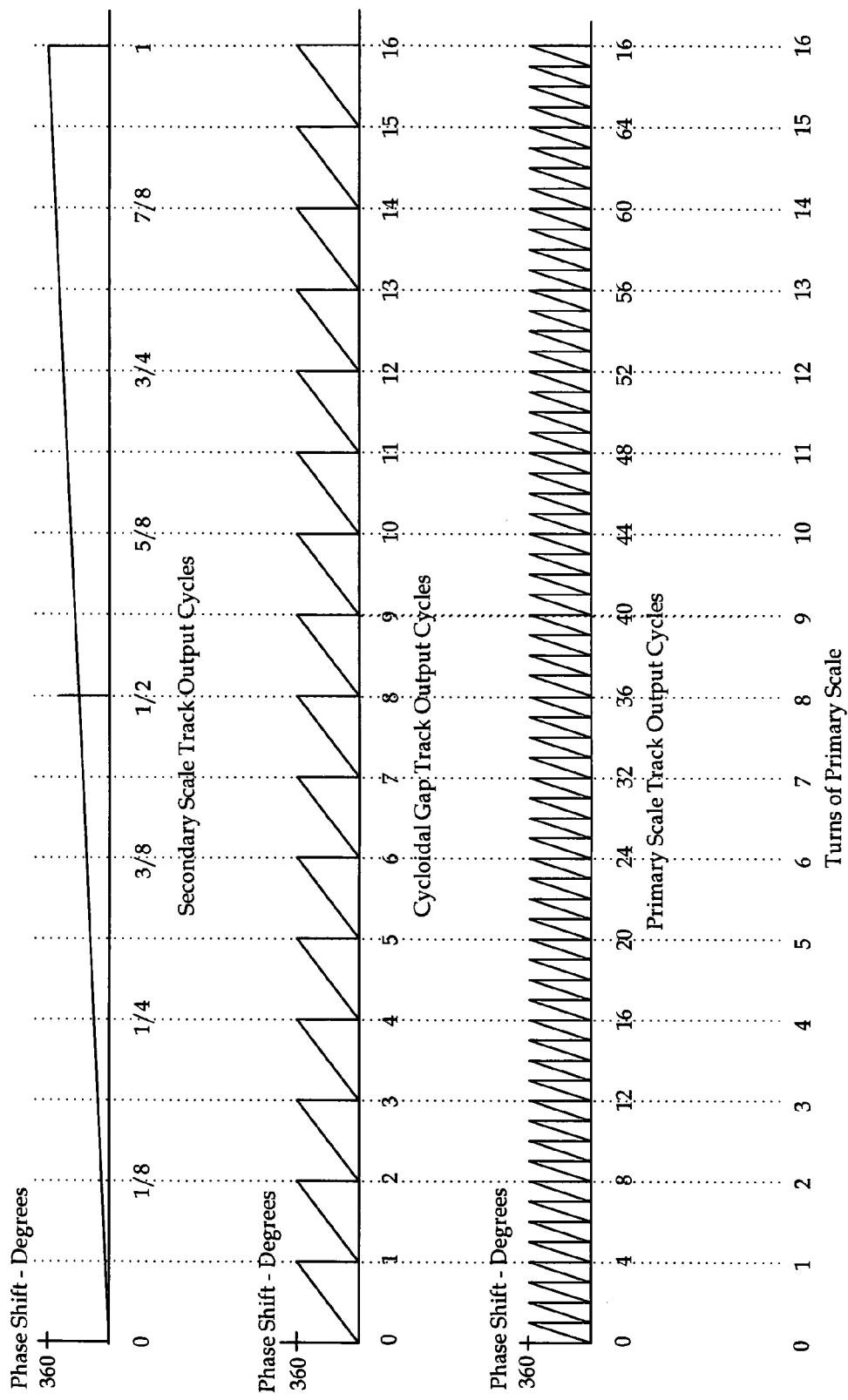
FIG. 83 is a chart illustrating relationships between various signals associated with the operation of the fifth exemplary multi-turn capacitive encoder, according to one exemplary signal processing method.

FIG. 83 is a chart illustrating relationships between various position measurement signals associated with the operation of the multi-turn capacitive encoder 1800, according to one exemplary signal processing method.

In operation, as shown in the bottom chart, the primary scale track, including the primary scale modulation pattern 1840 provides for 4 cycles of angular position measurement within a single turn, that is 64 signal cycles within 16 turns. The secondary scale track, including the secondary scale modulation pattern 1880 provides for an angular position measurement that is used to indicate or count multiple turns of the multi-turn capacitive encoder 1800, in a manner analogous to that previously described for the multiturn capacitive encoder 1000. The secondary scale track of provides for 2 cycles of angular position measurement within a single secondary scale turn. Thus, it can count primary turns unambiguously over a range of 180°, which, due to the 64:66 cycloid gear ratio of the secondary scale member 1889 corresponds to 16 turns, of the primary scale. Thus, similar to the multiturn capacitive encoder 1600, which similarly determines a number of turns based on the measurement signal from the secondary scale track, the multiturn capacitive encoder 1800 can only unambiguously count approximately 16 turns, or 64 signal cycles, of the primary scale. However, the cycloid gap scale track provides just one signal cycle for 32 turns of the primary scale. Despite various inaccuracies, the cycloid gap scale track can easily determine which half of a complete revolution, that is, which one of the secondary scale signal cycles, corresponds to the current position of the secondary scale member. Thus, overall, the multiturn capacitive encoder 1800 can count up to approximately 64 turns of the primary scale, that is, approximately 256 signal cycles of the primary scale track.

Regarding the mechanical operation of the cycloidal gear system 1890, the desired rotary actuation of the secondary scale member 1889 will be understood based on the previous description of the cycloidal gear system 1090 of the multiturn capacitive encoder 1000. All of the various exemplary dimensions may be the same as those previously described for their counterparts in the multiturn capacitive encoder 1000. The approximate dimensional guidelines described there may require slight adjustments due to various molding or machining tolerances or other factors. Such adjustments may be determined by specific analysis or experiment for the multiturn capacitive encoder 1800.

While the various exemplary embodiments of the invention have been illustrated and described, it will be appreciated that the foregoing embodiments are illustrative only, and not limiting. Thus, various changes can be made therein without departing from the spirit and scope of the invention.

The embodiments of the invention in which an exclusive property or privilege is claimed are defined as follows:

1. A capacitive-type displacement sensing device for determining a relative rotational position between two members along a measuring axis direction, the displacement sensing device comprising:
   a transmitter member having a first transmitter member surface, the transmitter member comprising at least a first transmitter element configuration comprising at least two transmitter electrode elements, at least some of the transmitter electrode elements located on the first transmitter member surface;
   a receiver member having a first receiver member surface, the receiver member comprising at least a first receiver element configuration comprising at least one receiver electrode element, at least some of the receiver electrode elements located on the first receiver member surface, the first receiver element configuration fixed relative to the first transmitter element configuration and capacitively coupled to the first transmitter element configuration across an operating gap located between the first receiver element configuration and the first transmitter element configuration;
   at least a first scale member, the first scale member comprising at least a first capacitive-coupling modulation pattern, the first capacitive-coupling modulation pattern located in the operating gap located between the first receiver element configuration and the first transmitter element configuration, the first capacitive-coupling modulation pattern movable along a rotational direction relative to the first transmitter element configuration and the first receiver element configuration to modulate the capacitive coupling between the first transmitter element configuration and the first receiver element configuration, and the first capacitive-coupling modulation pattern capacitively coupled to the first transmitter element configuration to provide a first modulator-transmitter capacitive coupling configuration;

a primary member configured to be coupled to and rotate with an input shaft; and a gear-reduction configuration providing at least a first level of gear-reduction between the rotation of the primary member and the rotation of the first scale member, wherein:

the at least two transmitter electrode elements of the first transmitter element configuration are respectively operable to provide respective time-varying transmitter voltage signals during a measurement period;

the at least one receiver electrode element of the first receiver element configuration is respectively operable to provide at least one respective receiver signal at least during at least one time during the measurement period, the at least one respective receiver signal varying in a manner that depends on the relative rotational position between the first capacitive-coupling modulation pattern and the first transmitter element configuration along the rotational direction;

the first scale member is driven such that one rotation of the first scale member corresponds to a plurality of rotations of primary member according to the first level of gear-reduction; and the elements of the gear reduction configuration that provide at least the first level of gear reduction are located entirely between the plane of the first transmitter member surface and the plane of the first receiver member surface.

2. The capacitive-type displacement sensing device of claim 1, wherein the entire gear-reduction configuration is located between the plane of the first transmitter member surface and the plane of the first receiver member surface.

3. The capacitive-type displacement sensing device of claim 1, wherein the gear-reduction configuration comprises at least a first cycloid type gear reduction configuration.

4. The capacitive-type displacement sensing device of claim 3, wherein a plurality of gear teeth included in the first cycloid type gear reduction configuration are arranged around a periphery of the first scale member.

5. The capacitive-type displacement sensing device of claim 4, wherein a plurality of gear teeth included in the first cycloid type gear reduction configuration are formed as an integral part of the first scale member.

6. The capacitive-type displacement sensing device of claim 1, wherein:

the transmitter member further comprises a second transmitter element configuration approximately concentric to the first transmitter element configuration, the second transmitter element configuration comprising at least two transmitter electrode elements;

the receiver member further comprises a second receiver element configuration approximately concentric to the first receiver element configuration, the second receiver element configuration comprising at least one receiver electrode element, the second receiver element configuration fixed relative to the second transmitter element configuration and capacitively coupled to the second transmitter element configuration across an operating gap located between the second receiver element configuration and the second transmitter element configuration; and the primary member further comprises a second capacitive-coupling modulation pattern, the second capacitive-coupling modulation pattern located in the operating gap located between the second receiver element configuration and the second transmitter element configuration, the second capacitive-coupling modulation pattern movable along a rotational direction relative to the second transmitter element configuration and the second receiver element configuration to modulate the capacitive coupling between the second transmitter element configuration and the second receiver element configuration, and the second capacitive-coupling modulation pattern capacitively coupled to the second transmitter element configuration to provide a second modulator-transmitter capacitive coupling configuration, wherein:

the at least two transmitter electrode elements of the second transmitter element configuration are respectively operable to provide respective time-varying transmitter voltage signals during a respective measurement period;

the at least one receiver electrode element of the second receiver element configuration is respectively operable to provide at least one respective receiver signal at least during at least one time during the respective measurement period, the at least one respective receiver signal varying in a manner that depends on the relative rotational position between the second capacitive-coupling modulation pattern and the second transmitter element configuration along the rotational direction; and when the primary member rotates with an input shaft, one signal cycle of a respective receiver signal provided based on the first receiver element configuration corresponds to a plurality of signal cycles of a respective receiver signal provided based on the second receiver element configuration.

7. The capacitive-type displacement sensing device of claim 6, wherein one signal cycle of the respective receiver signal provided based on the second receiver element configuration corresponds to, at most, one full rotation of the input shaft.

8. The capacitive-type displacement sensing device of claim 7, wherein one signal cycle of the respective receiver signal provided based on the first receiver element configuration corresponds to at least 8 signal cycles of the respective receiver signal provided based on the second receiver element configuration.

9. The capacitive-type displacement sensing device of claim 8, wherein one signal cycle of the respective receiver signal provided based on the first receiver element configuration corresponds to at least 16 signal cycles of the respective receiver signal provided based on the second receiver element configuration.

10. The capacitive-type displacement sensing device of claim 6, wherein:

the gear-reduction configuration comprises at least a first cycloid type gear reduction configuration wherein the primary member includes an outer periphery that is not concentric with a nominal axis of rotation, and the outer periphery of the primary member is coupled to drive the first scale member within the first cycloid gear reduction configuration;

the first scale member is driven such that it wobbles to engage gear teeth of the first cycloid gear reduction system over one region at the periphery of the first scale member and provide a generally crescent-shaped clearance gap for gear teeth around the remainder of the periphery of the first scale member;

the transmitter member further comprises a third transmitter element configuration approximately concentric to the first transmitter element configuration, the third transmitter element configuration comprising at least two transmitter electrode elements;

the receiver member further comprises a third receiver element configuration approximately concentric to the first receiver element configuration, the third receiver element configuration comprising at least one receiver electrode element, the third receiver element configuration fixed relative to the third transmitter element configuration and capacitively coupled to the third transmitter element configuration across an operating gap located between the third receiver element configuration and the third transmitter element configuration;

the generally crescent-shaped clearance gap comprises a third capacitive-coupling modulation pattern, the third capacitive-coupling modulation pattern located in the operating gap located between the third receiver element configuration and the third transmitter element configuration, the third capacitive-coupling modulation pattern moves along a rotational direction relative to the third transmitter element configuration and the third receiver element configuration as the first scale element is driven to wobble in the first cycloid gear reduction system;

the third capacitive-coupling modulation pattern modulates the capacitive coupling between the third transmitter element configuration and the third receiver element configuration, and the third capacitive-coupling modulation pattern is capacitively coupled to the third transmitter element configuration to provide a third modulator-transmitter capacitive coupling configuration;

the at least two transmitter electrode elements of the third transmitter element configuration are respectively operable to provide respective time-varying transmitter voltage signals during a respective measurement period;

the at least one receiver electrode element of the third receiver element configuration is respectively operable to provide at least one respective receiver signal at least during at least one time during the respective measurement period, the at least one respective receiver signal varying in a manner that depends on the relative position of the third capacitive-coupling modulation pattern between the third transmitter element configuration and the third receiver element configuration; and when the primary member rotates with an input shaft, one signal cycle of a respective receiver signal provided based on the first receiver element configuration corresponds to a plurality of signal cycles of a respective receiver signal provided based on the third receiver element configuration, and one cycle of the respective receiver signal provided based on the third receiver element configuration corresponds to a plurality of signal cycles of a respective receiver signal provided based on the second receiver element configuration.

11. The capacitive-type displacement sensing device of claim 1, wherein the gear-reduction configuration comprises at least a first cycloid type gear reduction configuration wherein the primary member includes an outer periphery that is not concentric with a nominal axis of rotation, and the outer periphery of the primary member is coupled to drive the first scale member within the first cycloid gear reduction configuration.

12. The capacitive-type displacement sensing device of claim 11, wherein:

the first scale member is driven such that it wobbles to engage gear teeth of the first cycloid gear reduction system over one region at the periphery of the first scale member and provide a generally crescent-shaped clearance gap for gear teeth around the remainder of the periphery of the first scale member; and the generally crescent-shaped clearance gap is used to provide an additional capacitive-coupling modulation pattern.

13. The capacitive-type displacement sensing device of claim 12, wherein:

the transmitter member further comprises an additional transmitter element configuration approximately concentric to the first transmitter element configuration, the additional transmitter element configuration comprising at least two transmitter electrode elements;

the receiver member further comprises an additional receiver element configuration approximately concentric to the first receiver element configuration, the additional receiver element configuration comprising at least one receiver electrode element, the additional receiver element configuration fixed relative to the additional transmitter element configuration and capacitively coupled to the additional transmitter element configuration across an operating gap located between the additional receiver element configuration and the third transmitter element configuration;

the generally crescent-shaped clearance gap comprises an additional capacitive-coupling modulation pattern, the additional capacitive-coupling modulation pattern located in the operating gap located between the additional receiver element configuration and the additional transmitter element configuration, the additional capacitive-coupling modulation pattern moving along a rotational direction relative to the additional transmitter element configuration and the additional receiver element configuration as the first scale element is driven to wobble in the first cycloid gear reduction system, the additional capacitive-coupling modulation pattern modulating the capacitive coupling between the additional transmitter element configuration and the additional receiver element configuration, and the additional capacitive-coupling modulation pattern capacitively coupled to the additional transmitter element configuration to provide an additional modulator-transmitter capacitive coupling configuration, the at least two transmitter electrode elements of the additional transmitter element configuration are respectively operable to provide respective time-varying transmitter voltage signals during a respective measurement period;

the at least one receiver electrode element of the additional receiver element configuration is respectively operable to provide at least one respective receiver signal at least during at least one time during the respective measurement period, the at least one respective receiver signal varying in a manner that depends on the relative position of the additional capacitive-coupling modulation pattern between the additional transmitter element configuration and the additional receiver element configuration; and when the primary member rotates with an input shaft, one signal cycle of a respective receiver signal provided based on the first receiver element configuration corresponds to a plurality of signal cycles of a respective receiver signal provided based on the additional receiver element configuration.

14. The capacitive-type displacement sensing device of claim 1, wherein:

the first capacitive-coupling modulation pattern is nominally symmetrical about a line through a midpoint of the first capacitive-coupling modulation pattern; and the first modulator-transmitter capacitive coupling configuration is configured such that when the first scale member is driven in a manner that introduces a wobbling motion, wobbling-related capacitive coupling variations corresponding to a plurality of locations on the first capacitive-coupling modulation pattern tend cancel each other with respect to their contributions to the overall capacitive coupling variation with rotation that is provided by the first capacitive-coupling modulation pattern.

15. The capacitive-type displacement sensing device of claim 1, wherein at least one scale member includes a non-modulating bridge electrode that increases a nominal capacitive coupling between at least one transmitter electrode included on the transmitter member and at least one receiver electrode included on the receiver member.

16. The capacitive-type displacement sensing device of claim 1, further comprising an additional scale member that is arranged approximately concentric with and adjacent to the first scale member, wherein:

the additional scale member is driven such that one rotation of the additional scale member corresponds to a plurality of a rotations of primary member according to an additional level of gear-reduction; and the elements of the gear reduction configuration that provide the additional level of gear reduction are located entirely between the plane of the first transmitter member surface and the plane of the first receiver member surface.

17. The capacitive-type displacement sensing device of claim 1, further comprising a coupling member that couples the primary member to the input shaft, and that allows axial motion between the primary member and input shaft.

18. The capacitive-type displacement sensing device of claim 1, wherein at least one respective capacitive-coupling modulation pattern includes at least one of a) a shield electrode configuration, b) a signal-balanced shield electrode configuration, c) a bridge electrode configuration, d) a dielectric thickness variation, and e) a crescent-shaped gap introduced by the wobble of a scale member.

19. The capacitive-type displacement sensing device of claim 1, wherein at least one respective capacitive-coupling modulation pattern provides a capacitive coupling that nominally varies sinusoidally as a function of the rotational or angular position of the respective capacitive-coupling modulation pattern relative to a respective set of transmitter and receiver electrodes.

20. The capacitive-type displacement sensing device of claim 1, comprising a plurality of respective capacitive-coupling modulation patterns and the device provides an absolute multi-turn position encoder output such that a specific turn and a specific angular position within that turn can be determined based on the positions of the various respective capacitive-coupling modulation patterns relative to corresponding respective transmitter electrode configurations, without the need to provide continuous power or continuous memory for the device.

* * * * *

UNITED STATES PATENT AND TRADEMARK OFFICE
CERTIFICATE OF CORRECTION

PATENT NO. : 7,259,695 B2 Page 1 of 1
APPLICATION NO. : 11/228635
DATED : August 21, 2007
INVENTOR(S) : N.I. Andermo It is certified that error appears in the above-identified patent and that said Letters Patent is hereby corrected as shown below:

Title Page, Item
(57)      Abstract      "member
          11-12         (s)." should not break Col.      Ln.
43        30            "plurality of a" should read --plurality of--
(Claim 1, line 58)

Col.      Ln.
46        54            "configuration," should read --configuration;--
(Claim 13, line 37)

Col.      Ln.
47        21            "cancel each other" should read --to cancel each other--
(Claim 14, line 12)

Col.      Ln.
47        37            "plurality of a" should read --plurality of--
(Claim 16, line 7)

Signed and Sealed this

Seventeenth Day of June, 2008

JON W. DUDAS
*Director of the United States Patent and Trademark Office*